(12) United States Patent
Hatakeyama et al.

(10) Patent No.: US 8,101,341 B2
(45) Date of Patent: Jan. 24, 2012

(54) PATTERNING PROCESS

(75) Inventors: Jun Hatakeyama, Joetsu (JP);
Kazuhiro Katayama, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 103 days.

(21) Appl. No.: 12/686,754

(22) Filed: Jan. 13, 2010

(65) Prior Publication Data

US 2010/0178617 A1 Jul. 15, 2010

(30) Foreign Application Priority Data

Jan. 15, 2009 (JP) ................. 2009-006409

(51) Int. Cl.
G03F 7/004 (2006.01)
G03F 7/039 (2006.01)
G03F 7/20 (2006.01)
G03F 7/40 (2006.01)

(52) U.S. Cl. ............. 430/323; 430/270.1; 430/314; 430/326; 430/330

(58) Field of Classification Search ........... 430/270.1, 430/323, 326, 314, 330
See application file for complete search history.

(56) References Cited

U.S. PATENT DOCUMENTS

| | | | |
|---|---|---|---|
| 4,775,609 A | 10/1988 | McFarland | |
| 5,364,738 A | 11/1994 | Kondo et al. | |
| 5,399,456 A | 3/1995 | Spak et al. | |
| 6,448,420 B1 | 9/2002 | Kinsho et al. | |
| 6,511,785 B1 | 1/2003 | Takemura et al. | |
| 6,579,657 B1 | 6/2003 | Ishibashi et al. | |
| 7,163,778 B2 | 1/2007 | Hatakeyama et al. | |
| 7,202,013 B2 | 4/2007 | Ogihara et al. | |
| 7,214,743 B2 | 5/2007 | Hatakeyama et al. | |
| 7,255,973 B2 * | 8/2007 | Hatakeyama et al. | ..... 430/270.1 |
| 7,303,785 B2 | 12/2007 | Ogihara et al. | |
| 7,303,855 B2 | 12/2007 | Hatakeyama et al. | |
| 7,358,025 B2 | 4/2008 | Hatakeyama | |
| 7,399,582 B2 | 7/2008 | Takahashi et al. | |
| 7,416,833 B2 | 8/2008 | Hatakeyama et al. | |
| 7,476,485 B2 | 1/2009 | Hatakeyama et al. | |
| 7,510,820 B2 | 3/2009 | Hatakeyama et al. | |
| 7,537,880 B2 | 5/2009 | Harada et al. | |
| 7,541,134 B2 | 6/2009 | Iwabuchi et al. | |

(Continued)

FOREIGN PATENT DOCUMENTS

EP 0361907 A2 4/1990

(Continued)

OTHER PUBLICATIONS

Aramaki, K et al. "Techniques to Print sub 0.2um Contact Holes", Advances in Resist Technology and Processing XVII, Proceedings of SPIE vol. 3999, 2000, pp. 738-749.

(Continued)

*Primary Examiner* — Shean Wu

(74) *Attorney, Agent, or Firm* — Westerman, Hattori, Daniels & Adrian, LLP

(57) ABSTRACT

A pattern is formed by coating a chemically amplified positive resist composition comprising a resin comprising acid labile group-containing recurring units and a photoacid generator onto a substrate, drying to form a resist film, exposing the resist film to high-energy radiation, PEB, developing to form a positive pattern, illuminating or heating the positive pattern to eliminate acid labile groups for increasing alkaline solubility and to induce crosslinking for imparting solvent resistance, coating a reversal film, forming a space pattern, and shrinking the space pattern.

28 Claims, 16 Drawing Sheets

ETCHING OF PROCESSABLE SUBSTRATE

U.S. PATENT DOCUMENTS

| | | | |
|---|---|---|---|
| 7,585,613 | B2 | 9/2009 | Ogihara et al. |
| 7,598,320 | B2 | 10/2009 | Nishikawa et al. |
| 7,632,624 | B2 | 12/2009 | Hatakeyama et al. |
| 2004/0029047 | A1 | 2/2004 | Ishibashi et al. |
| 2004/0265745 | A1 | 12/2004 | Sho et al. |
| 2007/0134916 | A1 | 6/2007 | Iwabuchi et al. |
| 2008/0090172 | A1 | 4/2008 | Hatakeyama et al. |
| 2009/0081595 | A1* | 3/2009 | Hatakeyama et al. ........ 430/323 |
| 2009/0208886 | A1* | 8/2009 | Takemura et al. ............ 430/326 |
| 2009/0253084 | A1* | 10/2009 | Takemura et al. ............ 430/326 |

FOREIGN PATENT DOCUMENTS

| | | |
|---|---|---|
| JP | 64-7525 A | 1/1989 |
| JP | 1-092741 A | 4/1989 |
| JP | 1-191423 A | 8/1989 |
| JP | 2-154266 A | 6/1990 |
| JP | 6-027654 A | 2/1994 |
| JP | 2668609 B2 | 10/1997 |
| JP | 3071401 B2 | 7/2000 |
| JP | 2000-327633 A | 11/2000 |
| JP | 2001-092154 A | 4/2001 |
| JP | 2001-142199 A | 5/2001 |
| JP | 2001-228616 A | 8/2001 |
| JP | 2004-086203 A | 3/2004 |
| JP | 2004-205658 A | 7/2004 |
| JP | 2004-205676 A | 7/2004 |
| JP | 2004-205685 A | 7/2004 |
| JP | 2004-294992 A | 10/2004 |
| JP | 2004-310019 A | 11/2004 |
| JP | 2004-354554 A | 12/2004 |
| JP | 2005-010431 A | 1/2005 |
| JP | 2005-015779 A | 1/2005 |
| JP | 2005-018054 A | 1/2005 |
| JP | 2005-043420 A | 2/2005 |
| JP | 2005-128509 A | 5/2005 |
| JP | 2005-250434 A | 9/2005 |
| JP | 2005-352104 A | 12/2005 |
| JP | 2006-053543 A | 2/2006 |
| JP | 2006-227391 A | 8/2006 |
| JP | 2006-259249 A | 9/2006 |
| JP | 2006-259482 A | 9/2006 |
| JP | 2006-285095 A | 10/2006 |
| JP | 2006-293298 A | 10/2006 |
| JP | 2007-065161 A | 3/2007 |
| JP | 2007-163846 A | 6/2007 |
| JP | 2007-171895 A | 7/2007 |
| JP | 2007-199653 A | 8/2007 |
| JP | 2007-206728 A | 8/2007 |
| JP | 2007-226170 A | 9/2007 |
| JP | 2007-226204 A | 9/2007 |
| JP | 2007-316282 A | 12/2007 |
| JP | 2008-026600 A | 2/2008 |
| JP | 2008-096684 A | 4/2008 |
| JP | 2008-111103 A | 5/2008 |
| JP | 2008-122932 A | 5/2008 |
| JP | 2009-211036 A | 9/2009 |
| WO | 2005/008340 A1 | 1/2005 |

OTHER PUBLICATIONS

Lin, B.J., "Semiconductor Foundry, Lithography and Partners", Proceedings of SPIE vol. 4690, p. xxix.

Maenhoudt, M. et al, "Double Patterning Scheme for sub 0.25 k1 Single Damascene Structures at NA=.75, Lambda=193nm", Optical Microlithography XVII, Proceedings of SPIE vol. 5754, 2005, p. 1508.

Nakamura, H et al, "Contact Hole Formation by Multiple Exposure Technique in Ultra-low k1 Lithography", Optical Microlithography XVII, Proceedings of SPIE vol. 5377, 2004, p. 255.

Nakao, S et al, "0.12um Hole Pattern Formation by KrF Lithography for Giga Bit DRAM" IEE, IEDM Tech, Digest 61, 1996, pp. 3.2.1-3.2.4.

Owa, S et al, "Immersion Lithography; Its Potential Performance and Issues" Optical Microlithography XVI, Proceedings of SPIE vol. 5040, 2003, p. 724.

Satyanarayana, S et al, "Evaluation of Process Based Resolution Enhancement Techniques to Extend 193nm Lithography", Advances in Resist Technology and Processing XX, Proceedings of SPIE vol. 5039, 2003, pp. 257-268.

Shibuya, M et al, "Performance of Resolution Enhancement Technique Using Both Multiple Exposure and Nonlinear Resist", Japan Journal of Applied Physics, 1994, vol. 33, pp. 6874-6877.

Shiu, L., "70nm Contact Hole Pattern with Shrink Technology", Advances in Resist Technology and Processing XIX, Proceedings of SPIE vol. 4690, 2002, pp. 671-678.

* cited by examiner

FORMATION OF
PHOTORESIST FILM

EXPOSURE AND
DEVELOPMENT OF
PHOTORESIST FILM

ETCHING OF
PROCESSABLE
SUBSTRATE

FORMATION OF PHOTORESIST FILM

EXPOSURE AND HEATING OF PHOTORESIST FILM

FLOOD EXPOSURE

PATTERN REVERSAL BY DEVELOPMENT

ETCHING OF PROCESSABLE SUBSTRATE

FORMATION OF PHOTORESIST FILM

EXPOSURE AND DEVELOPMENT OF PHOTORESIST FILM

CROSSLINKING OF PHOTORESIST FILM

COATING OF SOG FILM

LIGHT ETCHING WITH CMP OR CF GAS

PATTERN REVERSAL BY OXYGEN/HYDROGEN GAS ETCHING

ETCHING OF PROCESSABLE SUBSTRATE

45nm Image NA1.3

45nm X+Y Image NA1.2 S-polarization
Dipole 6%HT-PSM
10J/cm²

45nm X+Y Image NA1.2 S-polarization
Dipole 6%HT-PSM
15J/cm²

45nm X+Y Image NA1.2 S-polarization
Dipole 6%HT-PSM
40J/cm²

COATING OF POSITIVE RESIST MATERIAL

EXPOSURE AND DEVELOPMENT OF RESIST FILM

DEPROTECTION AND CROSSLINKING OF PATTERN

COATING OF PATTERN REVERSAL FILM

PATTERN REVERSAL BY DEVELOPMENT

HEAT SHRINKING

ETCHING OF PROCESSABLE SUBSTRATE

COATING OF POSITIVE RESIST MATERIAL

EXPOSURE AND DEVELOPMENT OF RESIST FILM

DEPROTECTION AND CROSSLINKING OF PATTERN

COATING OF PATTERN REVERSAL FILM

PATTERN REVERSAL BY DEVELOPMENT

COATING AND BAKING OF SHRINKING AGENT

STRIPPING OF SHRINKING AGENT

ETCHING OF PROCESSABLE SUBSTRATE

PATTERNING PROCESS

CROSS-REFERENCE TO RELATED APPLICATION

This non-provisional application claims priority under 35 U.S.C. §119(a) on Patent Application No. 2009-006409 filed in Japan on Jan. 15, 2009, the entire contents of which are hereby incorporated by reference.

TECHNICAL FIELD

This invention relates to a process for forming a pattern by way of positive/negative reversal involving the steps of forming a positive pattern through exposure and development, acid-generating and heating treatment for converting the positive pattern to be alkali soluble, coating thereon a reversal film which is slightly alkali soluble, effecting alkaline development to dissolve away a surface portion of the reversal film and the positive pattern to form a negative pattern which is a hole or trench pattern, and shrinking the hole or trench pattern.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used in 1980's. Reducing the wavelength of exposure light was believed effective as the means for further reducing the feature size. For the mass production process of 64 MB dynamic random access memories (DRAM, processing feature size 0.25 µm or less) in 1990's and later ones, the exposure light source of i-line (365 nm) was replaced by a KrF excimer laser having a shorter wavelength of 248 nm. However, for the fabrication of DRAM with a degree of integration of 256 MB and 1 GB or more requiring a finer patterning technology (processing feature size 0.2 µm or less), a shorter wavelength light source was required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690, xxix).

In the ArF immersion lithography, the space between the projection lens and the wafer is filled with water. Since water has a refractive index of 1.44 at 193 nm, pattern formation is possible even using a lens having a numerical aperture (NA) of 1.0 or greater. Theoretically, it is possible to increase the NA to nearly 1.44. It was initially recognized that the resolution could be degraded and the focus be shifted by a variation of water's refractive index with a temperature change. The problem of refractive index variation could be solved by controlling the water temperature within a tolerance of 1/100° C. while it was recognized that the impact of heat from the resist film upon light exposure drew little concern. There was a likelihood that micro-bubbles in water could be transferred to the pattern. It was found that the risk of bubble generation is obviated by thorough deaeration of water and the risk of bubble generation from the resist film upon light exposure is substantially nil. At the initial phase in 1980's of the immersion lithography, a method of immersing an overall stage in water was proposed. Later proposed was a partial-fill method of using a water feed/drain nozzle for introducing water only between the projection lens and the wafer so as to comply with the operation of a high-speed scanner. In principle, the immersion technique using water enabled lens design to a NA of 1 or greater. In optical systems based on traditional refractive index materials, this leads to giant lenses, which would deform by their own weight. For the design of more compact lenses, a catadioptric system was proposed, accelerating the lens design to a NA of 1.0 or greater. A combination of a lens having NA of 1.2 or greater with strong resolution enhancement technology suggests a way to the 45-nm node (see Proc. SPIE Vol. 5040, 724). Efforts have also been made to develop lenses of NA 1.35.

One candidate for the 32-nm node lithography is lithography using extreme ultraviolet (EUV) radiation with wavelength 13.5 nm. The EUV lithography has many accumulative problems to be overcome, including increased laser output, increased sensitivity, increased resolution and minimized line-width roughness (LWR) of resist coating, defect-free MoSi laminate mask, reduced aberration of reflection mirror, and the like.

The water immersion lithography using a NA 1.35 lens achieves an ultimate resolution of 40 to 38 nm as the half-pitch of a line pattern at the maximum NA, but cannot reach 32 nm. Efforts have been made to develop higher refractive index materials in order to further increase NA. It is the minimum refractive index among projection lens, liquid, and resist film that determines the NA limit of lenses. In the case of water immersion, the refractive index of water is the lowest in comparison with the projection lens (refractive index 1.5 for synthetic quartz) and the resist film (refractive index 1.7 for prior art methacrylate-based film). Thus the NA of projection lens is determined by the refractive index of water. Recent efforts succeeded in developing a highly transparent liquid having a refractive index of 1.65. In this situation, the refractive index of projection lens made of synthetic quartz is the lowest, suggesting a need to develop a projection lens material with a higher refractive index. LuAG (lutetium aluminum garnet $Lu_3Al_5O_{12}$) having a refractive index of at least 2 is the most promising material, but has the problems of birefringence and noticeable absorption. Even if a projection lens material with a refractive index of 1.8 or greater is developed, the liquid with a refractive index of 1.65 limits the NA to 1.55 at most, failing in resolution of 32 nm despite successful resolution of 35 nm. For resolution of 32 nm, a liquid with a refractive index of 1.8 or greater and resist and protective films with a refractive index of 1.8 or greater are necessary. Among the materials with a refractive index of 1.8 or greater, the high refractive index liquid seems least available. Such a liquid material has not been discovered because a tradeoff between absorption and refractive index is recognized in the art. In the case of alkane compounds, bridged cyclic compounds are preferred to linear ones in order to increase the refractive index, but the cyclic compounds undesirably have too high a viscosity to follow high-speed scanning on the exposure tool stage. Since hafnium oxide particles have high transparency and a refractive index in excess of 2 at 193 nm, it is under study to form a high refractive index liquid by dispersing the particles in water or alkane solvents. However, to increase the refractive index up to 1.8, hafnium oxide must be dispersed in water in an amount of at least 30 wt %. The resulting mixture has a very high viscosity which is incompatible with high-speed scanning. If a liquid with a refractive index of 1.8 is developed, then the component having the lowest refractive index is the resist film, suggesting a need to increase the refractive index of a resist film to 1.8 or higher.

The process that now draws attention under the above-discussed circumstances is a double patterning process involving a first set of exposure and development to form a first pattern and a second set of exposure and development to form a pattern between the first pattern portions. See Proc. to SPIE Vol. 5754, 1508 (2005). A number of double patterning processes are proposed. One exemplary process involves a first set of exposure and development to form a photoresist pattern having lines and spaces at intervals of 1:3, processing the underlying layer of hard mask by dry etching, applying another layer of hard mask thereon, a second set of exposure and development of a photoresist film to form a line pattern in the spaces of the first exposure, and processing the hard mask by dry etching, thereby forming a line-and-space pattern at a half pitch of the first pattern. An alternative process involves a first set of exposure and development to form a photoresist pattern having spaces and lines at intervals of 1:3, processing the underlying layer of hard mask by dry etching, applying a photoresist layer thereon, a second set of exposure and development to form a second space pattern on the remaining hard mask portion, and processing the hard mask by dry etching. In either process, the hard mask is processed by two dry etchings.

While the former process requires two applications of hard mask, the latter process uses only one layer of hard mask, but requires to form a trench pattern which is difficult to resolve as compared with the line pattern. The latter process includes the use of a negative resist material in forming the trench pattern. This allows for use of high contrast light as in the formation of lines as a positive pattern. However, since the negative resist material has a lower dissolution contrast than the positive resist material, a comparison of the formation of lines from the positive resist material with the formation of a trench pattern of the same size from the negative resist material reveals that the resolution achieved with the negative resist material is lower. After a wide trench pattern is formed from the positive resist material by the latter process, there may be applied a thermal flow method of heating the substrate for shrinkage of the trench pattern (Proc. SPIE Vol. 3999, 738 (2000), Proc. SPIE Vol. 4690, 671 (2002), and Proc. SPIE Vol. 5039, 257 (2003)), or a RELACS method of coating a water-soluble film on the trench pattern as developed and heating to induce crosslinking at the resist film surface for achieving shrinkage of the trench pattern (JP 3071401).

Both the former and latter processes require two etchings for substrate processing, leaving the issues of a reduced throughput and deformation and misregistration of the pattern by two etchings.

One method that proceeds with a single etching is by using a negative resist material in a first exposure and a positive resist material in a second exposure. Another method is by using a positive resist material in a first exposure and a negative resist material in a higher alcohol of 4 or more carbon atoms, in which the positive resist material is not dissolvable, in a second exposure. However, these methods using negative resist materials with low resolution entail degradation of resolution.

A method which does not involve PEB and development between first and second exposures is the simplest method with high throughput. This method involves first exposure, replacement by a mask having a shifted pattern drawn, second exposure, PEB, development and dry etching. However, the optical energy of second exposure offsets the optical energy of first exposure so that the contrast becomes zero, leading to a failure of pattern formation. If an acid generator capable of two photon absorption or a contrast enhancement layer (CEL) is used to provide nonlinear acid generation, then the energy offset is relatively reduced even when second exposure is performed at a half-pitch shifted position. Thus a pattern having a half pitch corresponding to the shift can be formed, though at a low contrast. See Jpn. J. Appl. Phy. Vol. 33 (1994) p 6874-6877, Part 1, No. 12B, December 1994.

The critical issue associated with double patterning is an overlay accuracy between first and second patterns. Since the magnitude of misregistration is reflected by a variation of line size, an attempt to form 32-nm lines at an accuracy of 10%, for example, simply requires an overlay accuracy within 3.2 nm. The advanced ArF immersion lithography scanner has an overlay accuracy of the order of 8 to 6 nm for every wafer on a common exposure tool. The term "every wafer" means that the exposure tool carries out alignment relative to a resist alignment pattern which has been formed by exposure and development. Herein a significant improvement in accuracy is necessary. If first and second exposures are carried out without demounting the wafer from the chuck, the positional shift associated with chuck remounting is cancelled and the alignment accuracy is improved to the order of 5 to 4 nm. In the case of double patterning, the process of carrying out plural exposures without demounting the wafer from the chuck becomes an exposure process which can be implemented on account of the improvement in alignment accuracy. In the exposure process intended to reduce the pitch to half by utilizing a nonlinear energy distribution such as the two-photon absorption resist, continuous exposure is carried out while shifting the exposure position by ¼ of the pitch and without demounting the wafer from the chuck. The nonlinear resist or CEL which is sensitive to radiation of 193 nm wavelength has not been reported. If such a resist were developed, the double exposure process with the minimum alignment error would become practical.

In addition to the double patterning technique, the technology for forming a fine space pattern or hole pattern includes use of negative resist material, thermal flow, and RELACS as mentioned above. The negative resist material suffers from the problems that the resist material itself has a low resolution and bridges form in a fine hole pattern because the negative resist material relies on the crosslinking system. The thermal flow and RELACS methods suffer from a likelihood of variation during dimensional shrinkage by heat. The reason is that the amount of phenolic hydroxyl or carboxyl groups present on side walls of holes differs between a dense hole pattern and an isolated hole pattern which are both formed by photolithography. Dense holes are accompanied with more fog light, acid is generated under fog light, and the acid in turn serves to eliminate some acid labile groups, resulting in an increased amount of phenolic hydroxyl or carboxyl groups. On the other hand, isolated holes are accompanied with less fog light, resulting in a reduced amount of phenolic hydroxyl or carboxyl groups. The increased amount of phenolic hydroxyl or carboxyl groups suggests that the polymer has a higher softening temperature due to hydrogen bonds and is unsusceptible to thermal flow. Thus the dense holes experience a less amount of shrinkage by thermal flow. In the RELACS method, an increased amount of phenolic hydroxyl or carboxyl groups leads to an increased amount of such groups attached to side walls and therefore, the dense holes experience a more amount of shrinkage.

FIG. 1 illustrates a process for forming a hole pattern using a positive photoresist material. In FIG. 1A, a photoresist material is coated onto a processable substrate 101 on a substrate 100 to form a photoresist film 102. In FIG. 1B, the photoresist film 102 is exposed to light through a photomask having the desired pattern and developed to form a photoresist pattern 102a. In FIG. 1C, the processable substrate 101 is etched while using the photoresist pattern 102a as a mask.

The method of forming a negative pattern by reversal of a positive pattern is well known from the past. For example, JP-A 2-154266 and JP-A 6-27654 disclose naphthoquinone resists capable of pattern reversal. JP-A 64-7525 describes exposure of selected portions of a film to focused ion beam (FIB) for curing and flood exposure whereby the cured portions are left behind. JP-A 1-191423 and JP-A 1-92741 describe exposure of a photosensitive agent of naphthoquinone diazide to form an indene carboxylic acid, heat treatment in the presence of a base into an indene which is alkali insoluble, and flood exposure to effect positive/negative reversal. FIG. 2 illustrates this positive/negative reversal method. In FIG. 2A, a photoresist material is coated onto a processable substrate 101 on a substrate 100 to form a photoresist film 102. In FIG. 2B, the photoresist film 102 is exposed to light through a photomask having the desired pattern and heated. In FIG. 2C, the photoresist film 102 is subjected to flood exposure. FIG. 2D illustrates pattern reversal by development to form a reversed pattern film 103. In FIG. 2E, the processable substrate 101 is etched while using the reversed pattern film 103 as a mask.

As to the positive/negative reversal method including exchange of developers, attempts were made to form negative patterns by development in an organic solvent of hydroxystyrene partially protected with tert-butoxycarbonyl (t-BOC) groups, and by development with super-critical carbon dioxide.

As to the positive/negative reversal method utilizing silicon-containing materials, it is proposed to form a fine hole pattern by covering a space portion of a positive resist pattern with a silicon-containing film, effecting oxygen gas etching for etching away the positive pattern portion, thus achieving positive/negative reversal to leave a silicon-containing film pattern. See JP-A 2001-92154 and JP-A 2005-43420. FIG. 3 illustrates this positive/negative reversal method. In FIG. 3A, a photoresist material is coated onto an underlayer film 104 on a processable substrate 101 on a substrate 100 to form a photoresist film 102. In FIG. 3B, the photoresist film 102 is exposed to light through a photomask having the desired pattern and developed to form a photoresist pattern 102a. In FIG. 3C, the photoresist pattern 102a is crosslinked. In FIG. 3D, a SOG film 105 is formed on the undercoat film 104 and so as to cover the crosslinked photoresist pattern 102a. FIG. 3E illustrates light etching with CMP or CF gas until the crosslinked photoresist pattern 102a is exposed. FIG. 3F illustrates pattern reversal by oxygen or hydrogen gas etching. In FIG. 3G, the processable substrate 101 is etched while using the patterned SOG film 105 as a mask.

As compared with the line pattern, the hole pattern is difficult to reduce the feature size. In order for the prior art method to form fine holes, an attempt is made to form fine holes by under-exposure of a positive resist film combined with a hole pattern mask, resulting in the exposure margin being extremely narrowed. It is then proposed to form holes of greater size, followed by thermal flow or RELACS method to shrink the holes as developed. However, there is a problem that control accuracy becomes lower as the pattern size after development and the size after shrinkage are greater and the quantity of shrinkage is greater. It is then proposed in Proc. SPIE Vol. 5377, 255 (2004) that a pattern of X direction lines is formed in a positive resist film using dipole illumination, the resist pattern is cured, another resist material is coated thereon again, and a pattern of Y direction lines is formed in the other resist using dipole illumination, leaving a lattice-like line pattern, spaces of which provide a hole pattern. Although a hole pattern can be formed at a wide margin by combining X and Y lines and using dipole illumination featuring a high contrast, etching through vertically staged line patterns at a high dimensional accuracy is difficult. It is proposed in IEEE IEDM Tech. Digest 61 (1996) to form a hole pattern by exposure of a negative resist film through a Levenson phase shift mask of X direction lines combined with a Levenson phase shift mask of Y direction lines. Since the maximum resolution of ultrafine holes is determined by the bridge margin, the crosslinking negative resist film has the drawback that the threshold size is large as compared with the positive resist film.

CITATION LIST

Patent Document 1: JP 3071401
Patent Document 2: JP-A H02-154266
Patent Document 3: JP-A H06-027654
Patent Document 4: JP-A S64-7525
Patent Document 5: JP-A H01-191423
Patent Document 6: JP-A H01-092741
Patent Document 7: JP-A 2001-092154
Patent Document 8: JP-A 2005-043420
Patent Document 9: JP-A 2007-171895
Patent Document 10: JP-A 2006-293298
Non-Patent Document 1: Proc. SPIE Vol. 4690, xxix (2002)
Non-Patent Document 2: Proc. SPIE Vol. 5040, 724 (2003)
Non-Patent Document 3: Proc. SPIE Vol. 5754, 1508 (2005)
Non-Patent Document 4: Proc. SPIE Vol. 3999, 738 (2000)
Non-Patent Document 5: Proc. SPIE Vol. 4690, 671 (2002)
Non-Patent Document 6: Proc. SPIE Vol. 5039, 257 (2003)
Non-Patent Document 7: Jpn. J. App. Phys. Vol. 33 (1994), 6874-6877, Part 1, No. 12B, December 1994
Non-Patent Document 8: Proc. SPIE Vol. 5377, 255 (2004)
Non-Patent Document 9: IEEE IEDM Tech. Digest 61 (1996)

DISCLOSURE OF THE INVENTION

When it is desired to form a very fine space pattern, the use of a negative resist film raises problems such as a failure to form a fine pattern due to low resolution and a bridge between spaces. Although the process of once opening larger holes and substantially shrinking them by the thermal flow or RELACS method is effective with KrF resists of phenol base materials, such shrinkage is difficult with ArF resists of carboxyl-substituted materials.

On the other hand, if a positive pattern once formed with a high resolution can be reversed into a negative pattern, the problems associated with the use of a negative resist film can be overcome.

As discussed above, a variety of methods were reported for reversal into a negative pattern of a positive image obtained from a positive resist film featuring a high resolution capability. In particular, the above-cited JP-A 2001-92154 refers to an organic solvent-based composition as the silicone-based burying material for positive/negative reversal. The previous method using a water-soluble silicon resin as the reversal film-forming material has the problem that if an organic solvent-based reversal film-forming material composition is coated onto a substrate having a positive pattern formed thereon, the positive pattern can be disrupted by the organic solvent used for coating. If the resist pattern-forming resin is insolubilized against organic solvent by curing the resist resin with EB or the like to induce crosslinking between molecules of the resist resin, then an organic solvent-based reversal film-forming material composition may be utilized, enabling a choice from a wider range of materials. Where this treatment is done, however, the removal of the resist pattern at the final stage for reversal cannot resort to removal by dissolution because the positive pattern has been insolubilized. The state-of-the-art technology relies on no other means than removal by reactive dry etching. Then a selectively dry etchable material containing silicon, titanium or the like must be selected as the reversal film-forming material.

In one process, a silicon resin coated on a resist pattern is etched back with an etching gas such as fluorocarbon gas to expose the surface of the resist pattern, after which dry etching with oxygen and hydrogen gases is carried out for image reversal. For image reversal, two etching steps including etching back and etching and concomitant gas exchange are necessary. With this process, throughput is reduced.

On the other hand, JP-A 2001-92154 discloses advantageous removal of a positive pattern by wet etching. In the disclosed method, once a positive pattern is provided, an organic solvent solution of an organosilicon compound is directly (without any special treatment) coated to form a reversal film of organosilicon. The patent does not refer to the damage to the positive pattern by intermixing. The patent describes that for the preparation of an organosilicon composition, high polarity solvents (e.g., hydroxyl-bearing compounds such as propylene glycol monomethyl ether and lactic esters, esters such as PGMEA, and ketones such as acetone) may be utilized as well as low polarity solvents (e.g., toluene and cumene), although only toluene and cumene are used in Examples. The inventors made a follow-up test by using a solvent containing a high polarity solvent such as PGMEA, ethyl lactate, propylene glycol monomethyl ether or cyclohexanone as the solvent for reversal film, and coating an organosilicon solution in such a solvent onto a positive pattern which had been subjected to no particular treatment. Then the pattern became dissolved in the coating solvent, and the test failed to achieve positive/negative reversal at the required accuracy level. It was demonstrated that this method can adopt only a reversal film-forming material exhibiting a high solubility in low polarity solvents, but not reversal film-forming materials having a high concentration of polar groups featuring substrate adhesion, such as novolac resins, polyhydroxystyrene polymers, and alicyclic polymers having a high content of hydroxy groups or lactone.

Although KrF resists composed of phenolic polymer materials are susceptible to effective shrinkage of hole size by thermal flow or shrinking agent (RELACS), ArF resists composed of alicyclic polymer materials are difficult to shrink, leaving a problem of minimal shrinkage. Since alicyclic polymers have a higher glass transition temperature (Tg) and hence a higher flow temperature than phenolic polymers, they must be baked at a higher temperature, which incidentally causes deprotection of acid labile groups, resulting in enlargement of hole opening. Another problem of ArF resists composed of alicyclic polymer materials is that crosslinking reaction proceeds little on carboxyl groups resulting from deprotection of acid labile groups, and less RELACS agent is attached thereto, resulting in a reduced quantity of shrinkage by RELACS.

An object of the invention is to provide a process for forming a pattern by way of positive/negative reversal, which is effective for shrinking a hole pattern resulting from positive/negative reversal.

The inventors have found that when a resin in a chemically amplified positive resist composition of which a positive resist pattern is composed is subjected to partial crosslinking treatment, crosslinking may occur to such an extent to provide the necessary organic solvent resistance, while dissolution in an alkaline wet etchant is still possible; that if the above step is incorporated in the process of forming a negative pattern by way of positive/negative reversal, then not only prior art silicon-based materials, but also reversal film-forming materials based on aromatic resins are applicable as the reversal film-forming material; that after a positive resist film of such material is exposed to a dot pattern and the dot pattern is converted to a hole pattern by negative/positive reversal, the hole pattern as reversed can be shrunk by heating the hole pattern or coating a shrinking film material thereon and stripping an extra portion thereof using water, alcohol or developer. The invention is predicated on this finding.

The invention relates to a process for forming a pattern by coating a positive resist film on a substrate, exposing it to a dense dot pattern of radiation, developing to form a dot pattern according to the ArF lithography, baking the positive dot pattern-bearing substrate at a high temperature so as to endow it with the necessary limit level of resistance to an organic solvent to be used in a reversal film-forming composition while maintaining a solubility in alkaline etchant, and finally forming a negative image, the negative image-forming step including positive/negative reversal of wet etching with an alkaline etchant, thus forming a hole pattern of phenolic hydroxyl group-containing material, and shrinking the reversed hole pattern, the shrinking step including heating the hole pattern (thermal flow method) or coating a shrinking film material thereon and stripping an extra portion thereof using water, alcohol or developer (RELACS method).

The invention provides a pattern forming process as defined below.

[1] A process for forming a pattern by way of positive/negative reversal, comprising the steps of:

coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the unnecessary solvent and to form a resist film, exposing the resist film patternwise to high-energy radiation, post-exposure baking so that the acid generated by the acid generator upon exposure may act on acid labile groups in the resin for thereby effecting elimination reaction of acid labile groups in the resin in exposed areas, developing the exposed resist film with an alkaline developer to form a positive pattern, illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin may not lose a solubility in an alkaline wet etchant, for thereby endowing the positive pattern with resistance to an organic solvent used in a reversal film-forming composition, coating a reversal film-forming composition on the positive pattern-bearing substrate to form a reversal film, dissolving away the crosslinked positive pattern in an alkaline wet etchant to form a space pattern, and shrinking the space pattern.

[2] The process of [1] wherein the space pattern is a hole pattern.

[3] The process of [1] or [2] wherein the step of shrinking the space pattern includes baking.

[4] The process of [1] or [2] wherein the step of shrinking the space pattern includes coating a material which is soluble in water or $C_1$-$C_8$ alcohol onto the reversal film of which the space pattern is formed, to form a material coating, heating, and stripping an extra portion of the material coating using a liquid selected from the group consisting of water, alcohol, and alkaline developer.

[5] A process for forming a pattern by way of positive/negative reversal, comprising the steps of:

coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the unnecessary solvent and to form a resist film, exposing the resist film to high-energy radiation in a repeating dense pattern, further exposing an unnecessary region of the dense pattern or unexposed area, post-exposure baking so that the acid generated by the acid generator upon exposure may act on acid labile groups in the resin for thereby effecting elimination reaction of acid labile groups in the resin in exposed areas, developing the exposed resist film with an alkaline developer to form a positive pattern, illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin may not lose a solubility in an alkaline wet etchant, for thereby endowing the positive pattern with resistance to an organic solvent used in a reversal film-forming composition, coating a reversal film-forming composition on the positive pattern-bearing substrate to form a reversal film, dissolving away the crosslinked positive pattern in an alkaline wet etchant to form a space pattern, and shrinking the space pattern.

[6] The process of any one of [1] to [5] wherein in the step of illuminating or heating the positive pattern for increasing the alkaline solubility of the resin and for endowing the positive pattern with resistance to an organic solvent used in a reversal film-forming composition, the dissolution rate of the crosslinked positive pattern in an alkaline wet etchant is such that the crosslinked positive pattern exhibits an etching rate in excess of 2 nm/sec when etched with 2.38 wt % TMAH aqueous solution, the organic solvent used in the reversal film-forming composition is selected from the group consisting of propylene glycol monomethyl ether acetate, cyclohexanone, ethyl lactate, propylene glycol monomethyl ether, and heptanone, and mixtures of two or more of the foregoing, the resistance to organic solvent of the crosslinked positive pattern is such that the crosslinked positive pattern experiences a film slimming of up to 10 nm when contacted with the organic solvent for 30 seconds.

[7] The process of any one of [1] to [6] wherein said reversal film-forming composition comprises a resin comprising monomeric units of aromatic structure having a phenolic hydroxyl group.

[8] The process of any one of [1] to [6] wherein said reversal film-forming composition comprises a silicon-containing resin.

[9] The process of [7] or [8] wherein said reversal film-forming composition further comprises a crosslinker.

[10] The process of [7] or [8] wherein said reversal film-forming composition further comprises an acid generator and a crosslinker.

[11] The process of any one of [1] to [10], further comprising, between the step of coating a reversal film-forming composition on the positive pattern-bearing substrate to form a reversal film and the step of dissolving away the crosslinked positive pattern in an alkaline wet etchant, the step of removing the reversal film deposited on the crosslinked positive pattern until the positive pattern is exposed.

[12] The process of [11] wherein the step of removing the reversal film deposited on the crosslinked positive pattern includes wet etching.

[13] The process of [12] wherein the reversal film is soluble in an alkaline wet etchant, but has a dissolution rate which is slower than that of the crosslinked positive pattern after the step of endowing the positive pattern with resistance to organic solvent, the wet etching uses an alkaline wet etchant, and the step of removing the reversal film deposited on the crosslinked positive pattern and the step of dissolving away the crosslinked positive pattern are concurrently carried out.

[14] The process of [13] wherein the reversal film has a dissolution rate of 0.02 nm/sec to 2 nm/sec when etched with 2.38 wt % TMAH aqueous solution.

[15] The process of any one of [1] to [14] wherein said chemically amplified positive resist composition comprises a component capable of generating an acid in the step of heating for endowing the positive pattern with organic solvent resistance.

[16] The process of [15] wherein the component capable of generating an acid is a thermal acid generator which is added to the resist composition in addition to the photoacid generator.

[17] The process of [16] wherein the thermal acid generator has the general formula (P1a-2):

wherein $K^-$ is a sulfonate having at least one α-position fluorinated, perfluoroalkylimidate or perfluoroalkylmethidate; $R^{101d}$, $R^{101e}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101e}$ and $R^{101f}$ or each of $R^{101d}$, $R^{101e}$ and $R^{101f}$ is a $C_3$-$C_{10}$ alkylene group or a hetero-aromatic ring having incorporated therein the nitrogen atom when they form a ring.

[18] The process of any one of [1] to [17] wherein in said chemically amplified positive resist composition, the resin comprises recurring units having a lactone ring and recurring units having an acid labile group which is eliminatable with acid.

[19] The process of any one of [1] to [18] wherein in said chemically amplified positive resist composition, the resin comprises an electrophilic partial structure such as an ester group or cyclic ether which will form crosslinks in the resin of the positive resist pattern.

[20] The process of [19] wherein in said chemically amplified positive resist composition, the resin comprises recurring units having a 7-oxanorbornane ring and recurring units having an acid labile group which is eliminatable with acid, and heat is applied in the step of illuminating the positive pattern to generate an acid whereby elimination of acid labile groups and crosslinking of the resin take place simultaneously in the positive pattern.

[21] The process of [20] wherein the recurring units having a 7-oxanorbornane ring are recurring units (a) having the general formula (1):

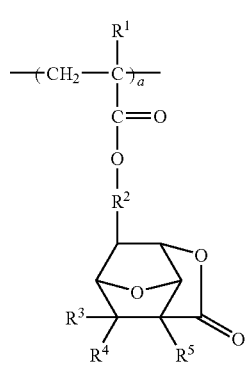

wherein $R^1$ is hydrogen or methyl, $R^2$ is a single bond or a straight, branched or cyclic $C_1$-$C_6$ alkylene group which may have an ether or ester radical, and which has a primary or secondary carbon atom through which it is linked to the ester group in the formula, $R^3$, $R^4$, and $R^5$ are each independently hydrogen or a straight, branched or cyclic $C_1$-$C_6$ alkyl group, and "a" is a number in the range: $0<a<1.0$.

[22] The process of any one of [18] to [21] wherein the recurring units having an acid labile group which is eliminatable with acid are recurring units (b) having the general formula (2):

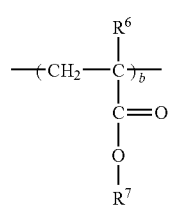

wherein $R^6$ is hydrogen or methyl, $R^7$ is an acid labile group, and b is a number in the range: $0<b\leq 0.8$.

[23] The process of [22] wherein the acid labile group of $R^7$ is an acid labile group of alicyclic structure which is eliminatable with acid.

[24] A process for forming a pattern by way of positive/negative reversal according to any one of [1] to [23], comprising the steps of:

coating a chemically amplified positive resist composition onto a processable substrate, said resist composition comprising a resin comprising recurring units having acid labile groups which are eliminatable with acid, a photoacid generator capable of generating an acid upon exposure to high-energy radiation and a solvent, heating to remove the unnecessary solvent to form a resist film, coating a protective film-forming composition onto the resist film and drying to form a protective film, exposing the resist film patternwise to high-energy radiation from a projection lens, by immersion lithography with water or a transparent liquid having a refractive index of at least 1 intervening between the resist film and the projection lens, post-exposure baking for causing the acid generated by the acid generator upon exposure to act on the acid labile groups on the resin whereby the acid labile groups on the resin in the exposed area undergo elimination reaction, and developing the exposed resist film with an alkaline developer to form a positive pattern, treating the positive pattern so as to eliminate the acid labile groups on the resin in the positive pattern resulting from the previous step, and to induce crosslinking in the resin to such an extent that the resin may not lose a solubility in an alkaline wet etchant, for thereby endowing the positive pattern with resistance to an organic solvent to be used in a reversal film-forming composition, coating a reversal film-forming composition thereon to form a reversal film, and dissolving away the positive pattern in an alkaline wet etchant.

[25] The process of [24] wherein said protective film-forming composition is based on a copolymer comprising amino-containing recurring units.

[26] The process of [24] or [25] wherein said protective film-forming composition further comprises an amine compound.

[27] The process of any one of [1] to [26], further comprising the steps of forming a carbon film having a carbon content of at least 75% by weight on the processable substrate, forming a silicon-containing intermediate film thereon, and coating a resist composition for positive/negative reversal thereon, the reversal film being formed of a hydrocarbon-based material.

[28] The process of any one of [1] to [26], further comprising the steps of forming a carbon film having a carbon content of at least 75% by weight on the processable substrate, and coating a resist composition for positive/negative reversal thereon, the reversal film being formed of a silicon-containing material.

[29] The process of any one of [1] to [26], further comprising the steps of forming a carbon film having a carbon content of at least 75% by weight on the processable substrate, forming an organic antireflection film thereon, and coating a resist composition for positive/negative reversal thereon, the reversal film being formed of a silicon-containing material.

FIG. 4 is a diagram showing optical contrasts of hole, dot and line patterns having a pitch of 90 nm and a feature size of 45 nm when illuminated through a lens with NA 1.3. The masks used are binary masks with a Cr light-shielding band. Lines are printed under σ0.98, radius σ0.2, dipole illumination+s-polarized illumination; dots are printed under σ0.98/0.735, 3/4 annular illumination+azimuthally polarized illumination; and holes are printed under σ0.98/0.735, 3/4 annular illumination+azimuthally polarized illumination.

The gradient of a curve at the mask edge represents an image contrast. A greater gradient is more advantageous to pattern formation. The sequence of high to low contrast is in the order of line, dot and hole patterns. Since the contrast of the hole pattern is extremely low, pattern formation is difficult even with a very high contrast resist film. The dot pattern provides a somewhat higher contrast than the hole pattern. The line pattern exhibits a high contrast under the dipole illumination, which is a more intense oblique incidence illumination, plus intense s-polarized illumination, achieving a higher maximum resolution than the dot and hole patterns which are two-dimensional patterns incompatible with intense oblique incidence illumination and polarized illumination. This indicates that formation of a fine hole pattern is one of the challenges of the lithography technology. It is also indicated that more advanced miniaturization is achievable if a hole pattern is formed by reversal of a dot pattern. A dot pattern can be formed by the double dipole method involving exposure of a X-direction line pattern, exposure of a Y-direction line pattern, and development. The dot pattern formed by this method has finer features than the ordinary methods using a dot patterned mask.

FIG. 5 illustrates an optical image of Y-direction lines having a pitch of 90 nm and a line size of 45 nm printed using NA 1.2 lens, dipole illumination, and s-polarized illumination. FIG. 6 illustrates an optical image of X-direction lines having a pitch of 90 nm and a line size of 45 nm printed using NA 1.2 lens, dipole illumination, and s-polarized illumination. A black area corresponds to a light-shielded region and a white area corresponds to an intense light region. FIG. 7 is a contrast image obtained by overlaying the optical image of X-direction lines on that of Y-direction lines. Against the expectation that a combination of X and Y lines may form a lattice-like image, weak light areas draw circular figures. As the size of a circle increases, the figure approaches to rhombus, tending to merge with adjacent figures. As the size of a circle becomes smaller, circularity is improved.

FIGS. 8 to 10 are images of simulation of a pattern profile of a resist film on the basis of the optical image of FIG. 7. Herein, Z direction is the negative of logarithm of a dissolution rate of the resist film, reflecting the pattern profile of the resist film. In FIGS. 8 to 10, the exposure dose varies. FIG. 8 shows a dot pattern at a low exposure dose, wherein dots are rhombic and nearly merge with each other. In FIG. 9, dots are finished substantially circular and have a size of about 40 nm. FIG. 10 shows a dot pattern at an increased exposure dose, wherein finer dots are formed and have a size of about 20 nm. In a conventional method for forming a hole pattern using a positive resist film, if it is desired to form holes of a size equal to or less than half the pitch, for 1:1 holes, holes smaller than half the pitch (1:1) are formed by under-exposure, resulting in a lowering of optical contrast and reductions of exposure dose margin and circularity. When a 1:1 dot pattern is formed using a positive resist film, over-exposure of dots having a smaller size rather than dots of half the pitch (1:1) results in a better optical contrast, which leads to an improvement in circularity and a spread of exposure dose margin. It is indicated that with this method, considerably small dots can be formed with a wide margin. If such a dot pattern is convertible to a hole pattern by image reversal, then a fine hole pattern can be formed. Furthermore, if a hole pattern resulting from image reversal is shrinkable, then a very fine hole pattern can be formed.

ADVANTAGEOUS EFFECTS OF INVENTION

According to the invention, when a reversal film is formed on a positive pattern by coating a reversal film-forming composition using a solvent containing a hydroxy-bearing solvent or a highly polar solvent such as an ester or ketone, the reversal film-forming composition can be buried in spaces in the positive pattern without any damage to the positive pattern; and the positive pattern resulting from a positive resist composition can be removed by wet etching. Thus, positive/negative reversal at a high accuracy can be performed by a simple procedure. Moreover, an organic material which fails to establish a selectivity between it and the resist pattern upon oxygen dry etching which is a prior art resist pattern removal method can be used in the reversal film. Moreover, a material which is difficult to dissolve unless a hydroxy-bearing solvent or a highly polar solvent such as an ester or ketone is used, like a resin material which is improved in adhesion by incorporating polar groups such as hydroxy groups, especially phenolic hydroxy groups or lactone structures, can also be used in the reversal film. In this case, to process a silicon oxide film by a prior art method, the reversed pattern must be transferred to an organic film before the silicon oxide film can be processed. With the inventive process, the reversed pattern allows for direct processing.

Also, when a reversal film having an appropriate alkali dissolution rate is used as the reversal film, the step of removing the portion of the reversal film overlying the positive pattern and the step of wet etching the positive pattern may be performed simultaneously, achieving a significantly simplified process.

Image reversal from a positive pattern to a negative pattern by this method ensures that using a first fine line pattern, a fine space pattern of the same size can be reversal-formed. In the case of a trench pattern, a line pattern having a capability to form a finer feature size is formed through exposure, and this is converted into a trench pattern by the image reversal technology described above, whereby an ultra-fine trench pattern can be formed. By reversal of a dot pattern, a hole pattern can also be formed. Moreover, once a line pattern is formed as a first pattern, a second line pattern extending perpendicular thereto is exposed and developed to form a dot pattern, and a film having an appropriate alkaline dissolution rate is coated and developed for image reversal to form a hole pattern. In this way, a hole pattern which is finer than the prior art hole pattern can be formed.

In the invention, the fine hole pattern resulting from the above process is further shrunk. Shrinking may be accomplished by thermal flow or by coating a shrinking film material thereon and stripping an extra portion thereof using water, alcohol or alkaline developer.

BRIEF DESCRIPTION OF DRAWINGS

FIG. 1 schematically illustrates in cross-sectional views a prior art process for forming a hole pattern through exposure of a positive photoresist material.

FIG. 2 schematically illustrates in cross-sectional views a prior art image reversal process using a positive i or g-line resist material based on a quinonediazide-novolac resin.

FIG. 3 schematically illustrates in cross-sectional views a prior art image reversal process involving hardening of a developed resist film and burying of SOG film.

FIG. 11 schematically illustrates in cross-sectional views the pattern forming process of the invention.

FIG. 12 schematically illustrates in cross-sectional views the pattern forming process of the invention.

DESCRIPTION OF THE PREFERRED EMBODIMENTS

Figure 1A:
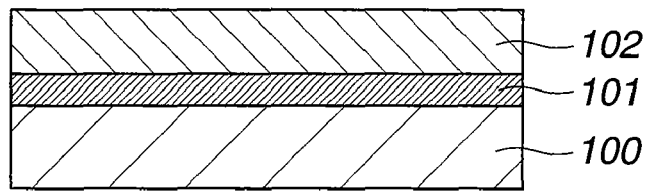
FIG. 1A shows formation of a photoresist film.
Figure 1B:
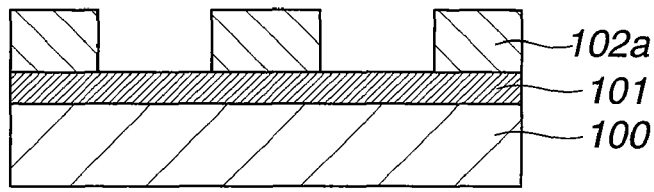
FIG. 1B shows exposure and development of the photoresist film.
Figure 1C:
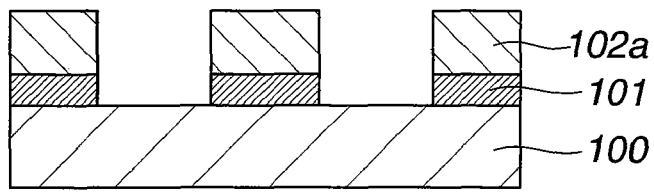
FIG. 1C shows etching of a processable substrate.
Figure 2A:
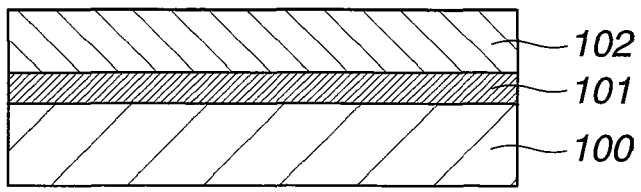
FIG. 2A shows formation of a photoresist film.
Figure 2B:
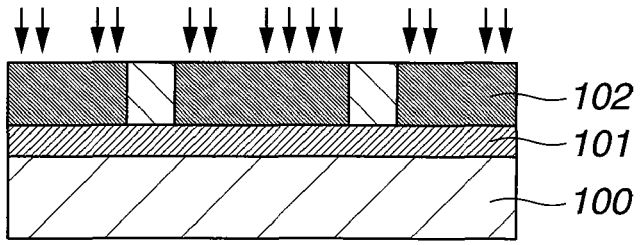
FIG. 2B shows exposure and heating of the photoresist film.
Figure 2C:
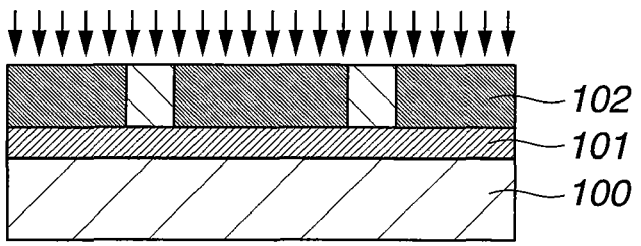
FIG. 2C shows flood exposure.
Figure 2D:
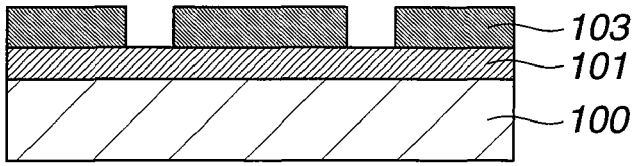
FIG. 2D shows pattern reversal by development.
Figure 2E:
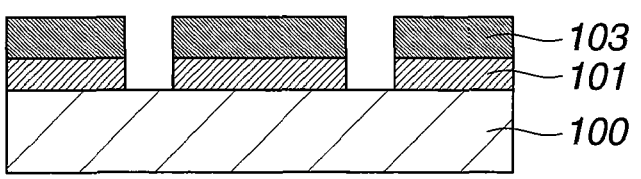
FIG. 2E shows etching of a processable substrate.
Figure 3A:
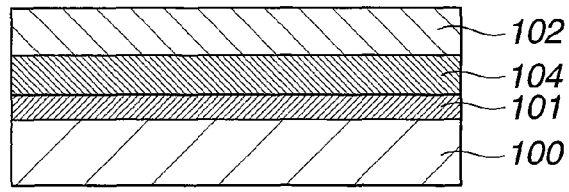
FIG. 3A shows formation of a photoresist film.
Figure 3B:
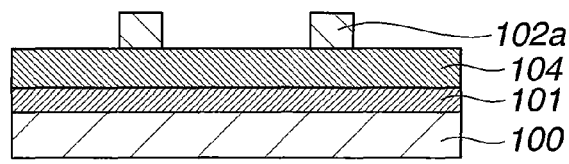
FIG. 3B shows exposure and development of the photoresist film.
Figure 3C:
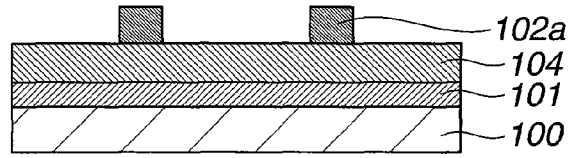
FIG. 3C shows crosslinking of the photoresist film.
Figure 3D:
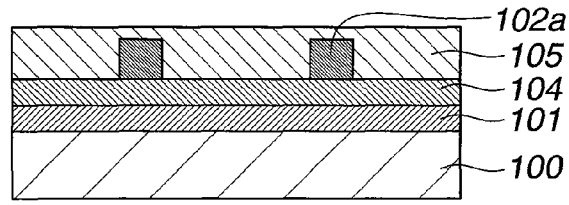
FIG. 3D shows coating of a SOG film.
Figure 3E:
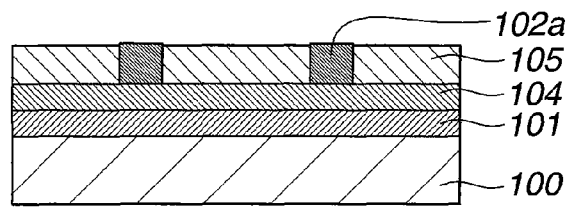
FIG. 3E shows light etching with CMP or CF gas.
Figure 3F:
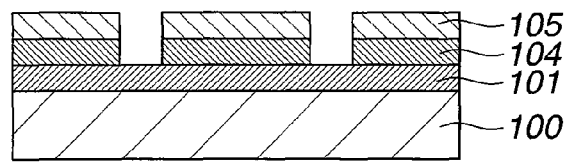
FIG. 3F shows pattern reversal by oxygen/hydrogen gas etching.
Figure 3G:
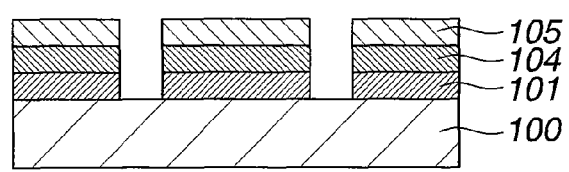
FIG. 3G shows etching of a processable substrate.
Figure 4:
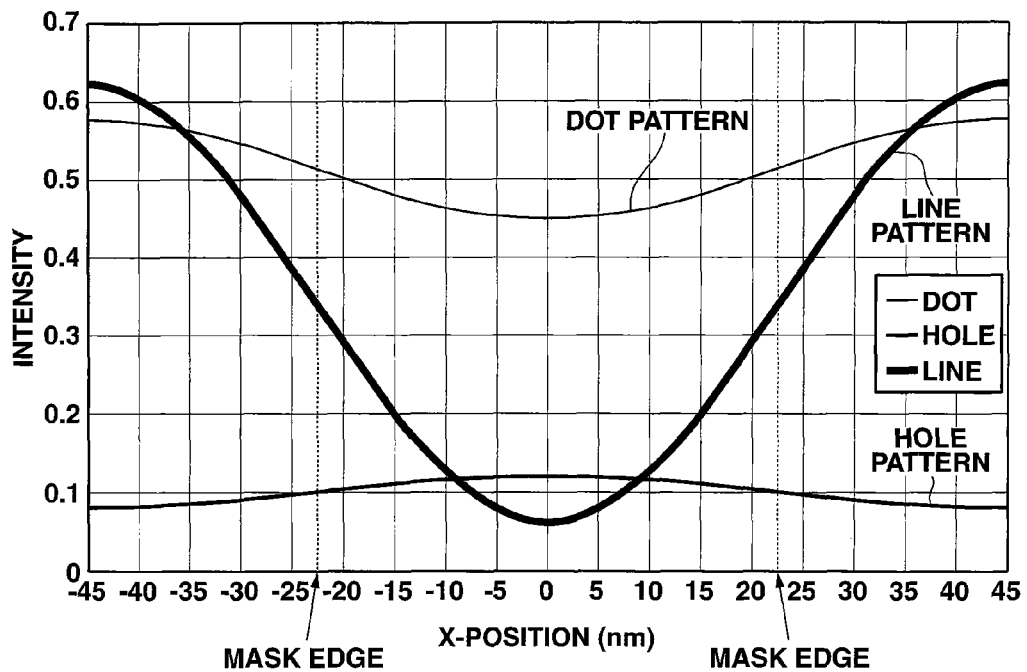
FIG. 4 is a diagram showing optical contrasts of hole, dot and line patterns having pitch 90 nm and size 45 nm when illuminated through NA 1.3 lens.
Figure 5:
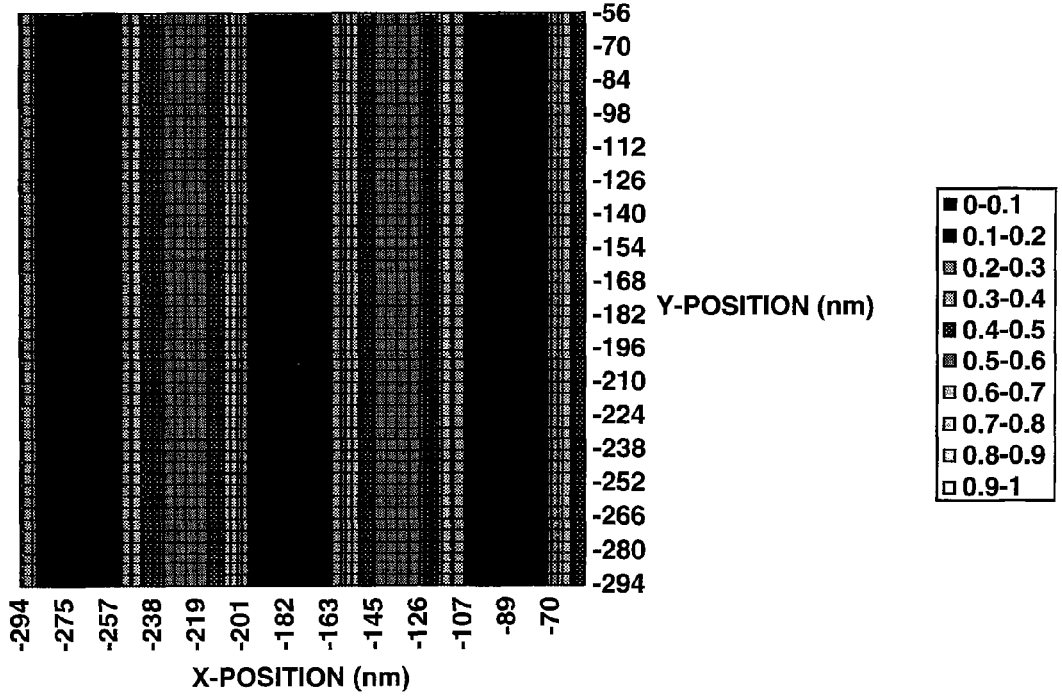
FIG. 5 illustrates an optical image of Y-direction lines printed using NA 1.2 lens, dipole illumination, s-polarized illumination, and 6% halftone phase shift mask, wherein a darker inked area indicates a weaker light intensity.
Figure 6:
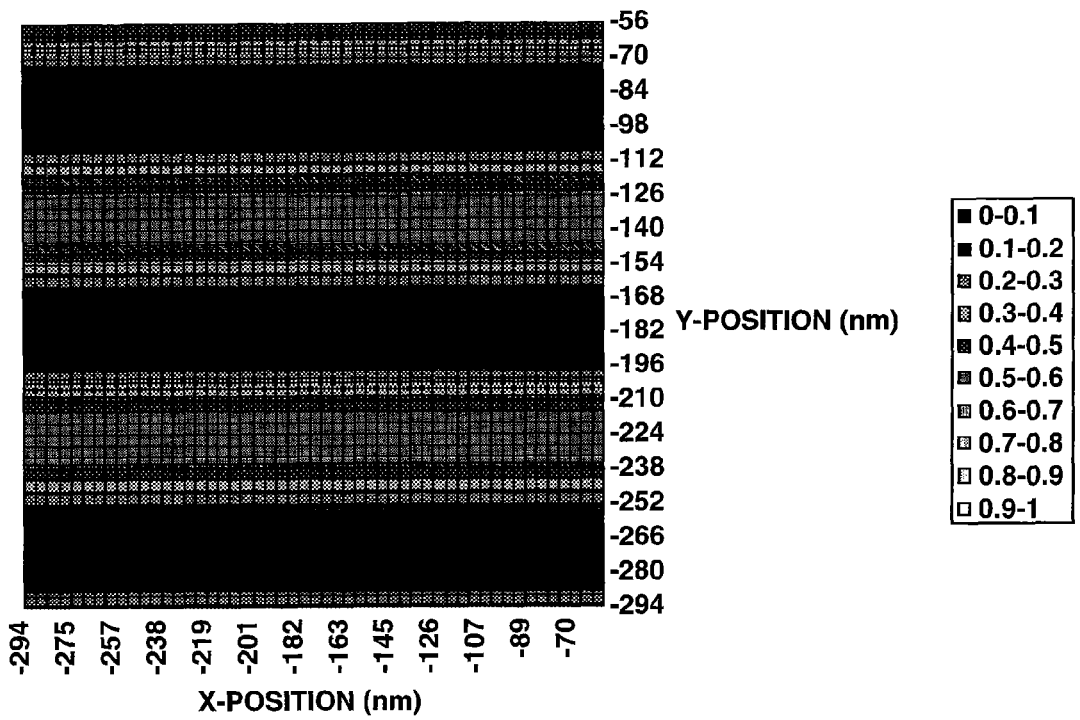
FIG. 6 illustrates an optical image of X-direction lines printed using NA 1.2 lens, dipole illumination, s-polarized illumination, and 6% halftone phase shift mask, wherein a darker inked area indicates a weaker light intensity.
Figure 7:
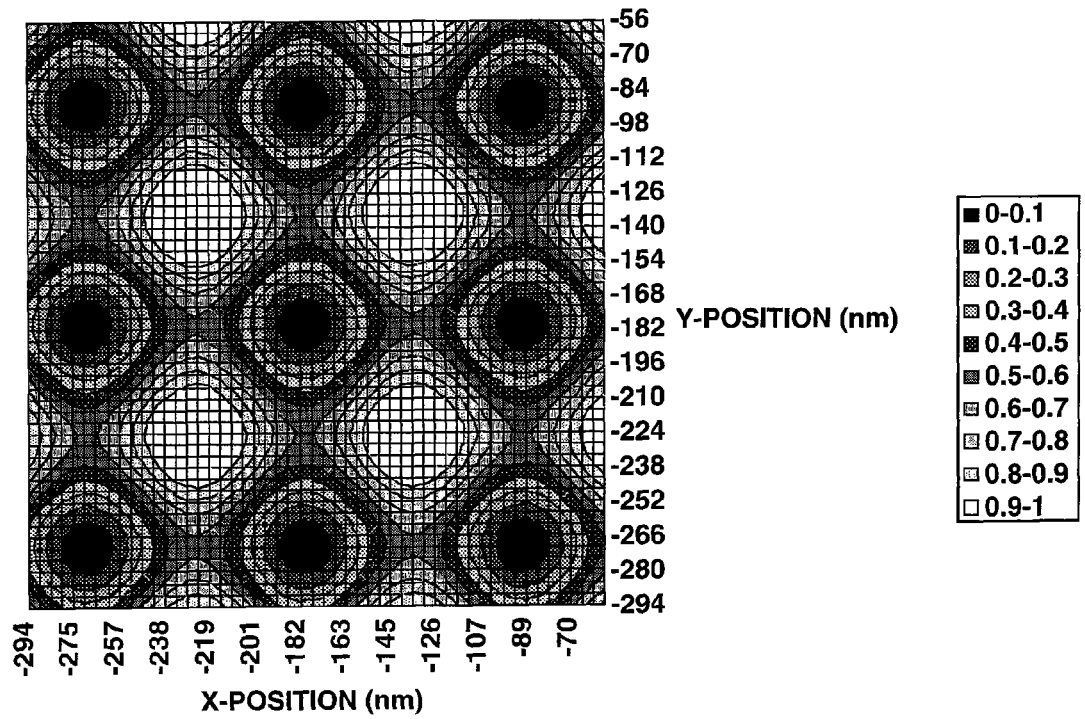
FIG. 7 is a contrast image indicating the light intensity of double dipole lithography with NA 1.2 lens, obtained by overlaying X-direction lines of FIG. 6 on Y-direction lines of FIG. 5, wherein a darker inked area indicates a weaker light intensity.
Figure 8:
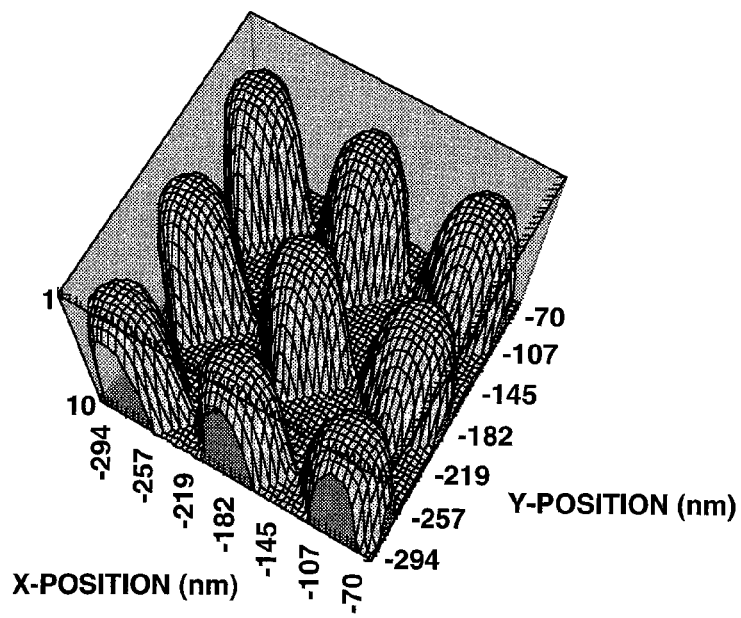
FIG. 8 illustrates a simulation of a resist profile of double dipole illumination lithography with NA 1.2 lens wherein Z axis is the negative of logarithm of a dissolution rate of the resist, reflecting the resist profile of dot pattern, and the exposure dose is 10 $mJ/cm^2$.
Figure 9:
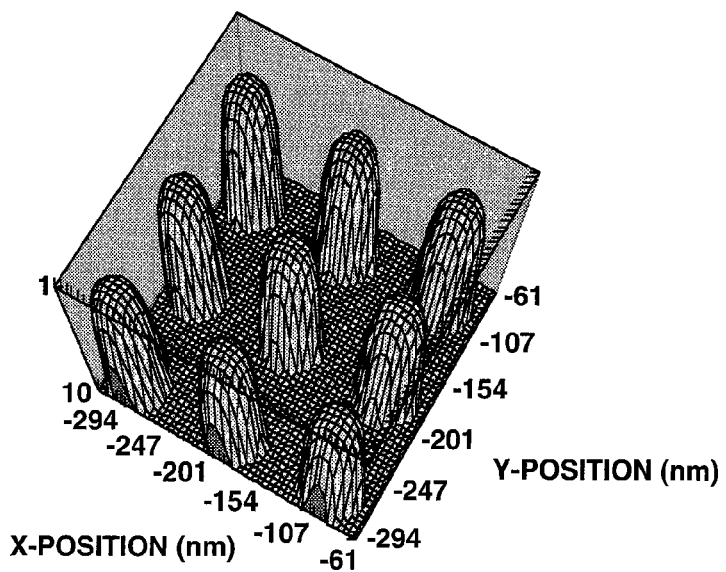
FIG. 9 illustrates a similar simulation of a resist profile wherein the exposure dose is 15 $mJ/cm^2$.
Figure 10:
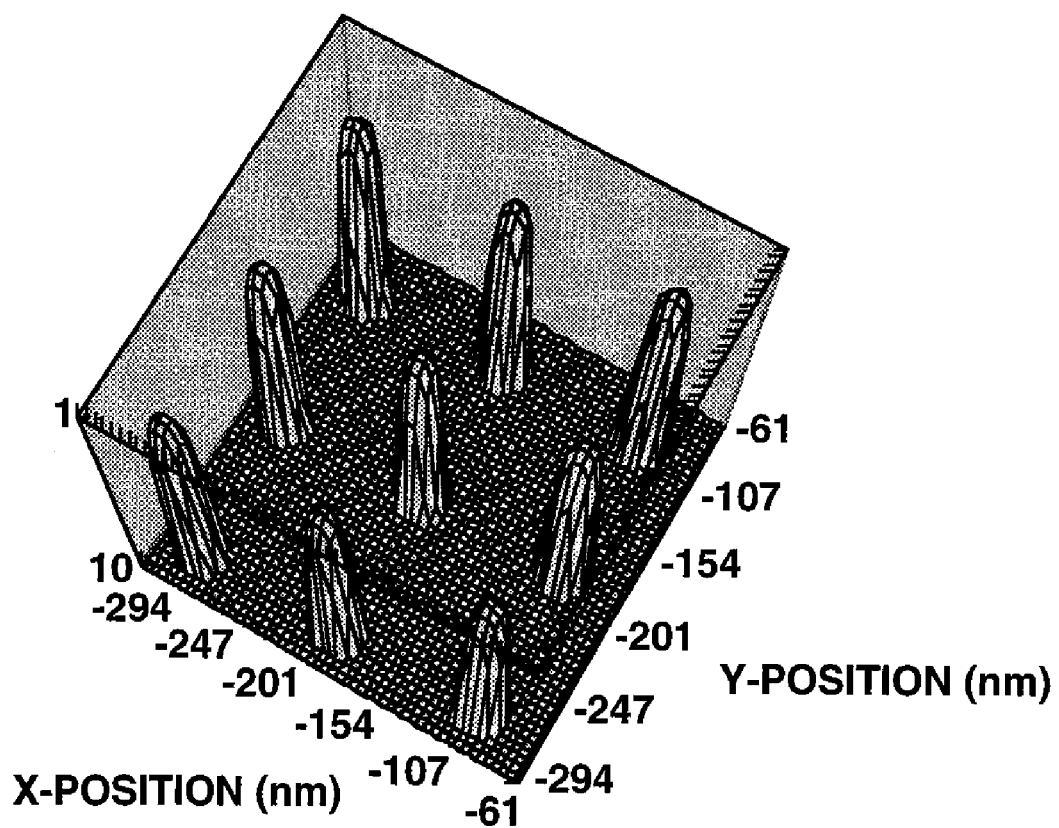
FIG. 10 illustrates a similar simulation of a resist profile wherein the exposure dose is 40 $mJ/cm^2$.

The terms "a" and "an" herein do not denote a limitation of quantity, but rather denote the presence of at least one of the referenced item.

"Optional" or "optionally" means that the subsequently described event or circumstance may or may not occur, and that the description includes instances where the event occurs and instances where it does not.

As used herein, the notation ($C_n$-$C_m$) means a group containing from n to m carbon atoms per group.

The abbreviations and acronyms have the following meaning.
Mw: weight average molecular weight
Mn: number average molecular weight
Mw/Mn: molecular weight distribution or dispersity
GPC: gel permeation chromatography
PEB: post-exposure baking
CVD: chemical vapor deposition
SOG: spin on glass
TMAH: tetramethylammonium hydroxide
PGMEA: propylene glycol monomethyl ether acetate The abbreviation "phr" refers to parts by weight per 100 parts by weight of resin or polymer.

The present invention provides a process for forming a pattern by way of positive/negative reversal, comprising the steps of coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the unnecessary solvent and to form a resist film; exposing the resist film patternwise to high-energy radiation, post-exposure baking so that the acid generated by the acid generator upon exposure may act on acid labile groups in the resin for thereby effecting elimination reaction of acid labile groups in the resin in exposed areas, developing the exposed resist film with an alkaline developer to form a positive pattern; illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin may not lose a solubility in an alkaline wet etchant, for thereby endowing the positive pattern with resistance to an organic solvent used in a reversal film-forming composition; coating a reversal film-forming composition on the positive pattern-bearing substrate to form a reversal film; dissolving away the crosslinked positive pattern in an alkaline wet etchant to form a space pattern; and shrinking the space pattern.

In preferred embodiments, the space pattern is a hole pattern; the step of shrinking the space pattern includes baking; or the step of shrinking the space pattern includes coating a material which is soluble in water or $C_1$-$C_8$ alcohol onto the reversal film of which the space pattern is formed, to form a material coating, heating, and stripping an extra portion of the material coating using a liquid selected from water, alcohol, and alkaline developer.

As discussed above, several attempts have already been made to form a pattern, which is optically disadvantageous to form from a positive resist material as such, using a positive resist material featuring a high resolution capability and positive/negative reversal. There were many problems to be overcome in the course of development works. In the situation where a reversal film is formed on a once formed positive pattern, how to deposit a new coating without disrupting the underlying pattern is one of such problems. The initial approach addressing this problem is to use an aqueous composition in which the positive pattern is not dissolvable, as the reversal film-forming composition. The reversal film material which can be used is limited to a narrow range of water-soluble materials. Then JP-A 2001-92154 proposes that by EB curing, a positive pattern is crosslinked to be insoluble in solvents and developers, before a reversal film is formed. Another problem is how to selectively remove the positive pattern relative to the reversal film. Selective removal is achieved using SOG and organic silicone materials having resistance to oxygen dry etching as the reversal film as taught in JP-A 2001-92154.

On the other hand, the fact that a resist film as shown in JP-A 2001-92154 is crosslinked and insolubilized upon exposure to high-energy radiation was known at the initial phase of research and development of chemically amplified resist materials as a phenomenon that occurs when a chemically amplified resist film is exposed to radiation of too high energy. That is, it is a phenomenon that when polyhydroxystyrene units of which a chemically amplified resist polymer is composed are exposed to high intensity light, a hydrogen radical is eliminated from the methine to which the phenyl group is bonded, and the resulting radical acts to form crosslinks between resin molecules whereby the resin is insolubilized. It is believed that this radical creation capable of inducing crosslink formation can occur not only on the styrene structure, but also on the polyacrylic acid structure. It is further believed that similar crosslink formation occurs on methylene bonded to a heteroatom. However, the inventors observed that when light exposure is made stepwise, insolubilization of a resist film by crosslink formation does not instantly occur, but past consecutive points of time when the dissolution rate is slightly reduced, and attempted to utilize this phenomenon. More particularly, the initially observed reductions of dissolution rate are results of crosslinks forming within or between molecules within a limited range. As long as crosslinking is within the limited range, there is a possibility that resistance to organic solvents such as the coating solvent is obtainable without completely losing a dissolution rate in alkaline developer. Then, studying to form a pattern having resistance to organic solvents commonly used in film-forming compositions without completely losing a dissolution rate in alkaline developer, the inventors have found that such a pattern is feasible.

If the method of endowing a positive pattern with resistance to organic solvents without completely losing solubility in alkaline developer as mentioned above is incorporated in the process of forming a resist pattern through positive/negative reversal, a pattern forming process involving reversal of a positive pattern to a negative pattern becomes possible as described below. Namely, in accordance with the ordinary positive pattern forming method, first a chemically amplified positive resist composition is coated and prebaked to form a resist film. Then patternwise exposure is performed, and post-exposure heating or baking is performed to eliminate acid labile groups from the resin in the exposed area, for thereby turning the exposed area soluble in alkaline developer. This is followed by development with an alkaline developer, yielding a positive pattern. Next, the resulting positive pattern is subjected to the step of endowing the positive pattern with resistance to an organic solvent to be used in a reversal film-forming composition without completely losing solubility in the alkaline developer. Next, on the substrate having the positive pattern endowed with resistance to an organic solvent to be used in a reversal film-forming composition, the reversal film-forming composition in the form of a solution in that organic solvent is coated to form a reversal film. At this point, the reversal film is coated so as to completely bury or fill spaces in the positive pattern, although the reversal film may be coated so as to form a layer over the positive pattern as well. In such an event, as described in JP-A H01-92741 and JP-A 2001-92154, after the reversal film is formed, the portion of the reversal film deposited on the positive resist is removed and the positive pattern is then removed, both using an alkaline wet etchant. Then only the portion of the reversal film where the positive pattern is absent is left behind, that is, a reversal film pattern reflecting positive/negative reversal is obtained. It is noted that the alkaline wet etchant serves to dissolve the positive pattern, and the developer for forming the positive pattern may be used as the etchant while its concentration may be adjusted if necessary.

The resist pattern forming process relying on positive/negative reversal according to the invention achieves significant simplification of operation because the removal of the positive pattern does not need conventional oxygen dry etching. Further, the reversal film which can be used in the process may be any of conventional organic films including antireflective coatings (ARC) of aromatic organic polymers and organic underlayer films used in the multilayer resist process, specifically organic films comprising resins containing a majority of aromatic structure-bearing units well-known in the art, for example, novolac resins (see JP-A 2007-171895), polystyrene resins, vinyl ether or acrylic resins containing anthracene or naphthalene rings, and multi-branched resins (also known as aliphatic polycyclic structure resins) as used in the ArF resist (see JP-A 2006-293298). Of course, these reversal films may be either films which are insolubilized in organic solvents through crosslink formation during deposition like the ARC or films which are not insolubilized in such a manner, as long as a difference in dissolution rate enough to provide an etching selectivity with respect to the alkaline wet etchant is available between the reversal film and the positive pattern. If these organic material films are used, reversal film patterns resulting from reversal can be directly used as the etching mask for processing metallic silicon and silicon oxide substrates, like the conventional organic resist patterns. Furthermore, as is well known in the art, when organic reversal films as described above are used, films and substrates of silicon nitride, silicon oxynitride, titanium oxide, titanium nitride, germanium oxide and hafnium oxide may be processed as well as the metallic silicon and silicon oxide substrates.

Furthermore, if the reversal film used is a film having a scarce alkaline solubility as will be described later, the step of removing the reversal film deposited on the positive resist pattern may resort to the step of dissolving away in an alkaline wet etchant rather than conventional dry etching and organic solvent stripping techniques. When removal is made by this technique, the reversal film deposited on the resist pattern and the resist pattern can be concurrently removed by a single operation, achieving a significant step saving to the overall process.

The positive pattern is endowed with resistance to an organic solvent to be used in the reversal film-forming composition without completely losing solubility in alkaline wet etchant, and then the positive pattern is prevented from being dissolved and hence deformed or disrupted during coating and formation of the reversal film. This can be achieved by illumination of high-energy radiation of an appropriate energy level, as discussed above. Recognizing that the crosslink formation by light or illumination is sometimes difficult to control owing to the tolerance of illumination dose and the uniformity of illumination, the inventors sought for another crosslink forming technique and discovered that a limited degree of crosslinking just to impart the desired organic solvent resistance can be achieved by heat. Particularly when a positive pattern obtained from a resist material having units having a crosslinking capability under strong reaction conditions such as lactone structure is used, the desired control is relatively easily achievable by heat in the presence of acid.

The step of heating the positive pattern for endowing the positive pattern with resistance to an organic solvent to be used in a reversal film-forming composition without losing a solubility in an alkaline wet etchant differs in the amount of acid to be generated and the optimum temperature to be reached by heating depending on a particular resist material used. Nevertheless, the resist pattern forming process of the invention may be readily implemented by setting conditions for this step in accordance with the following measures. Namely, acid is generated within the resist film by illuminating light or high-energy radiation such as electron beam (EB) in an appropriate range to the resist film and then heating, or solely by heating, whereupon the acid is used to eliminate acid labile groups in the resin to impart a solubility in alkaline solution to the resin. At the same time as this treatment, partial crosslinks are formed by light or heat, whereby the resin is endowed with resistance to an organic solvent to be used in a reversal film-forming composition. Preferably, the measure of solubility of the resist film to be achieved by this step is that the resist film has an etching rate in excess of 2 nm/sec when etched with a 2.38 wt % TMAH aqueous solution commonly used in the alkaline development of resist films. Also, the resistance to an organic solvent to be used in a reversal film-forming composition is of such order that the resist pattern after the resistance-endowing (or crosslinking) treatment experiences a thickness reduction of up to 10 nm when contacted with a solvent to be used in a reversal film-forming composition for 30 seconds and more preferably for 60 seconds, and the solvent resistance of such order prevents the occurrence of the problem that the pattern of the positive resist film is fatally damaged when the reversal film-forming composition is coated thereon, and hence, a reversed (negative) pattern of the desired configuration is not obtainable. It is noted that in determining the treatment conditions, if a bulk film is used which has passed the above-described sequence of steps including resist coating, prebaking, and PEB, but excluding only pattern exposure for positive pattern formation, and has further been subjected to a set of conditions constituting a candidate step of endowing the positive pattern with resistance to an organic solvent to be used in a reversal film-forming composition without losing a solubility in an alkaline wet etchant, then the two dissolution rates described above are readily determined.

The organic solvent used in the reversal film-forming composition which allows for advantageous use of the invention may encompass those solvents in which reversal film-forming organic polymers are fully soluble, and which offer good coating properties, for example, the above-described hydroxy-bearing solvents, esters, ketones and the like. Specifically, the solvent is selected from among PGMEA, cyclohexanone, ethyl lactate, propylene glycol monomethyl ether, and heptanone, which may be used alone or in admixture of two or more. To the solvent, $C_3$-$C_{10}$ alcohol, toluene, xylene or anisole may be added. Then as to the measure of endowing resistance to the organic solvent used in the reversal film-forming composition, the resist pattern which has been treated to have such a degree of solvent resistance as to experience a thickness reduction of up to 10 nm when contacted with a single solvent or a mixture of solvents selected from the above-mentioned group for 30 seconds and more preferably for 60 seconds is particularly preferred because of versatile use.

When partial crosslinks are induced by illumination of high-energy radiation, the heating treatment of the positive pattern may be heating to the PEB temperature used in forming the positive pattern or somewhat lower temperature, because the only reaction to be induced by heating is decomposition of acid labile groups. However, when high-energy radiation is not used, or when the main purpose of high-energy radiation is to generate acid, that is, when an energy amount equivalent to that of pattern exposure in the previous step is used and crosslinks are formed mainly by thermally induced reaction, it is preferable to select a higher temperature than the prebaking temperature used in formation of the resist film or the PEB temperature. In the case of a material for which this temperature is set lower than the heating of the previous step, there is a risk of the positive resist film decreasing its resolution.

The positive/negative reversal process is advantageously utilized in the following case. As for the positive pattern, a finer size pattern can be formed with an over-exposure dose. Then, although it is technically quite difficult to form isolated spaces (trench pattern) below the exposure limit, for example, a very fine trench pattern can be formed by utilizing over-dose exposure to form a finer size pattern below the ordinary exposure limit and reversing the resulting pattern in accordance with the inventive process. Moreover, although formation of a fine hole pattern encounters more technical difficulty than the trench pattern, holes of a very small size can be formed by utilizing over-dose exposure to form a fine dot pattern and reversing the resulting pattern in accordance with the inventive process.

Now referring to one typical embodiment of the invention wherein a material having a scarce solubility in an alkaline wet etchant is used as the reversal film, the invention is described in further detail. As used herein, the term "alkaline wet etchant" is substantially equivalent to an alkaline developer used in the development of resist patterns and thus often referred to as "alkaline developer" as well.

In the most preferred embodiment of the invention, the pattern forming process comprises the steps of coating a positive resist composition onto a substrate, said resist composition comprising a polymer (or base resin) comprising recurring units having acid labile groups which are eliminatable with acid, the polymer turning, as a result of elimination of acid labile groups and crosslinking, into a crosslinked polymer having a dissolution rate in excess of 2 nm/sec in an alkaline developer, prebaking the resist composition to form a resist film, exposing a selected portion of the resist film to high-energy radiation, PEB, and developing the exposed resist film with the alkaline developer to form a positive pattern. Thereafter, the positive pattern is treated so as to generate acid and heated, thereby eliminating acid labile groups from the polymer and inducing crosslinking in the polymer in the positive pattern. Then, a reversal film having a dissolution rate of 0.02 nm/sec to 2 nm/sec in the alkaline developer is formed on the substrate to cover the resist pattern. The alkaline developer is then applied thereon to dissolve a surface layer of the reversal film and dissolve away the resist pattern, providing the reversal film with a pattern which is a reversal of the resist pattern.

In this embodiment, a hole pattern can be formed by forming a dot pattern as the resist pattern, followed by reversal.

While the reversal film must have etch resistance, the positive resist film need not have etch resistance because it is finally removed when a hole pattern is formed. From this aspect, an alicyclic structure is not necessarily needed. However, since the positive resist film is to be baked at a high temperature of at least 150° C. when the positive resist pattern is polarity changed to be insoluble in organic solvent and soluble in alkaline developer, the positive resist film must have such heat resistance that the pattern may not undergo thermal flow during baking at 150° C. or above. Incorporation of an alicyclic structure is effective for improving heat resistance and preferred to raise the glass transition temperature of a polymer to or above 150° C.

Preferably crosslink formation is attributed to electrophilic structures such as ester groups and cyclic ethers in the resin. Under the action of acid and heat, crosslinking reaction takes place by reactions such as ester exchange, ring-opening, esterification and etherification of lactone ring, ring-opening, etherification and esterification of cyclic ethers.

Resist Composition

The positive resist composition used in the pattern forming process comprises a base resin. A polymer comprising recurring units having lactone ring, specifically recurring units having 7-oxanorbornane ring, and preferably recurring units having the general formula (1) is useful as the base resin. The polymer having formula (1) is highly reactive in crosslinking reaction because both ester group and cyclic ether are contained in a common recurring unit. Since this unit also serves as an adhesive unit, advantageously the base resin is amenable to the pattern forming process without further incorporating additional units into the resin.

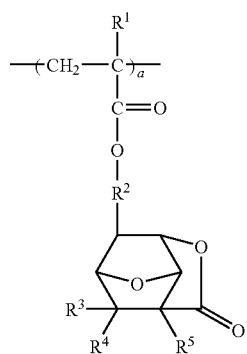

(1)

Herein $R^1$ is hydrogen or methyl. $R^2$ is a single bond, or a straight, branched or cyclic $C_1$-$C_6$ alkylene group which may have an ether or ester radical. When $R^2$ is alkylene, the alkylene has a primary or secondary carbon atom bonded to the ester group in the formula. $R^3$, $R^4$, and $R^5$ are each hydrogen or a straight, branched or cyclic $C_1$-$C_6$ alkyl group. The subscript "a" is a number in the range: $0<a<1.0$.

Exemplary $C_1$-$C_6$ alkylene groups include methylene, ethylene, n-propylene, isopropylene, n-butylene, isobutylene, sec-butylene, n-pentylene, isopentylene, cyclopentylene, n-hexylene, and cyclohexylene.

Exemplary $C_1$-$C_6$ alkyl groups include methyl, ethyl, n-propyl, isopropyl, n-butyl, isobutyl, sec-butyl, n-pentyl, isopentyl, cyclopentyl, n-hexyl, and cyclohexyl.

Those monomers Ma from which recurring units (a) having formula (1) are derived have the following formula wherein $R^1$ to $R^5$ are as defined above.

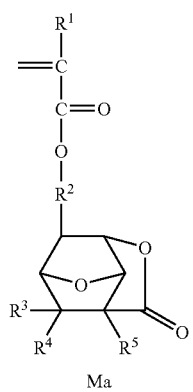

Ma

Examples of monomers Ma are given below.

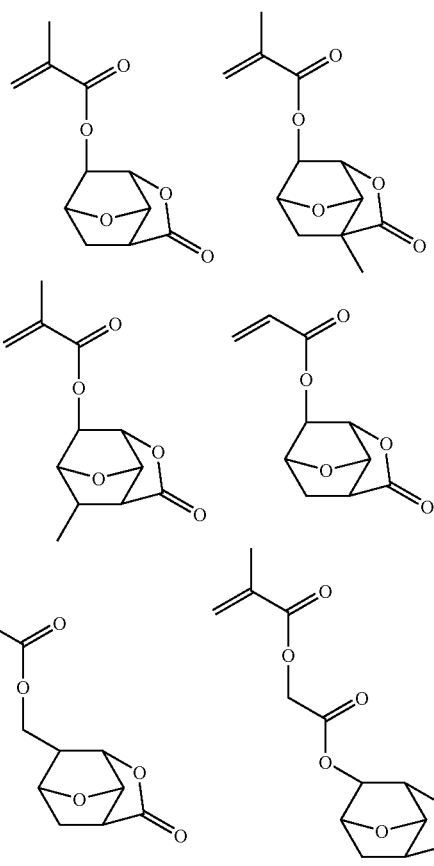

-continued

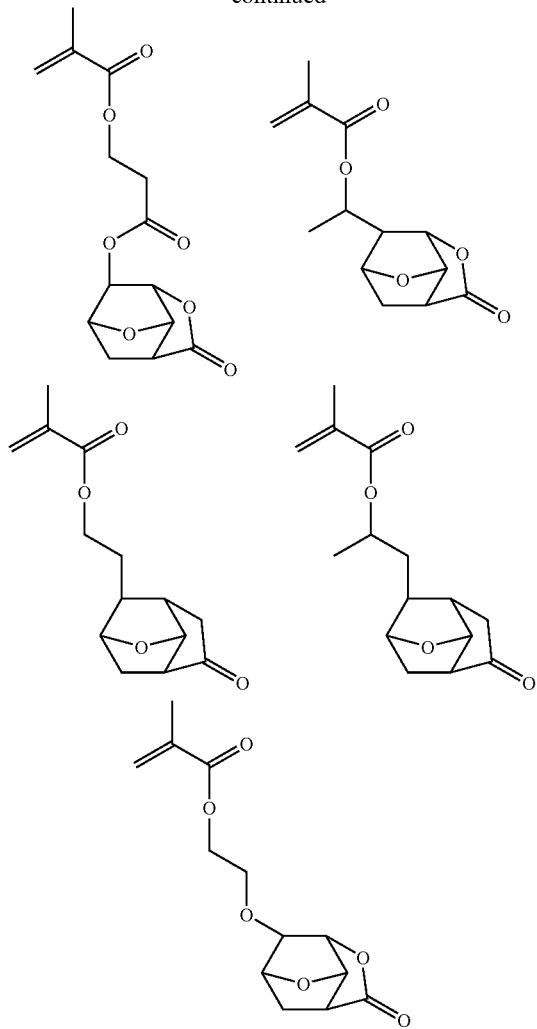

In the inventive process, once the first pattern is formed via exposure and development, deprotection of acid labile groups and crosslinkage are induced by the action of acid and heat. Then a film having an appropriate alkaline solubility (reversal film) is coated thereon and alkaline developed.

Subsequent to illumination and heating, the first pattern turns to a film which is alkaline soluble as a result of deprotection of acid labile groups in the acid labile group-containing recurring units and which is insoluble in a solvent (i.e., solvent in a reversal film-forming composition) as a result of crosslinking of 7-oxanorbornane ring. Thus, when a pattern reversal film-forming composition having a film-forming material dissolved in an organic solvent is coated on the first pattern, intermixing of the first pattern with the pattern reversal film-forming material is avoided.

The reversal film is then treated with an alkaline developer. When a surface portion of the reversal film is dissolved away to the level of the first pattern, dissolution of the first pattern starts. Image reversal occurs in this way.

When a polymer comprising recurring units having oxirane or oxetane is used as the base resin, it does not function as a positive resist composition as desired in the invention because the oxirane or oxetane ring has so high a rate of acid-assisted cleavage reaction that the polymer may undergo crosslinking at resist processing temperatures, for example, at 90 to 130° C. during PEB, and thus become alkali insoluble. In contrast, the 1,4-epoxy bond of 7-oxanorbornane ring is low reactive in acid-assisted cleavage reaction as compared with the oxirane or oxetane ring so that the polymer may not undergo crosslinking in the heating temperature range of PEB. Recurring units having 7-oxanorbornane ring are stable relative to acid in the course from coating to development and exert as a hydrophilic group a function of improving adhesion and alkaline solubility. However, under the impetus of the acid generated by flood exposure or heating of the developed pattern and heating at 170° C. or higher, ring opening of the 1,4-epoxy bond of 7-oxanorbornane ring occurs and crosslinking reaction takes place, leading to insolubility in the solvent. At the same time, deprotection of acid labile groups in the acid labile group-containing recurring units occurs under the impetus of acid and heat, leading to an increased alkaline solubility. For generating acid, a thermal acid generator may be added to the resist composition or the surface of the developed pattern may be subjected to flood exposure to UV having wavelength of less than 400 nm.

In the positive resist composition for use in the pattern forming process, a polymer comprising crosslinkable recurring units (a) having the general formula (1) above and acid labile group-containing recurring units (b) having the general formula (2) below is preferably used as the base resin.

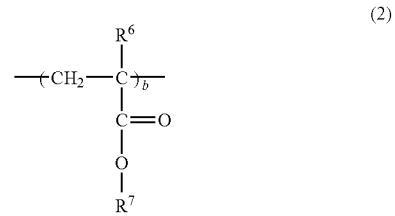

(2)

Herein $R^6$ is hydrogen or methyl, $R'$ is an acid labile group, and b is a number in the range: $0<b\leqq0.8$.

Those monomers Mb from which recurring units (b) having formula (2) are derived have the following formula wherein $R^6$ and $R^7$ are as defined above.

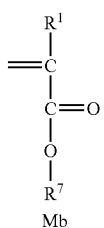

Mb

The acid labile group represented by $R^7$ in formula (2) may be selected from a variety of such groups, specifically groups of the following formulae (AL-10) and (AL-11), tertiary alkyl groups of the following formula (AL-12), and oxoalkyl groups of 4 to 20 carbon atoms, but not limited thereto.

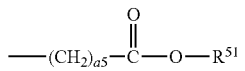

(AL-10)

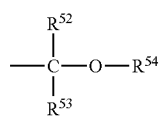
(AL-11)

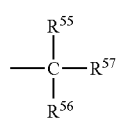
(AL-12)

In formulae (AL-10) and (AL-11), $R^{51}$ and $R^{54}$ each are a monovalent hydrocarbon group, typically a straight, branched or cyclic alkyl group of 1 to 40 carbon atoms, more specifically 1 to 20 carbon atoms, which may contain a heteroatom such as oxygen, sulfur, nitrogen or fluorine. The subscript "a5" is an integer of 0 to 10, and especially 1 to 5. $R^{52}$ and $R^{53}$ each are hydrogen or a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{52}$ and $R^{53}$, $R^{52}$ and $R^{54}$, or $R^{53}$ and $R^{54}$, taken together, may form a ring, specifically aliphatic ring, with the carbon atom or the carbon and oxygen atoms to which they are attached, the ring having 3 to 20 carbon atoms, especially 4 to 16 carbon atoms.

In formula (AL-12), $R^{55}$, $R^{56}$ and $R^{57}$ each are a monovalent hydrocarbon group, typically a straight, branched or cyclic $C_1$-$C_{20}$ alkyl group, which may contain a heteroatom such as oxygen, sulfur, nitrogen or fluorine. Alternatively, a pair of $R^{55}$ and $R^{56}$, $R^{55}$ and $R^{57}$, or $R^{56}$ and $R^{57}$, taken together, may form a ring, specifically aliphatic ring, with the carbon atom to which they are attached, the ring having 3 to 20 carbon atoms, especially 4 to 16 carbon atoms.

Illustrative examples of the groups of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl and 2-tetrahydrofuranyloxycarbonylmethyl as well as substituent groups of the following formulae (AL-10)-1 to (AL-10)-10.

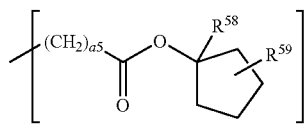
(AL-10)-1

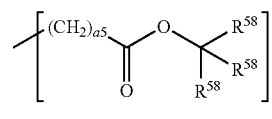
(AL-10)-2

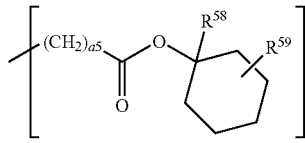
(AL-10)-3

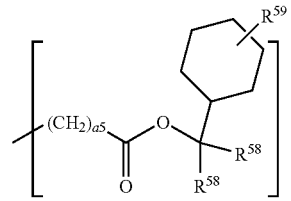
(AL-10)-4

(AL-10)-5

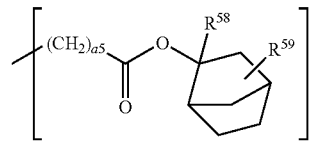
(AL-10)-6

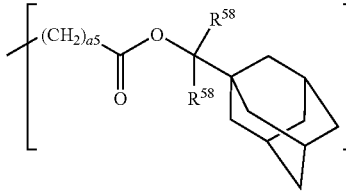
(AL-10)-7

(AL-10)-8

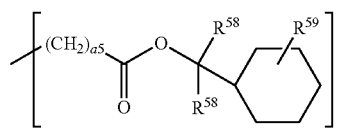
(AL-10)-9

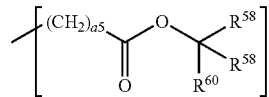
(AL-10)-10

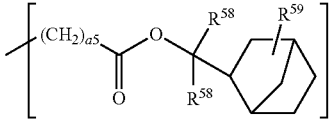

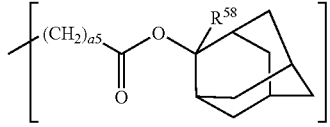

In formulae (AL-10)-1 to (AL-10)-10, $R^{58}$ is each independently a straight, branched or cyclic $C_1$-$C_8$ alkyl group, $C_6$-$C_{20}$ aryl group or $C_7$-$C_{20}$ aralkyl group; $R^{59}$ is hydrogen or a straight, branched or cyclic $C_1$-$C_{20}$ alkyl group; $R^{60}$ is a $C_6$-$C_{20}$ aryl group or $C_7$-$C_{20}$ aralkyl group; and "a5" is an integer of 0 to 10.

Illustrative examples of the acetal group of formula (AL-11) include those of the following formulae (AL-11)-1 to (AL-11)-34.

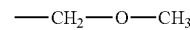
(AL-11)-1

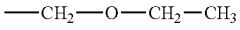
(AL-11)-2

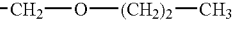
(AL-11)-3

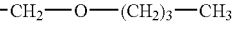
(AL-11)-4

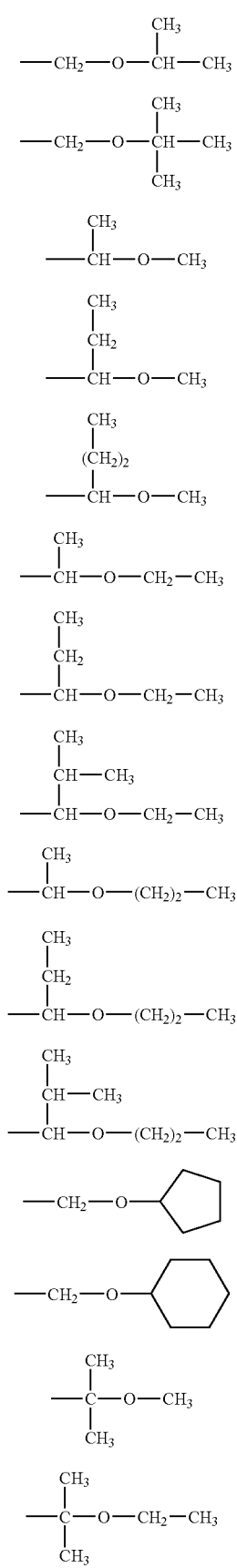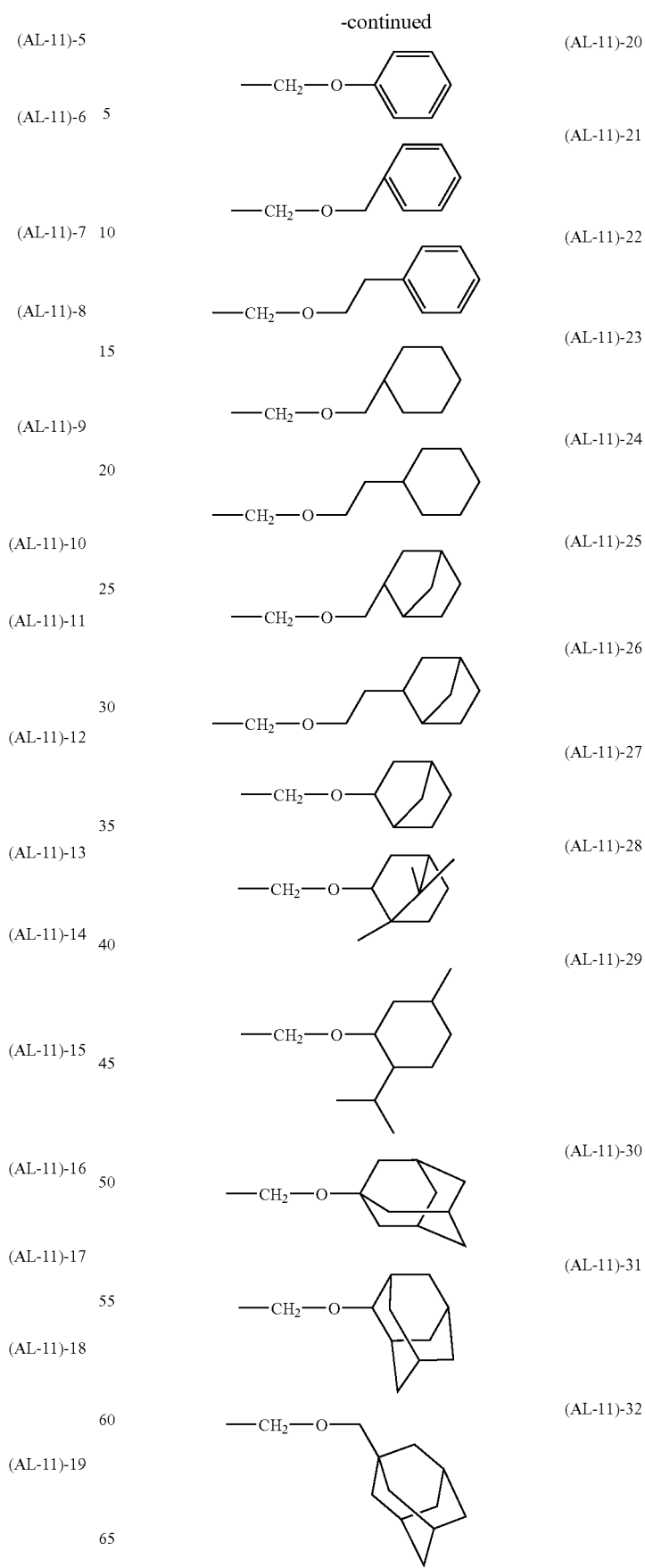

(AL-11)-33

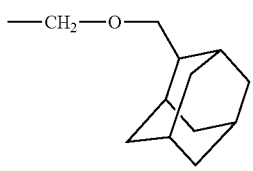

(AL-11)-34

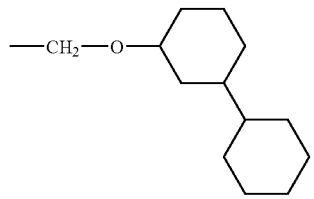

Other examples of acid labile groups include those of the following formula (AL-11a) or (AL-11b) while the polymer may be crosslinked within the molecule or between molecules with these acid labile groups.

(AL-11a)

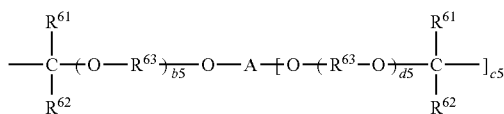

(AL-11b)

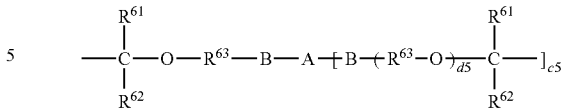

Herein $R^{61}$ and $R^{62}$ each are hydrogen or a straight, branched or cyclic $C_1$-$C_8$ alkyl group, or $R^{61}$ and $R^{62}$, taken together, may form a ring with the carbon atom to which they are attached, and $R^{61}$ and $R^{62}$ are straight or branched $C_1$-$C_8$ alkylene groups when they form a ring. $R^{63}$ is a straight, branched or cyclic $C_1$-$C_{10}$ alkylene group. Each of b5 and d5 is 0 or an integer of 1 to 10, preferably 0 or an integer of 1 to 5, and c5 is an integer of 1 to 7. "A" is a (c5+1)-valent aliphatic or alicyclic saturated hydrocarbon group, aromatic hydrocarbon group or heterocyclic group having 1 to 50 carbon atoms, which may be separated by a heteroatom such as oxygen, sulfur or nitrogen or in which some of the hydrogen atoms attached to carbon atoms may be substituted by hydroxyl, carboxyl, carbonyl groups or fluorine atoms. "B" is —CO—O—, —NHCO—O— or —NHCONH—.

Preferably, "A" is selected from divalent to tetravalent, straight, branched or cyclic $C_1$-$C_{20}$ alkylene, alkanetriyl and alkanetetrayl groups, and $C_6$-$C_{30}$ arylene groups, which may be separated by a heteroatom such as oxygen, sulfur or nitrogen or in which some of the hydrogen atoms attached to carbon atoms may be substituted by hydroxyl, carboxyl, acyl groups or halogen atoms. The subscript c5 is preferably an integer of 1 to 3.

The crosslinking acetal groups of formulae (AL-11a) and (AL-11b) are exemplified by the following formulae (AL-11)-35 through (AL-11)-42.

(AL-11)-35

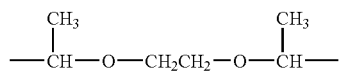

(AL-11)-36

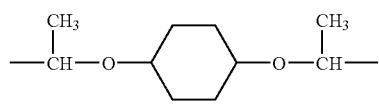

(AL-11)-37

(AL-11)-38

(AL-11)-39

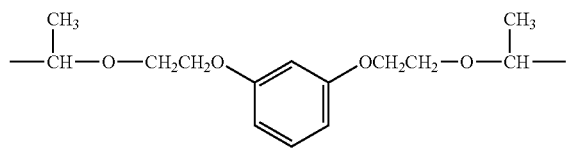

(AL-11)-40

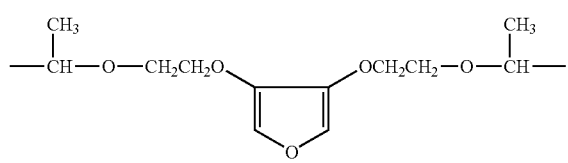

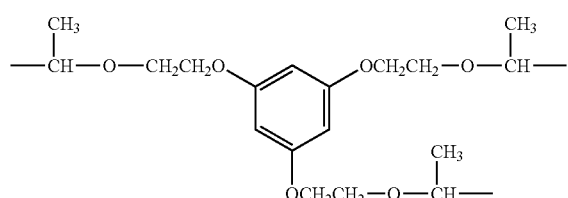
(AL-11)-41
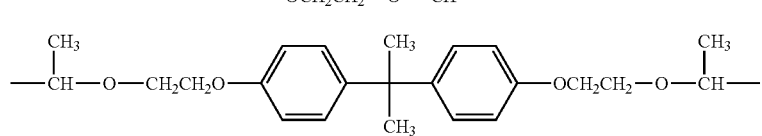
(AL-11)-42
Illustrative examples of the tertiary alkyl of formula (AL-12) include tert-butyl, triethylcarbyl, 1-ethylnorbornyl, 1-methylcyclohexyl, 1-ethylcyclopentyl, and tert-amyl groups as well as those of (AL-12)-1 to (AL-12)-16.
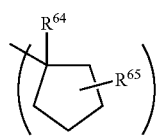
(AL-12)-1
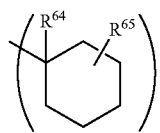
(AL-12)-2
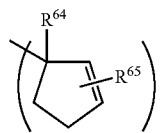
(AL-12)-3
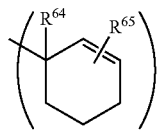
(AL-12)-4
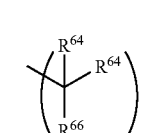
(AL-12)-5
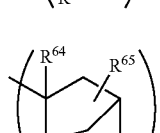
(AL-12)-6
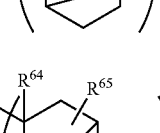
(AL-12)-7
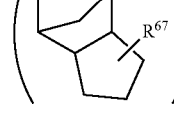
-continued
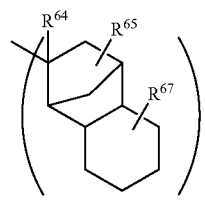
(AL-12)-8
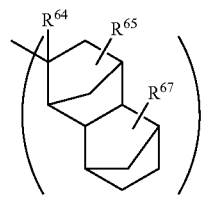
(AL-12)-9
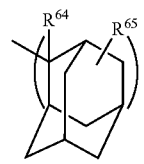
(AL-12)-10
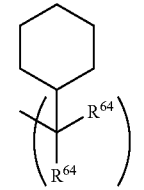
(AL-12)-11
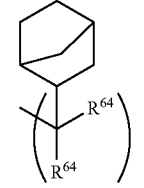
(AL-12)-12
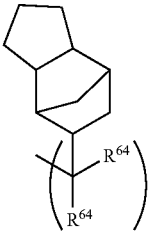
(AL-12)-13

(AL-12)-14

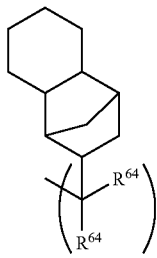

(AL-12)-15

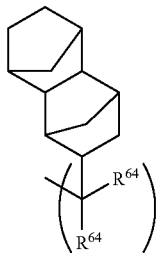

(AL-12)-16

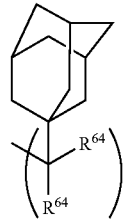

Herein $R^{64}$ is each independently a straight, branched or cyclic $C_1$-$C_8$ alkyl group, $C_6$-$C_{20}$ aryl group or $C_7$-$C_{20}$ aralkyl group; $R^{65}$ and $R^{67}$ each are hydrogen or a straight, branched or cyclic $C_1$-$C_{20}$ alkyl group; and $R^{66}$ is a $C_6$-$C_{20}$ aryl group or $C_7$-$C_{20}$ aralkyl group.

With $R^{68}$ representative of a di- or more valent alkylene or arylene group included as shown in formulae (AL-12)-17 and (AL-12)-18, the polymer may be crosslinked within the molecule or between molecules. In formulae (AL-12)-17 and (AL-12)-18, $R^{64}$ is as defined above; $R^{68}$ is a straight, branched or cyclic $C_1$-$C_{20}$ alkylene group or arylene group, which may contain a heteroatom such as oxygen, sulfur or nitrogen; and b6 is an integer of 1 to 3.

(AL-12)-17

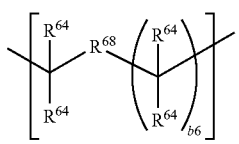

(AL-12)-18

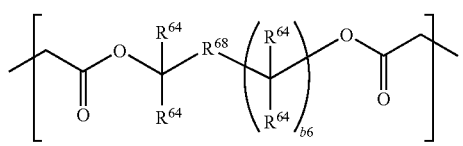

The groups represented by $R^{64}$, $R^{65}$, $R^{66}$ and $R^{67}$ may contain a heteroatom such as oxygen, nitrogen or sulfur. Such groups are exemplified by those of the following formulae (AL-13)-1 to (AL-13)-7.

(AL-13)-1

—(CH$_2$)$_4$OH (AL-13)-2

—(CH$_2$)$_2$O(CH$_2$)$_3$CH$_3$ (AL-13)-3

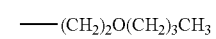

(AL-13)-4

—(CH$_2$)$_2$O(CH$_2$)$_2$OH (AL-13)-5

—(CH$_2$)$_6$OH (AL-13)-6

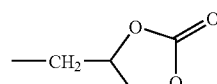

(AL-13)-7

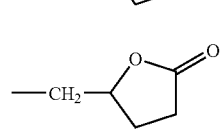

Of the acid labile groups of formula (AL-12), recurring units having an exo-form structure represented by the formula (AL-12)-19 are preferred.

(AL-12)-19

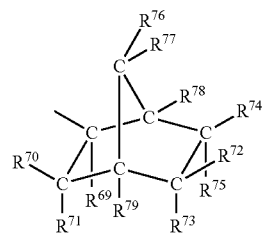

Herein, $R^{69}$ is a straight, branched or cyclic $C_1$-$C_8$ alkyl group or a substituted or unsubstituted $C_6$-$C_{20}$ aryl group; $R^{70}$ to $R^{75}$, $R^{78}$ and $R^{79}$ are each independently hydrogen or a monovalent hydrocarbon group, typically alkyl, of 1 to 15 carbon atoms which may contain a heteroatom; and $R^{76}$ and $R^{77}$ are hydrogen. Alternatively, a pair of $R^{70}$ and $R^{71}$, $R^{72}$ and $R^{74}$, $R^{72}$ and $R^{75}$, $R^{73}$ and $R^{75}$, $R^{73}$ and $R^{79}$, $R^{74}$ and $R^{78}$, $R^{76}$ and $R^{77}$ or $R^{77}$ and $R^{78}$, taken together, may form a ring, specifically aliphatic ring, with the carbon atom(s) to which they are attached, and in this case, each R is a divalent hydrocarbon group, typically alkylene, of 1 to 15 carbon atoms which may contain a heteroatom. Also, a pair of $R^{70}$ and $R^{79}$, $R^{76}$ and $R^{79}$, or $R^{72}$ and $R^{74}$ which are attached to vicinal carbon atoms may bond together directly to form a double bond. The formula also represents an enantiomer.

The ester form monomers from which recurring units having an exo-form structure represented by the formula (AL-12)-19 are derived are described in U.S. Pat. No. 6,448,420 (JP-A 2000-327633).

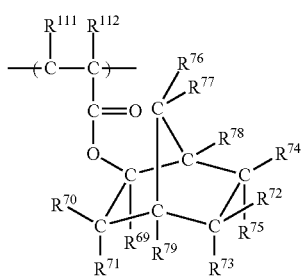
It is noted that $R^{111}$ and $R^{112}$ are each independently hydrogen, methyl, —$COOCH_3$, —$CH_2COOCH_3$ or the like. Illustrative non-limiting examples of suitable monomers are given below.
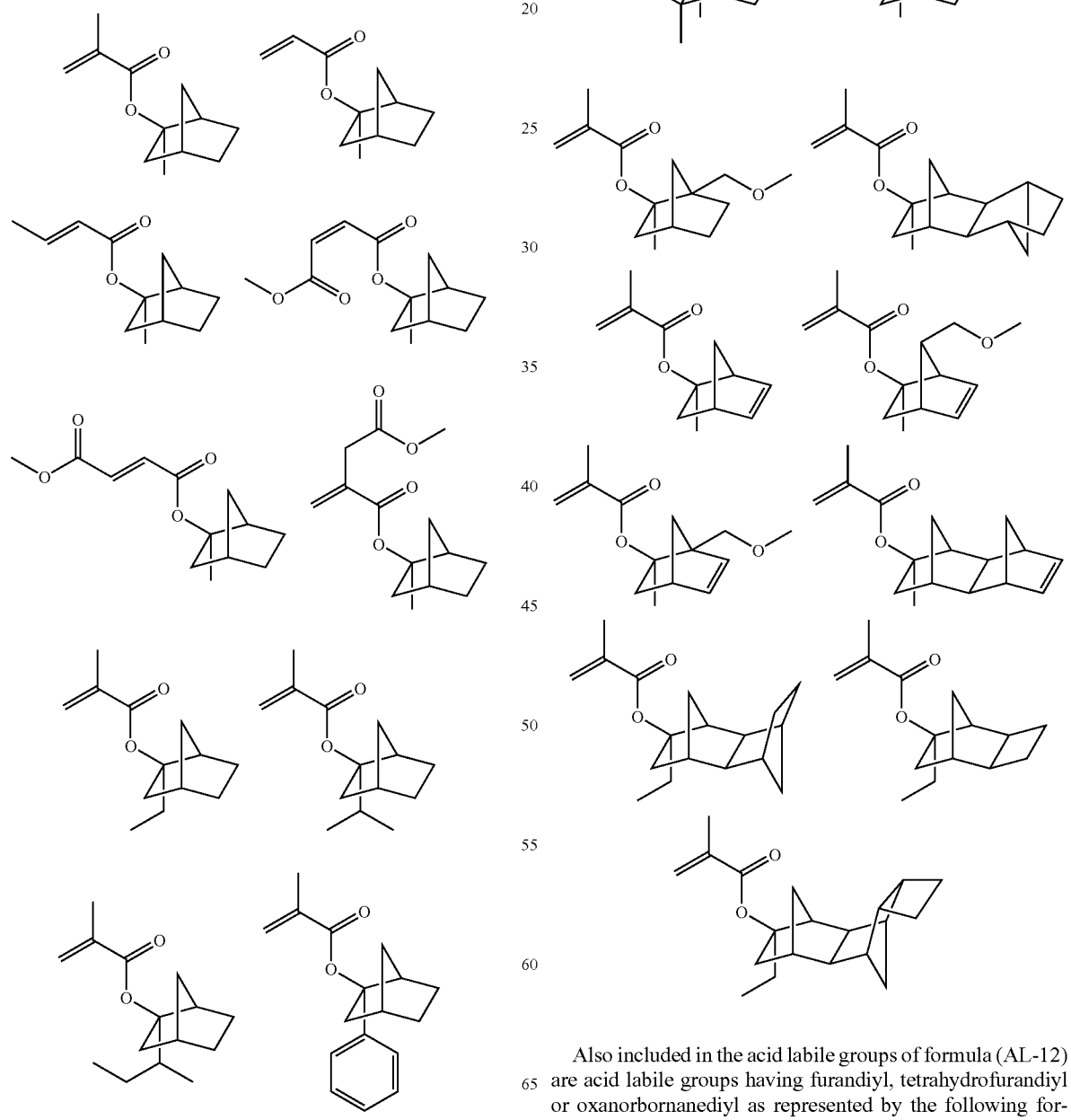
Also included in the acid labile groups of formula (AL-12) are acid labile groups having furandiyl, tetrahydrofurandiyl or oxanorbornanediyl as represented by the following formula (AL-12)-20.

(AL-12)-20

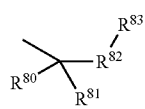

Herein, $R^{80}$ and $R^{81}$ are each independently a monovalent hydrocarbon group, typically a straight, branched or cyclic $C_1$-$C_{10}$ alkyl. $R^{80}$ and $R^{81}$, taken together, may form an aliphatic hydrocarbon ring of 3 to 20 carbon atoms with the carbon atom to which they are attached. $R^{82}$ is a divalent group selected from furandiyl, tetrahydrofurandiyl and oxanorbornanediyl. $R^{83}$ is hydrogen or a monovalent hydrocarbon group, typically a straight, branched or cyclic $C_1$-$C_{10}$ alkyl, which may contain a heteroatom.

Examples of the monomers from which the recurring units substituted with acid labile groups having furandiyl, tetrahydrofurandiyl and oxanorbornanediyl as represented by the formula:

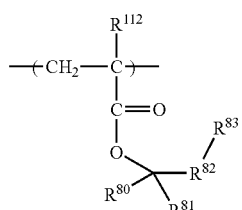

(wherein $R^{80}$ to $R^{83}$, and $R^{112}$ are as defined above) are derived are shown below. Note that Me is methyl and Ac is acetyl.

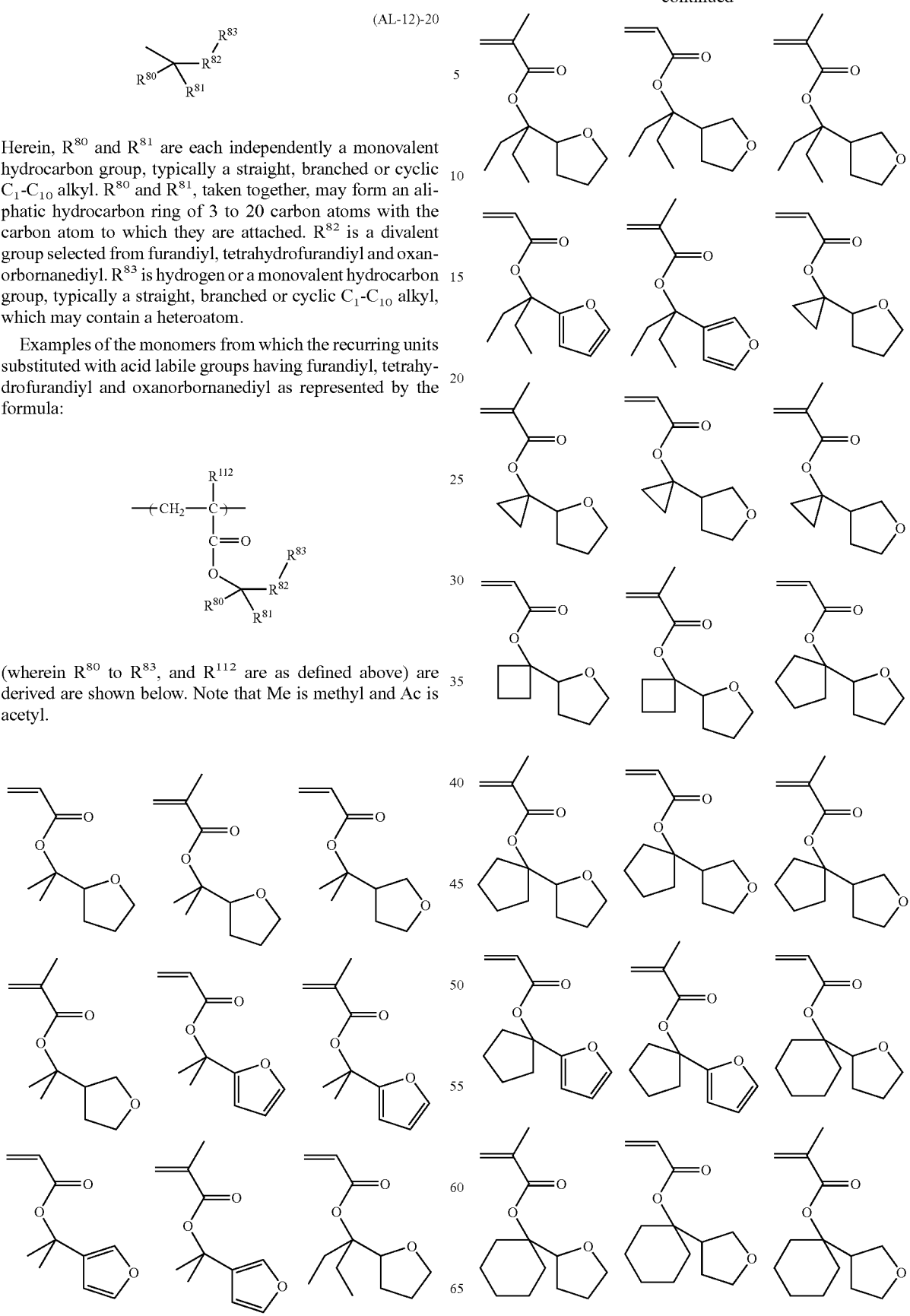

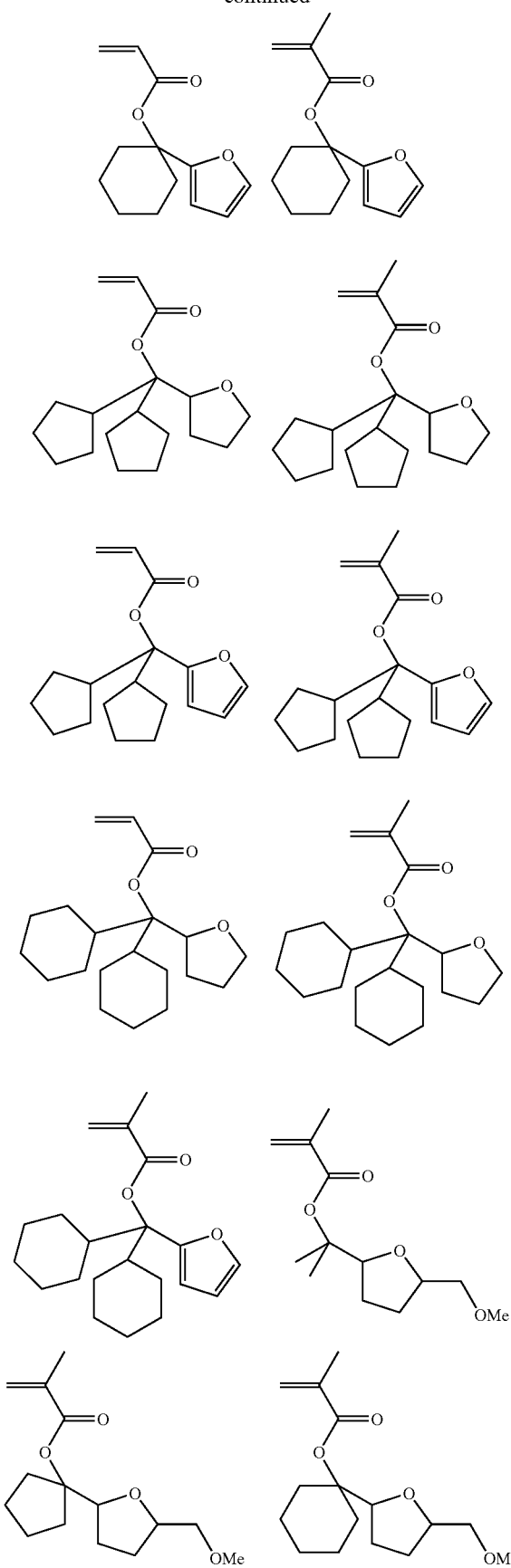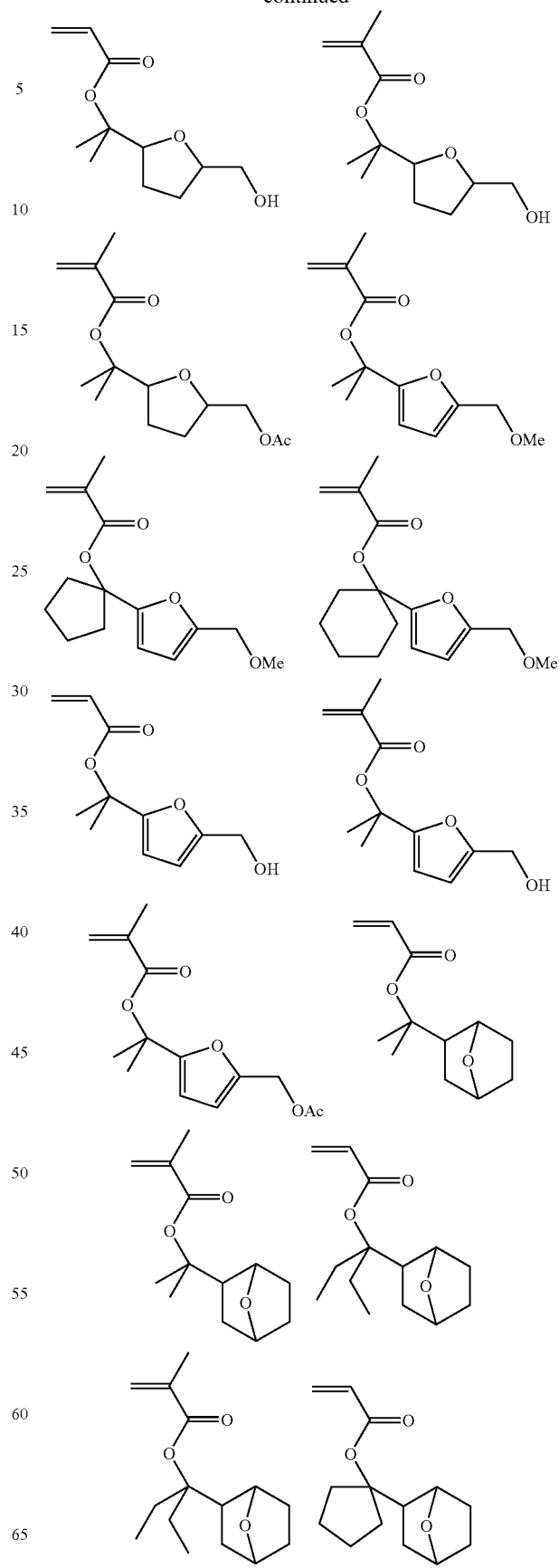

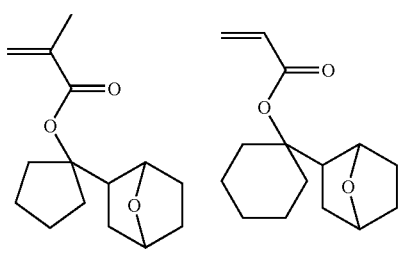
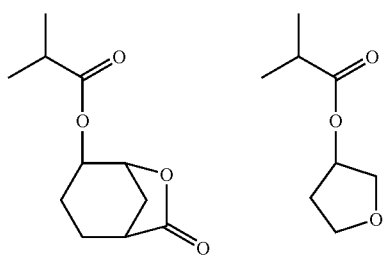

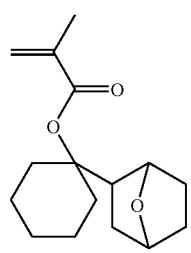
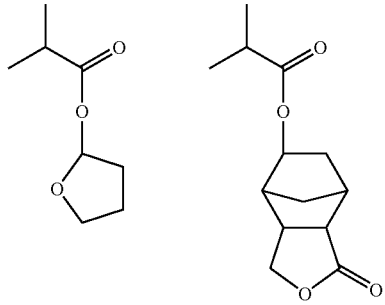

While the polymer used herein preferably includes recurring units (a) of formula (1) and recurring units (b) of formula (2), it may have copolymerized therein recurring units (c) derived from monomers having adhesive groups such as hydroxy, cyano, carbonyl, ester, ether groups, lactone rings, carboxyl groups or carboxylic anhydride groups. Examples of monomers from which recurring units (c) are derived are given below.

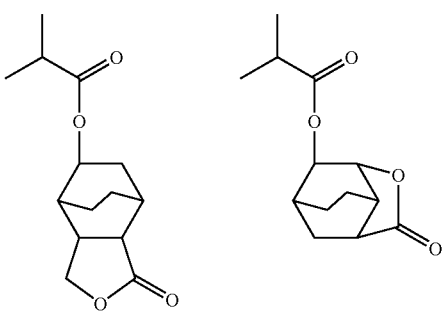
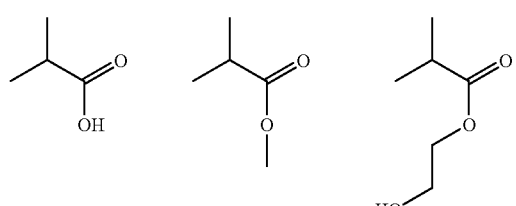
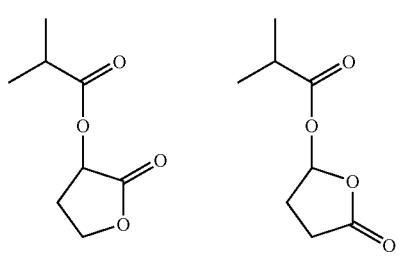
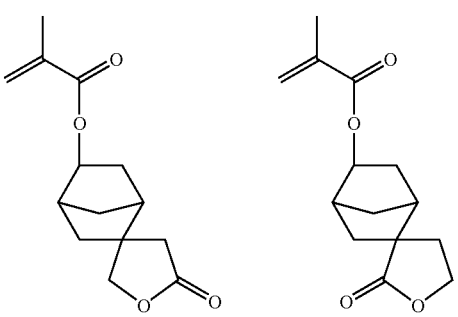
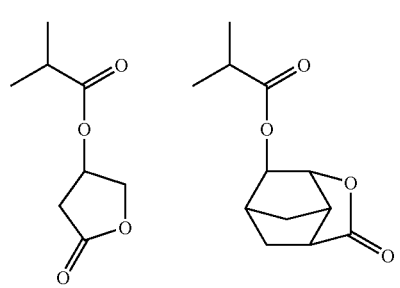
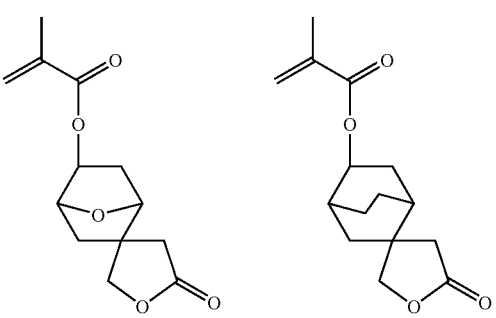

-continued
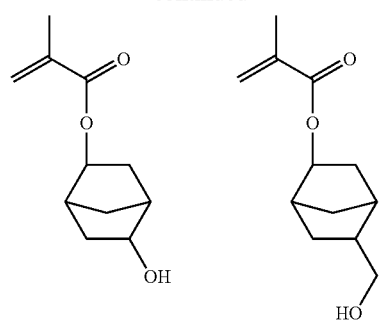
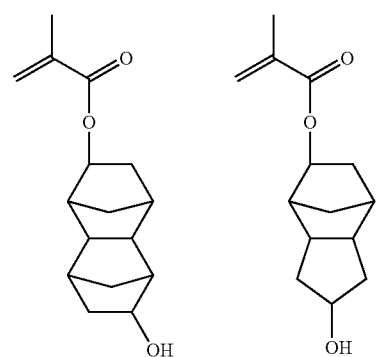
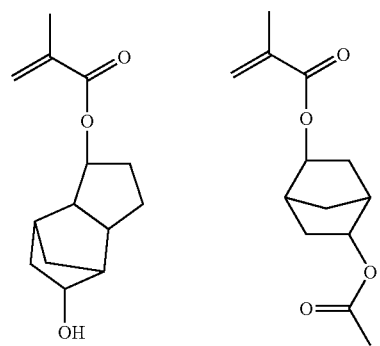
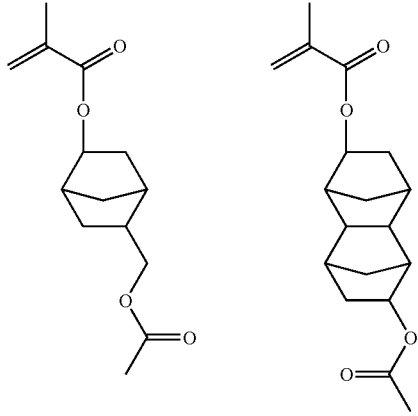
-continued
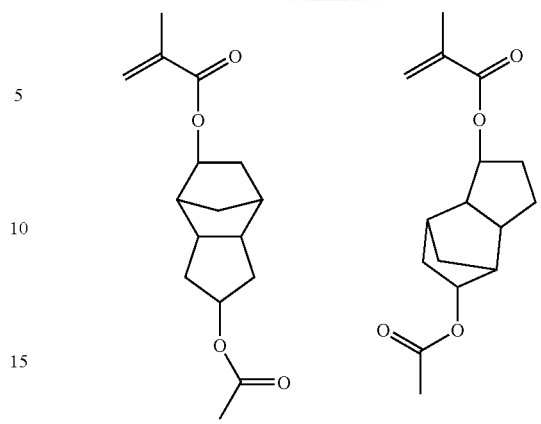
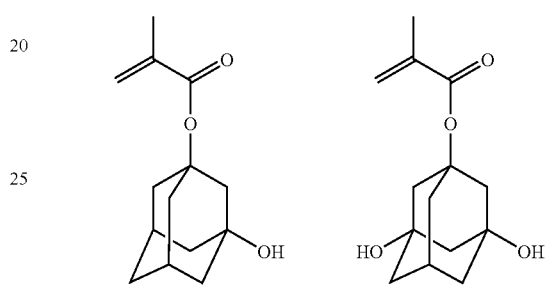
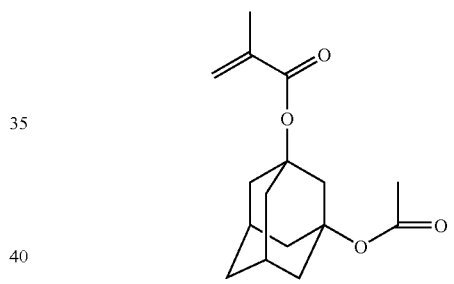
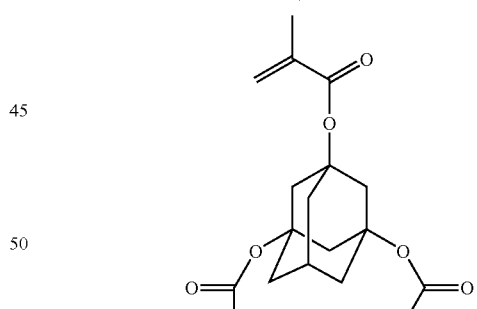
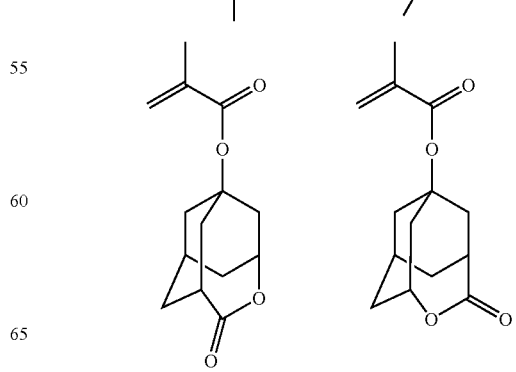

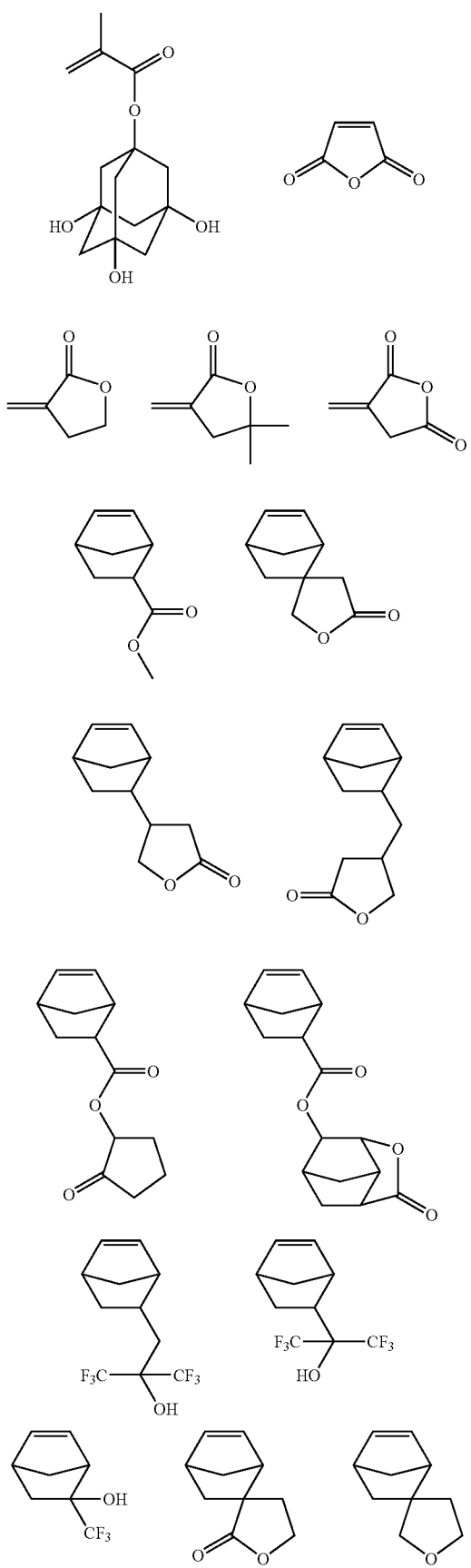
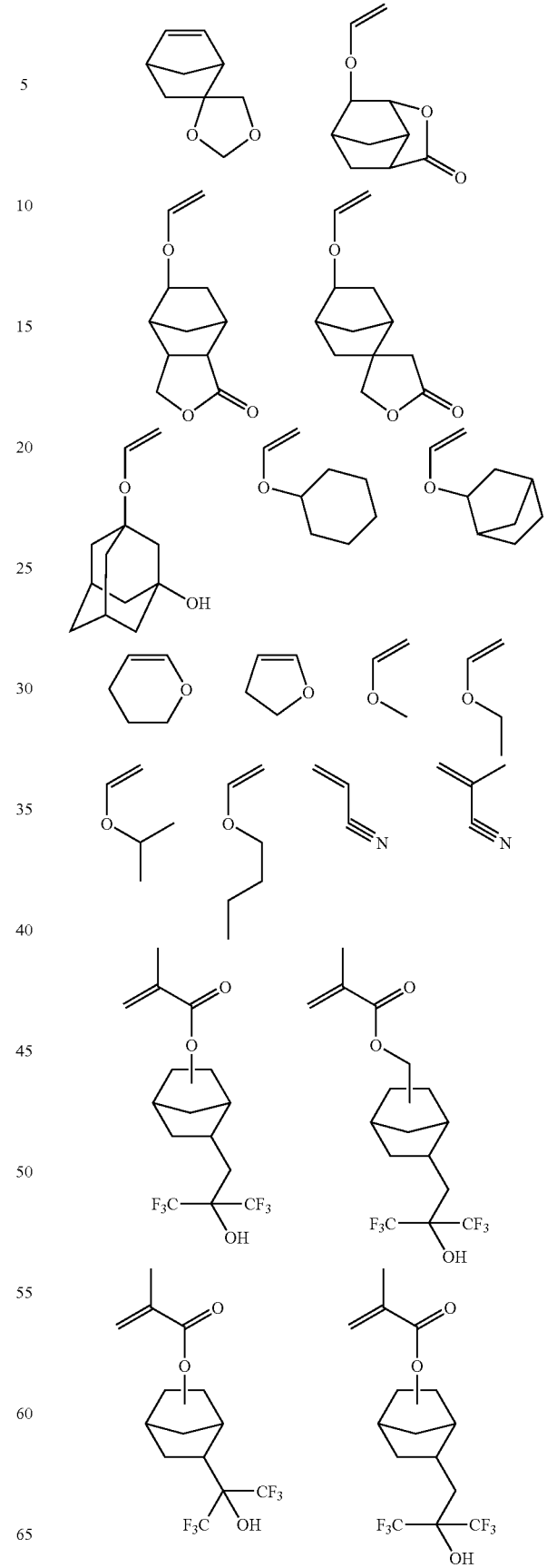

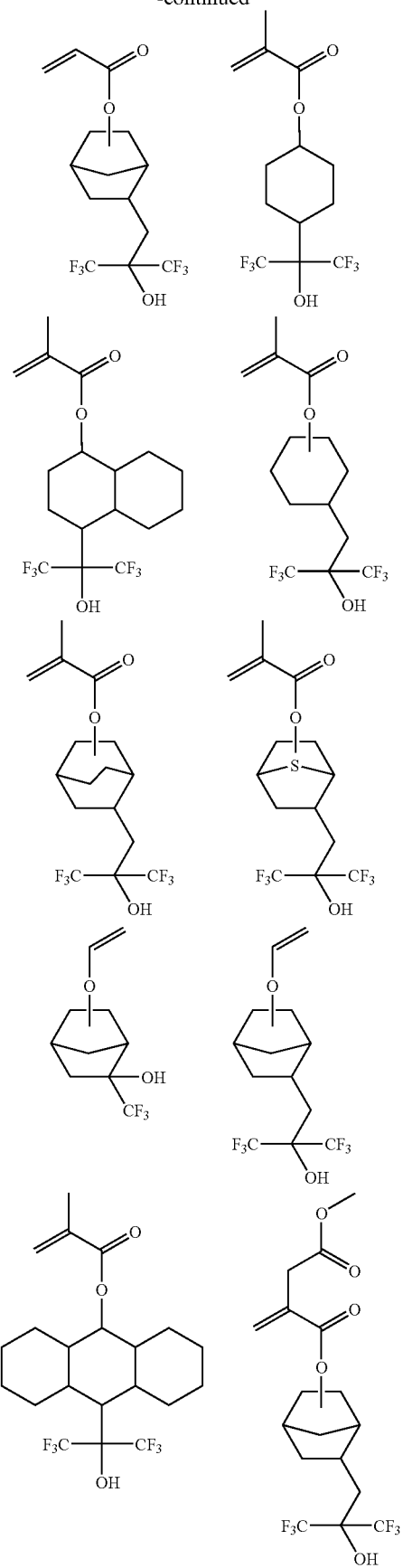
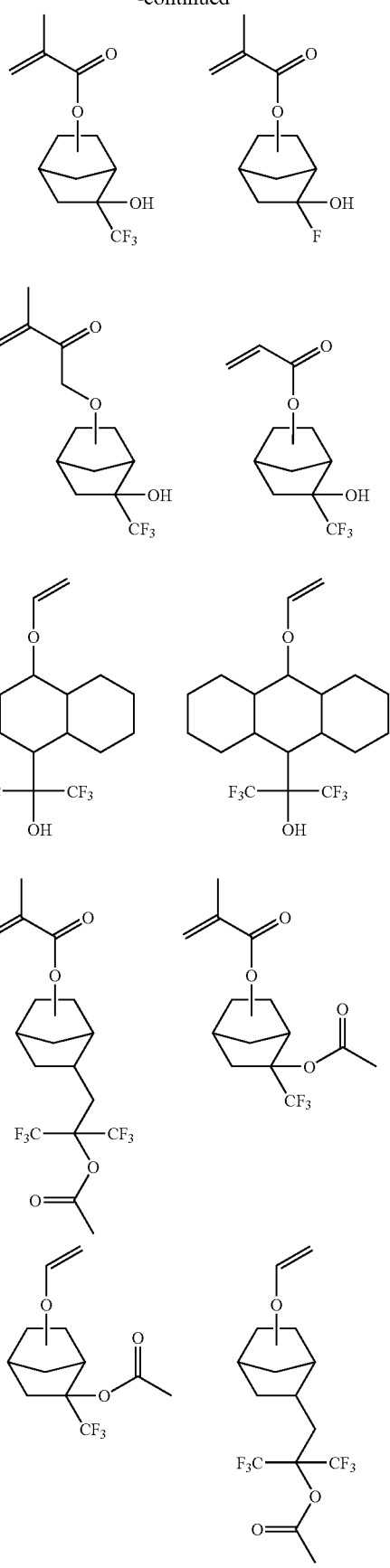

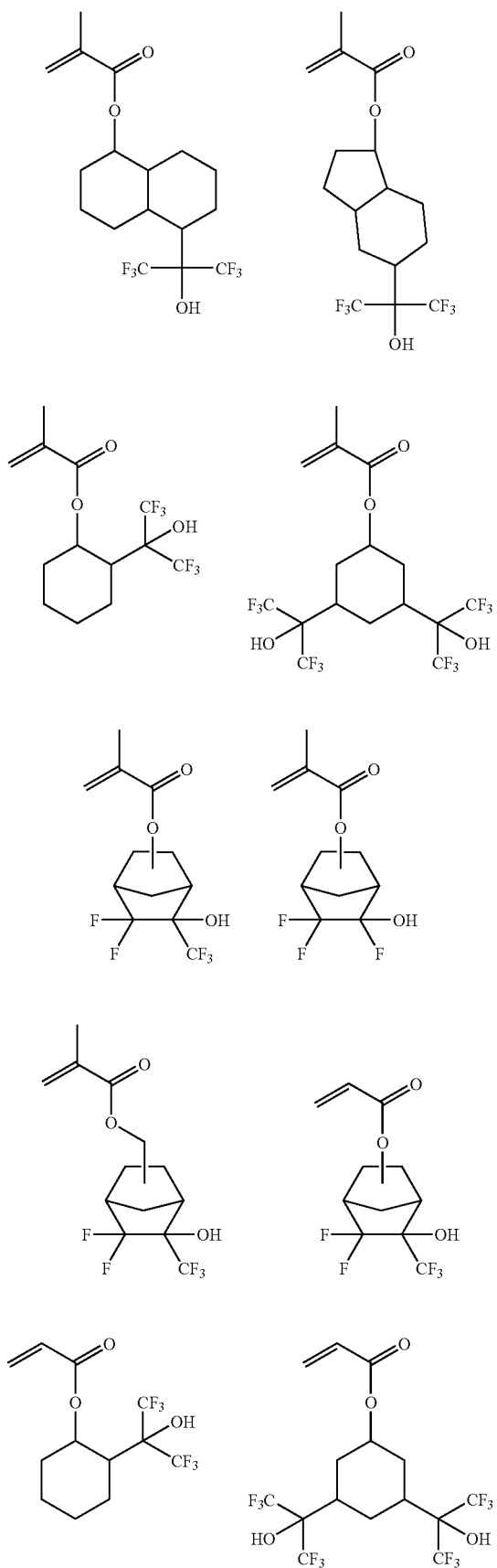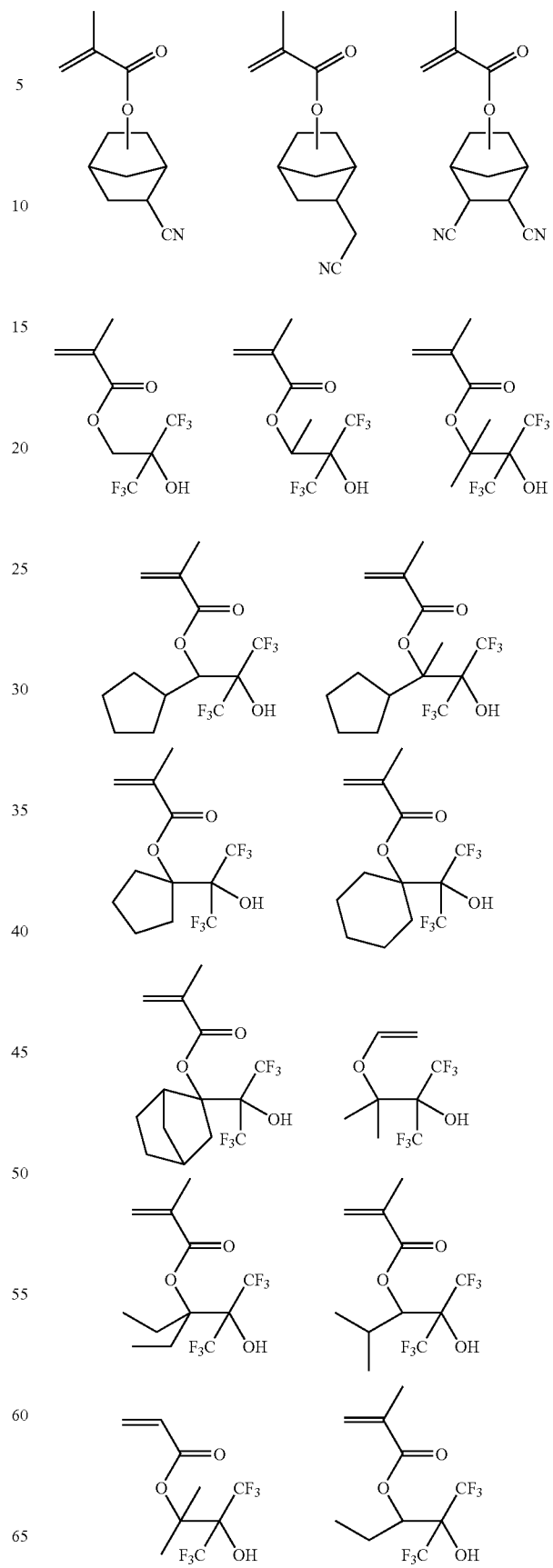

-continued
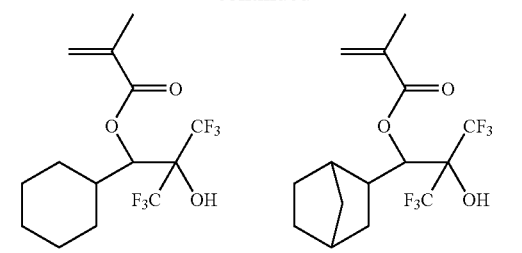
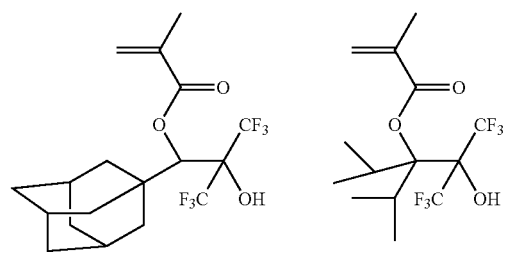
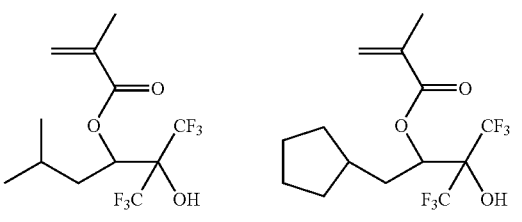
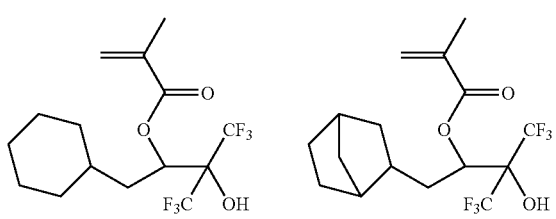
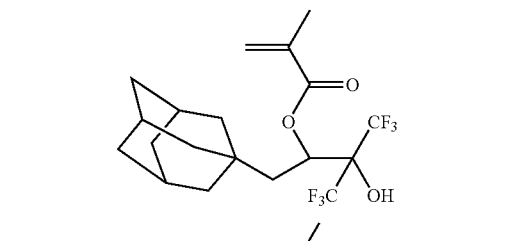
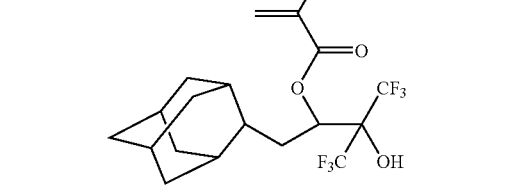
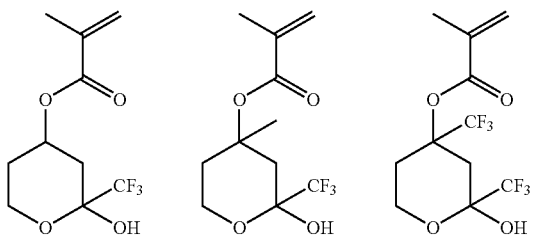
-continued
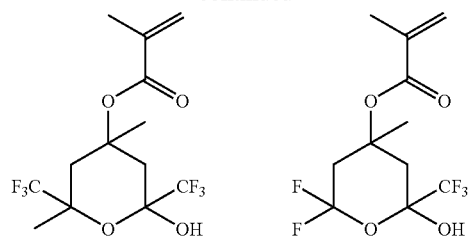
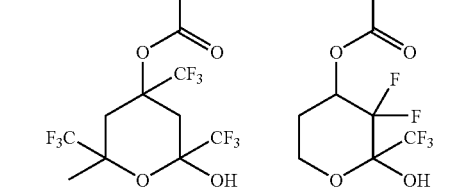
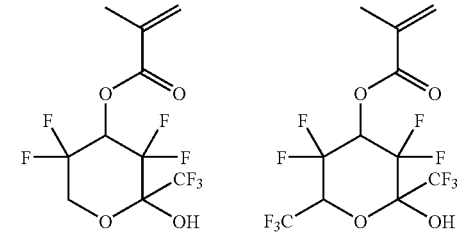
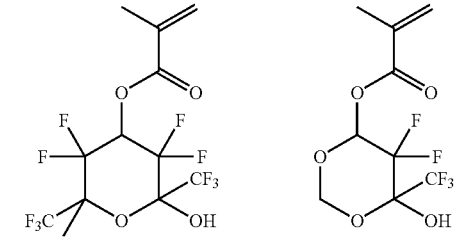
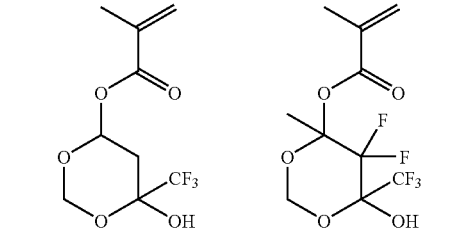
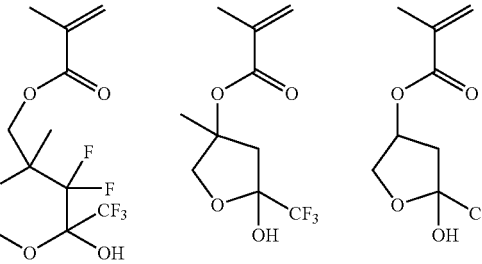
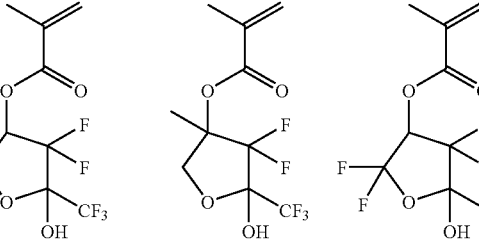

53
-continued
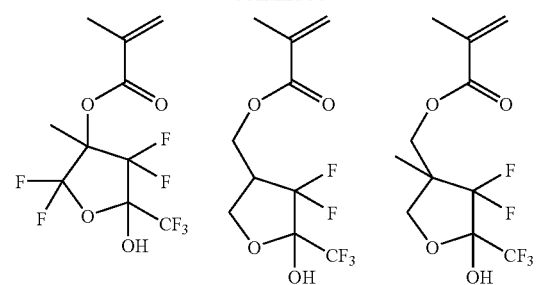
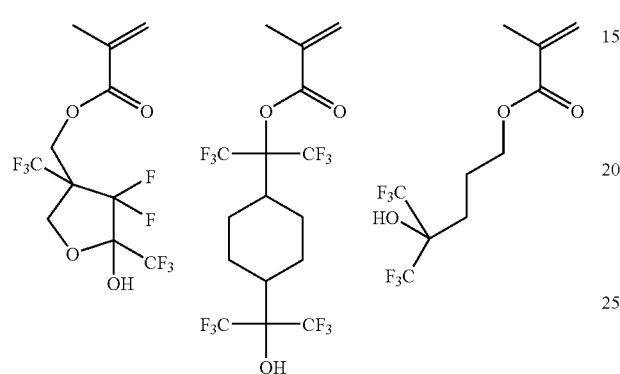
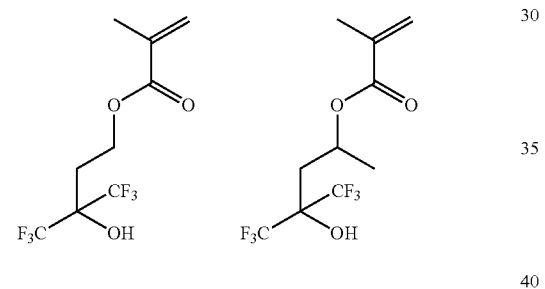
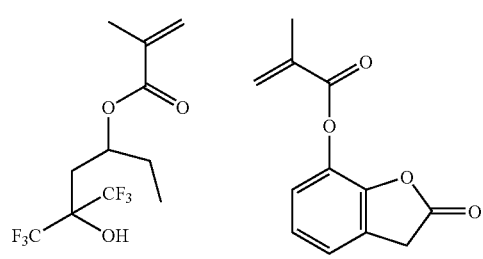
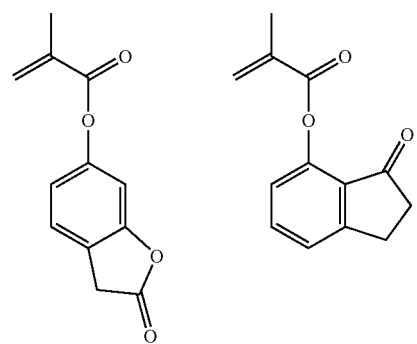
54
-continued
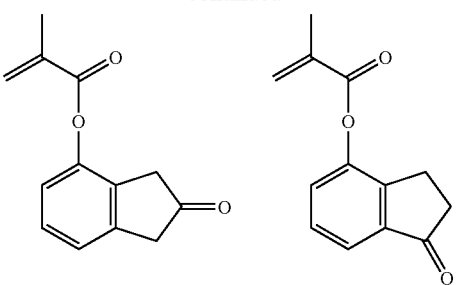
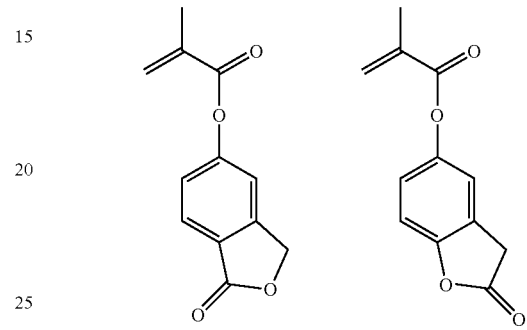
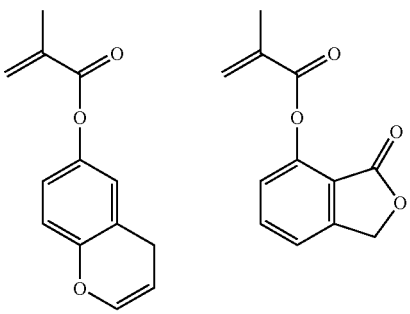
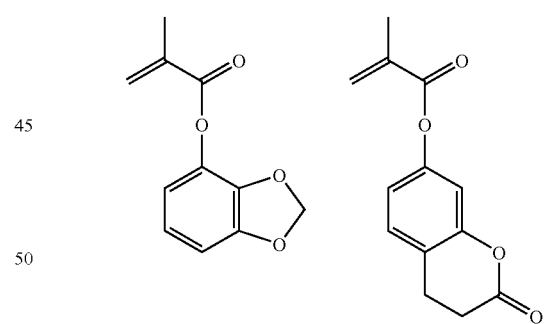
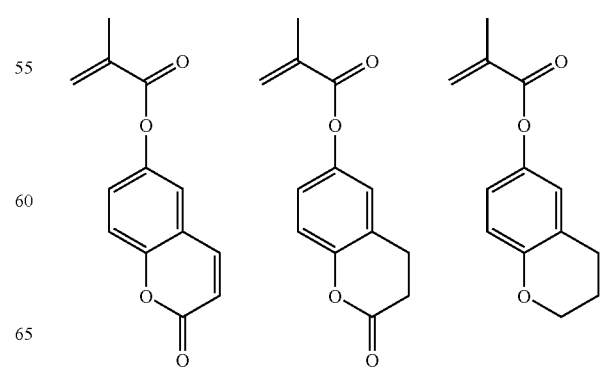

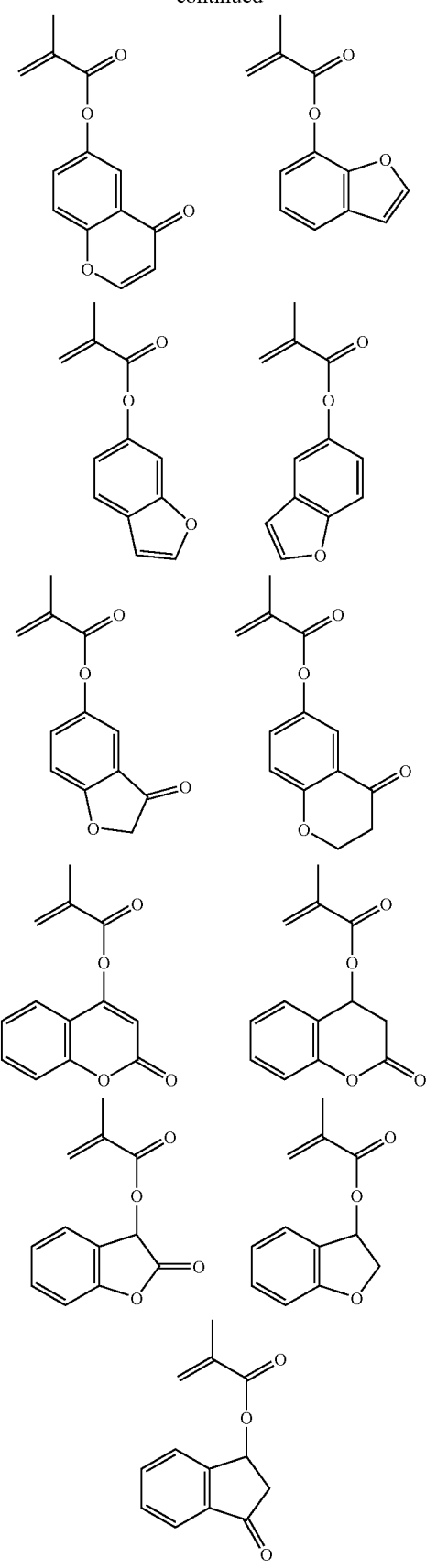
Of the recurring units (c), those having an α-trifluoromethyl alcohol group or carboxyl group are preferably incorporated in copolymers because they improve the alkali dissolution rate of the developed pattern after heating. Examples of recurring units having a carboxyl group are given below.
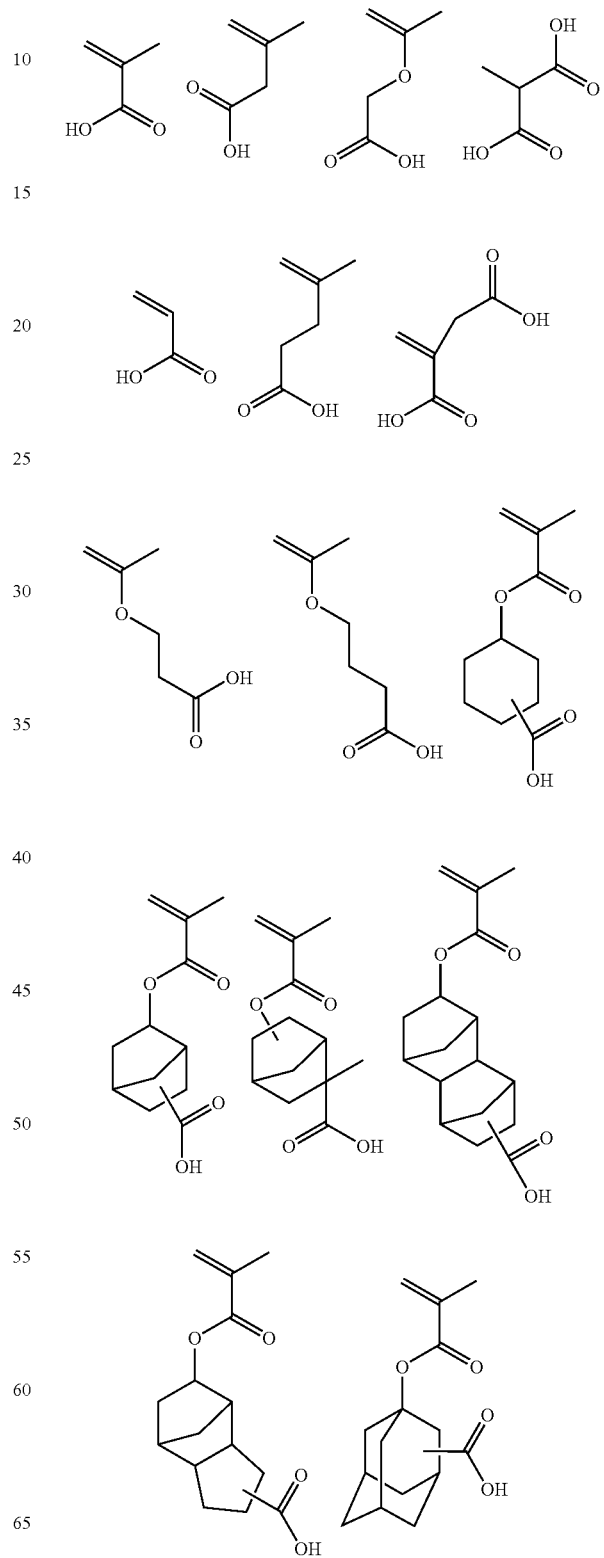

-continued

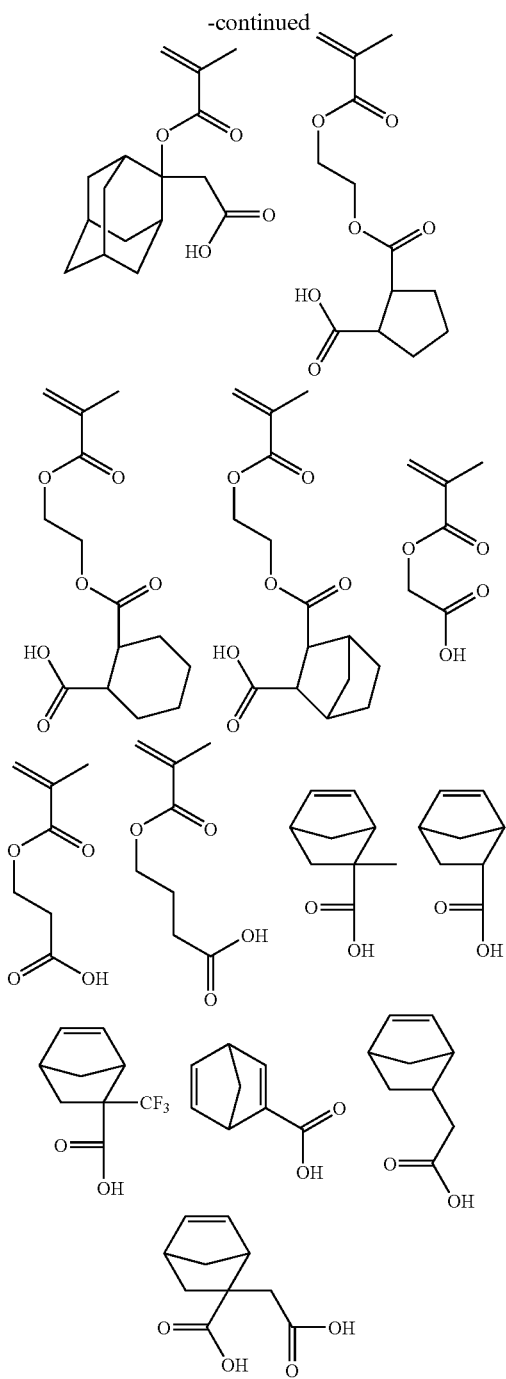

In the polymer of the invention, the recurring units (a), (b) and (c) are present in proportions a, b, and c, respectively, which satisfy the range: $0<a<1.0$, $0<b\leq0.8$, $0.1\leq a+b\leq1.0$, $0\leq c<1.0$, and preferably the range: $0.1\leq a\leq0.9$, $0.1\leq b\leq0.7$, $0.2\leq a+b\leq1.0$, and $0\leq c\leq0.9$, provided that $a+b+c=1$.

It is noted that the meaning of $a+b=1$ is that in a polymer comprising recurring units (a) and (b), the sum of recurring units (a) and (b) is 100 mol % based on the total amount of entire recurring units. The meaning of $a+b<1$ is that the sum of recurring units (a) and (b) is less than 100 mol % based on the total amount of entire recurring units, indicating the inclusion of other recurring units, for example, units (c).

The polymer serving as the base resin in the resist material used in the pattern forming process of the invention should preferably have a weight average molecular weight (Mw) in the range of 1,000 to 500,000, and more preferably 2,000 to 30,000, as measured by GPC using polystyrene standards. With too low a Mw, the efficiency of thermal crosslinking in the resist material after development may become low. With too high a Mw, the polymer may lose alkaline solubility and have more likelihood of footing after pattern formation.

If a polymer has a wide molecular weight distribution or dispersity (Mw/Mn), which indicates the presence of lower and higher molecular weight polymer fractions, there is a possibility that following exposure, foreign matter is left on the pattern or the pattern profile is degraded. The influences of molecular weight and dispersity become stronger as the pattern rule becomes finer. Therefore, the multi-component copolymer should preferably have a narrow dispersity (Mw/Mn) of 1.0 to 2.0, especially 1.0 to 1.5, in order to provide a resist composition suitable for micropatterning to a small feature size.

It is understood that a blend of two or more polymers which differ in compositional ratio, molecular weight or dispersity is acceptable.

The polymer as used herein may be synthesized by any desired method, for example, by dissolving unsaturated bond-containing monomers corresponding to the respective units (a), (b) and (c) in an organic solvent, adding a radical initiator thereto, and effecting heat polymerization. Examples of the organic solvent which can be used for polymerization include toluene, benzene, tetrahydrofuran, diethyl ether and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is 2 to 100 hours, preferably 5 to 20 hours. The acid labile group that has been incorporated in the monomers may be kept as such, or the acid labile group may be once eliminated with an acid catalyst and thereafter protected or partially protected.

As described previously, the pattern forming process of the invention comprises the steps of coating the positive resist composition described above onto a substrate, prebaking the resist composition to form a resist film, exposing a selected area of the resist film to high-energy radiation, post-exposure baking, and developing the resist film with an alkaline developer to dissolve the exposed area thereof to form a resist pattern such as a dot pattern. The subsequent step is to treat the resist pattern (area unexposed to high-energy radiation) so as to generate an acid, thereby eliminating acid labile groups on the polymer (i.e., deprotection) and inducing crosslinking to the polymer in the resist pattern. In this deprotected and crosslinked state, the polymer has a dissolution rate in excess of 2 nm/sec, preferably of 3 to 5,000 nm/sec, and more preferably 4 to 4,000 nm/sec in an alkaline developer. It is preferred in attaining the objects of the invention that the dissolution rate of the polymer is higher than the dissolution rate of the reversal film (to be described later) in the same alkaline developer by a factor of 2 to 250,000, and especially 5 to 10,000.

In order that the polymer have a desired dissolution rate in the deprotected and crosslinked state, the polymer formulation is preferably designed such that the acid labile group-bearing recurring units (b) of formula (2) account for 10 mol % to 90 mol %, and more preferably 12 mol % to 80 mol % of the entire recurring units.

The resist composition used in the pattern forming process of the invention may further comprise an organic solvent, a compound capable of generating an acid in response to high-energy radiation (known as "acid generator"), and optionally, a dissolution regulator, a basic compound, a surfactant, and other components.

The resist composition used herein may include an acid generator in order for the composition to function as a chemically amplified positive resist composition. Typical of the acid generator used herein is a photoacid generator (PAG) capable of generating an acid in response to actinic light or radiation. The PAG may preferably be compounded in an amount of 0.5 to 30 parts and more preferably 1 to 20 parts by weight per 100 parts by weight of the base resin. The PAG is any compound capable of generating an acid upon exposure to high-energy radiation. Suitable PAGs include sulfonium salts, iodonium salts, sulfonyldiazomethane, N-sulfonyloxyimide, and oxime-O-sulfonate acid generators. The PAGs may be used alone or in admixture of two or more. Exemplary acid generators are described in U.S. Pat. No. 7,537,880 (JP-A 2008-111103, paragraphs [0122] to [0142]).

The resist composition may further comprise one or more of an organic solvent, basic compound, dissolution regulator, surfactant, and acetylene alcohol. Their examples are described in JP-A 2008-111103. Specifically, exemplary organic solvents are described in paragraphs [0144] to [0145], exemplary basic compounds in paragraphs [0146] to [0164], and exemplary surfactants in paragraphs [0165] to [0166]. Exemplary dissolution regulators are described in JP-A 2008-122932 (US 2008090172), paragraphs [0155] to [0178], and exemplary acetylene alcohols in paragraphs [0179] to [0182]. The organic solvent may be added in an amount of 100 to 10,000 parts, and specifically 300 to 8,000 parts by weight per 100 parts by weight of the base resin. The basic compound may be added in an amount of 0.0001 to 30 parts, and specifically 0.001 to 20 parts by weight per 100 parts by weight of the base resin.

In an embodiment wherein a thermal acid generator in the form of an ammonium salt is added to the photoresist composition in an amount of 0.001 to 20 parts, preferably 0.01 to 10 parts by weight per 100 parts by weight of the base resin, an acid can be generated by heating. In this embodiment, acid generation, crosslinking reaction and deprotection reaction of acid labile groups proceed simultaneously. The preferred heating conditions include a temperature of 100 to 300° C., and especially 130 to 250° C., and a time of 10 to 300 seconds. This results in a resist film which meets the necessary properties for positive/negative reversal including alkaline solubility and solvent insolubility and has an increased mechanical strength sufficient to prevent deformation of the pattern by heating.

Suitable ammonium salts serving as the thermal acid generator include compounds of the formula (P1a-2).

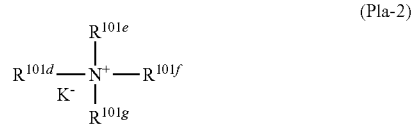

Herein $K^-$ is a sulfonate having at least one fluorine substituted at α-position, or perfluoroalkylimidate or perfluoroalkylmethidate. $R^{101d}$, $R^{101e}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_1$-$C_{12}$ aralkyl or aryloxoalkyl group, in which some or all hydrogen atoms may be substituted by alkoxy groups. Alternatively, $R^{101d}$ and $R^{101e}$, or $R^{101d}$, $R^{101e}$ and $R^{101f}$ may bond together to form a ring with the nitrogen atom to which they are attached, and each of $R^{101e}$ and $R^{101f}$ or each of $R^{101d}$, $R^{101e}$ and $R^{101f}$ is a $C_3$-$C_{10}$ alkylene group or a hetero-aromatic ring having incorporated therein the nitrogen atom when they form a ring.

Examples of $K^-$ include perfluoroalkanesulfonates such as triflate and nonaflate, imidates such as bis(trifluoromethylsulfonyl)imide, bis(perfluoroethylsulfonyl)imide, and bis(perfluorobutylsulfonyl)imide, methidates such as tris(trifluoromethylsulfonyl)methide and tris(perfluoroethylsulfonyl)methide, and sulfonates having fluorine substituted at α-position, represented by the formula (K-1), and sulfonates having fluorine substituted at α-position, represented by the formula (K-2).

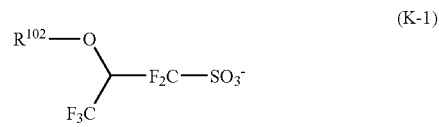

In formula (K-1), $R^{102}$ is hydrogen, a straight, branched or cyclic $C_1$-$C_{20}$ alkyl or acyl group, $C_2$-$C_{20}$ alkenyl group or $C_6$-$C_{20}$ aryl or aryloxy group, which may have an ether, ester, carbonyl radical or lactone ring and in which some or all hydrogen atoms may be substituted by fluorine atoms. In formula (K-2), $R^{103}$ is hydrogen, a straight, branched or cyclic $C_1$-$C_{20}$ alkyl group, $C_2$-$C_{20}$ alkenyl group or $C_6$-$C_{20}$ aryl group.

In a further embodiment, a polymeric additive comprising recurring units having amino and fluoroalkyl groups as represented by the general formula (3) may be added to the resist composition. The polymeric additive segregates toward the resist film surface after coating for eventually preventing a resist pattern as developed from slimming and enhancing the rectangularity thereof. If a dot pattern as developed is slimmed or thinned, such slimming may interfere with image reversal. Addition of a polymer as shown below is effective for preventing the pattern film from slimming. The polymeric additive may be added in an amount of 0.01 to 20 parts, preferably 0.1 to 15 parts by weight per 100 parts by weight of the base resin.

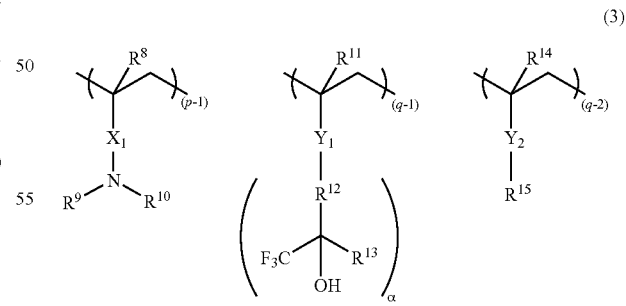

Herein, $R^8$, and $R^{11}$ are each independently hydrogen or methyl. $X_1$, $Y_1$ and $Y_2$ are each independently a single bond, —O—$R^{16}$—, —C(=O)—O—$R^{16}$— or —C(=O)—NH—$R^{16}$—, straight or branched $C_1$-$C_4$ alkylene, or phenylene group. $R^{16}$ is a straight, branched or cyclic $C_1$-$C_{10}$ alkyl group, which may contain an ester (—COO—) or ether (—O—) radical. The subscript α is 1 or 2. In case of α=1, $Y_1$ is a single bond, —O—R$^{16}$—, —C(=O)—O—R$^{16}$— or —C(=O)—NH—R$^{16}$—, straight or branched C$_1$-C$_4$ alkylene, or phenylene group, wherein R$^{16}$ is as defined above. In case of α=2, Y$_1$ is —O—R$^{17}$=, —C(=O)—O—R$^{17}$= or —C(=O)—NH—R$^{17}$=, straight or branched C$_1$-C$_4$ alkylene group with one hydrogen eliminated, or phenylene group with one hydrogen eliminated, wherein R$^{17}$ is a straight, branched or cyclic C$_1$-C$_{10}$ alkylene group with one hydrogen atom eliminated, which may contain an ester or ether radical. R$^9$ and R$^{10}$ are each independently hydrogen, a straight, branched or cyclic C$_1$-C$_{20}$ alkyl group or C$_2$-C$_{20}$ alkenyl group which may contain a hydroxyl, ether, ester, cyano, amino radical, double bond, or halogen atom, or a C$_6$-C$_{10}$ aryl group. R$^9$ and R$^{10}$ may bond together to form a C$_3$-C$_{20}$ ring with the nitrogen atom to which they are attached. R$^{12}$ is a straight, branched or cyclic C$_1$-C$_{12}$ alkylene group. R$^{13}$ is hydrogen, fluorine, methyl, trifluoromethyl or difluoromethyl, or R$^{13}$ may bond with R$^{12}$ to form a C$_2$-C$_{12}$ aliphatic ring with the carbon atom to which they are attached, which ring may contain an ether radical, fluorinated alkylene or trifluoromethyl radical. R$^{15}$ is a straight, branched or cyclic C$_1$-C$_{20}$ alkyl group which is substituted with at least one fluorine atom and which may contain an ether, ester or sulfonamide radical. The subscripts p-1, q-1, and q-2 are numbers in the range: $0<(p-1)<1.0$, $0\leq(q-1)<1.0$, $0\leq(q-2)<1.0$, $0<(q-1)+(q-2)<1.0$, and $0.5\leq(p-1)+(q-1)+(q-2)\leq1.0$.

Reversal Film

On the other hand, the reversal film used has a dissolution rate of 0.02 nm/sec to 2 nm/sec, preferably 0.05 nm/sec to 1 nm/sec in an alkaline developer used in the reversal step of the inventive process. A dissolution rate of less than 0.02 nm/sec suggests that the reversal film may not be dissolved to the top level of the first resist pattern, resulting in a failure of pattern reversal or a surface layer of the reversed pattern becoming bulged. A dissolution rate of more than 2 nm/sec may lead to the disadvantage that the remaining reversal film is lessened or the hole size of the reversal pattern is enlarged.

In order that the film surface be adequately dissolved during development to form a trench pattern, the alkaline dissolution rate is controlled to a range of 0.05 nm/sec to i nm/sec. Outside the range, a faster dissolution rate may lead to a greater film slimming during development. At a slower dissolution rate, the film surface may not be dissolved, failing to configure a trench pattern. For the purpose of tailoring to an appropriate dissolution rate, units providing an alkaline dissolution rate of at least 1 nm/sec and units providing an alkaline dissolution rate of up to 0.05 nm/sec are copolymerized. Optimizing the copolymerization ratio leads to a material having an optimum dissolution rate.

The film (reversal film) used in the pattern forming process and having a dissolution rate of 0.02 nm/sec to 2 nm/sec in the alkaline developer may be formed of hydrocarbon base materials or silicon-containing materials. Preferably used are materials comprising polymers having phenolic hydroxyl, α-trifluoromethylhydroxyl and carboxyl groups as the base polymer. The preferred silicon-containing materials are those having silanol groups as well as the foregoing alkali soluble groups. Examples of the polymers having phenolic hydroxyl groups include cresol novolac resins, phenol oligomers, bisphenol oligomers, bisphenol novolac resins, bisnaphthol oligomers, bisnaphthol novolac resins, calixarene, calix resorcinol, polyhydroxystyrene, polyhydroxyvinylnaphthalene, polyhydroxyindene and copolymers thereof, carboxystyrene polymers, carboxyvinylnaphthalene and copolymers thereof, α-trifluoromethylhydroxy-containing styrene polymers and copolymers, methacrylic acid and carboxyl-containing (meth)acrylate polymers and copolymers, α-trifluoromethylhydroxy-containing (meth)acrylate polymers and copolymers.

Since most polymers consisting of recurring units having phenolic hydroxyl, α-trifluoromethylhydroxyl and carboxyl groups have an alkaline dissolution rate of at least 1 nm/sec, they are copolymerized with units providing an alkaline dissolution rate of up to 0.05 nm. Examples of suitable units providing an alkaline dissolution rate of up to 0.05 nm include those in which the hydrogen atom of phenolic hydroxyl, α-trifluoromethylhydroxyl or hydroxyl moiety of carboxyl group is replaced by a C$_1$-C$_{20}$ alkyl, C$_3$-C$_{20}$ alkenyl, C$_6$-C$_{20}$ aryl or acid labile group. Also included are styrene, indene, indole, chromone, coumarone, acenaphthylene, norbornadiene, norbornene, vinylnaphthalene, vinylanthracene, vinylcarbazole, vinyl ether derivatives, lactone-containing (meth)acrylates, and hydroxy-containing (meth)acrylates.

More specifically, reactants from which the polymer for use in the reversal film is prepared should have alkali soluble groups such as phenolic hydroxyl, α-trifluoromethylhydroxyl and carboxyl groups. Partial protection of alkali soluble groups or combination thereof with substantially alkali insoluble groups is sometimes necessary to tailor the alkaline dissolution rate.

Suitable polymers having a phenolic hydroxyl group include those novolac resins obtained by reaction of phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethylphenol, 3,4,5-trimethylphenol, 2-t-butylphenol, 3-t-butylphenol, 4-t-butylphenol, resorcinol, 2-methylresorcinol, 4-methylresorcinol, 5-methylresorcinol, catechol, 4-t-butylcatechol, 2-methoxyphenol, 3-methoxyphenol, 2-propylphenol, 3-propylphenol, 4-propylphenol, 2-isopropylphenol, 3-isopropylphenol, 4-isopropylphenol, 2-methoxy-5-methylphenol, 2-t-butyl-5-methylphenol, pyrogallol, thymol, isothymol, or the like, in the presence of aldehydes. Polymers of polymerizable olefin compounds having a phenolic hydroxyl group include polymers of hydroxystyrene, hydroxyvinylnaphthalene, hydroxyvinylanthracene, hydroxyindene, hydroxyacenaphthylene, and the monomers shown below.

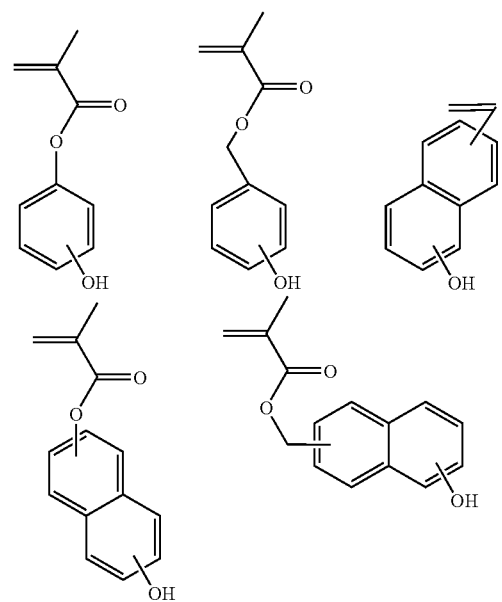

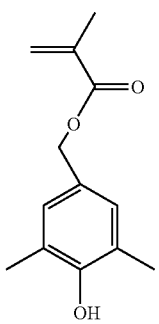

Polymers of monomers from which carboxyl-bearing recurring units are derived may also be used as the material for forming the reversal film. Examples of the monomers are shown below.

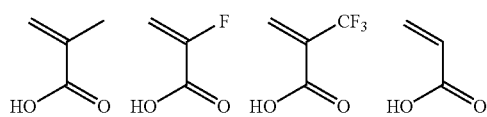

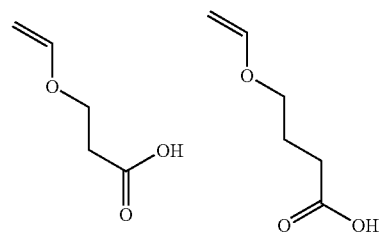

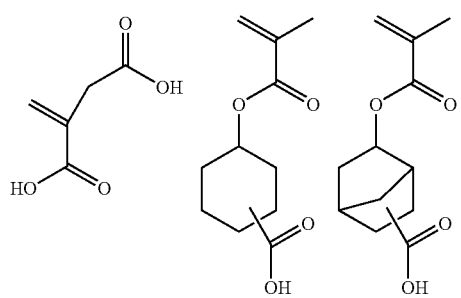

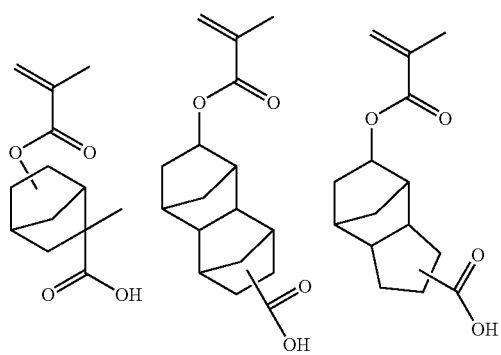

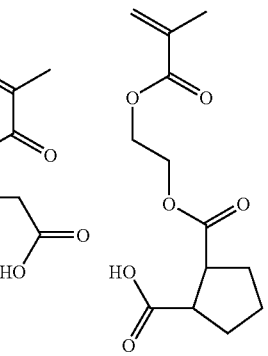

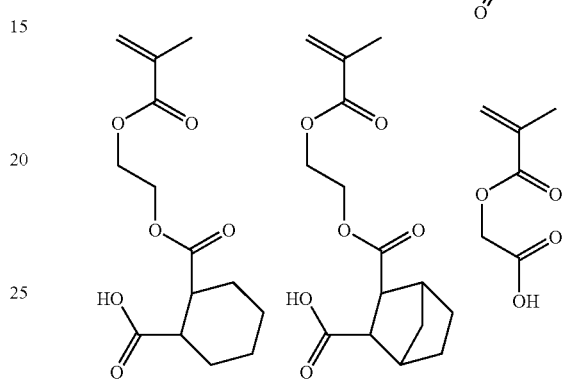

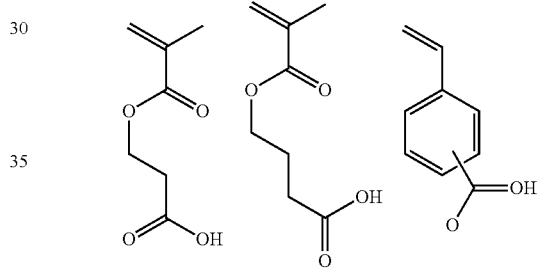

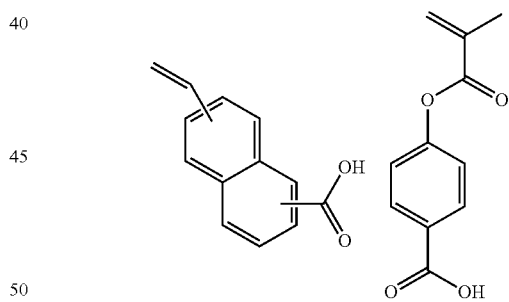

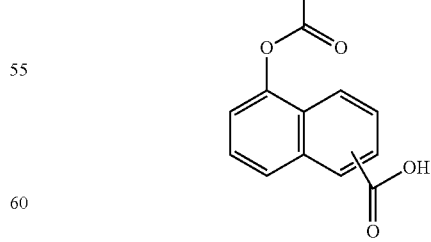

For partial protection of phenolic hydroxyl or carboxyl groups for the purpose of tailoring the alkaline dissolution rate, the hydrogen atom of the hydroxyl group or hydroxyl moiety of the carboxyl group is preferably replaced by a $C_1$-$C_{20}$ alkyl, $C_2$-$C_{20}$ alkenyl, $C_6$-$C_{20}$ aryl, acetyl, pivaloyl or acid labile group. The acid labile group used herein may be the same as described above.

For the purpose of tailoring the alkaline dissolution rate, substantially alkali insoluble recurring units may also be copolymerized. Examples of the substantially alkali insoluble recurring units include recurring units derived from alkyl or aryl (meth)acrylates, hydroxyl or lactone-bearing (meth)acrylates, styrene, vinylnaphthalene, vinylanthracene, vinylpyrene, vinylcarbazole, indene, acenaphthylene, norbornenes, norbornadienes, tricyclodecenes, and tetracyclododecenes.

The preferred base polymers from which the reversal film is formed are hydrocarbon polymers, especially polymers comprising aromatic group-bearing hydrocarbons. As the silicon-containing material for use in the reversal film-forming composition, silicon polymers based on silsesquioxane are preferred from the standpoint of etch resistance. Among others, those compounds having a phenolic hydroxyl group-containing aromatic group have the advantage that a hole pattern after pattern reversal is easily shrinkable by thermal flow or by coating a shrinking agent on the hole pattern and baking to induce surface crosslinking reaction.

According to the invention, a methacrylate base resist material featuring a high resolution capability is processed by ArF excimer laser featuring a short wavelength to form a dot pattern. A hole pattern of a phenol base material is formed by image reversal of the dot pattern. The phenol base material undergoes a substantial quantity of shrinkage by the thermal flow or RELACS method. As a consequence, a finer hole pattern can advantageously be formed.

The base polymer should preferably have a weight average molecular weight (Mw) of 1,000 to 200,000, and more preferably 1,500 to 100,000, as measured by GPC versus polystyrene standards. Also it should preferably have a dispersity (Mw/Mn) of 1.0 to 7.0, and more preferably 1.02 to 5.0.

Where the hole pattern following image reversal is heat shrunk, i.e., in the case of thermal flow shrinkage, a larger quantity of shrinkage per heating time may make dimensional control difficult. When thermal flow is applied to a positive resist material, it is under investigation to add a vinyl ether crosslinker to the positive resist material in order to reduce the shrinkage quantity as described in JP-A 2001-142199. A positive resist material utilizing the mechanism that a vinyl ether crosslinker is capable of crosslinking reaction with a phenolic resin is described in JP 2668609. Since the reversal film-forming material used in the pattern forming process of the invention is not intended to form a pattern by exposure, positive addition of a crosslinker is effective for controlling the shrinkage quantity. In the photoresist film after development, the amount of fog light differs between dense pattern and isolated pattern regions, and hence, the amount of acid labile groups deprotected differs therebetween. As the amount of deprotection increases, the proportion of hydroxyl or carboxyl groups increases, and hence, the amount of hydrogen bonds increases, leading to a higher glass transition temperature (Tg) and less thermal flow. Dense pattern region is accompanied with more fog light, leading to more deprotection, higher Tg, and less thermal flow. The inventive process has the advantage of avoiding the phenomenon that the quantity of shrinkage differs between dense pattern and isolated pattern regions since the reversal film is not subjected to light exposure.

The pattern reversal film-forming composition may comprises a crosslinker. Examples of the crosslinker include melamine compounds, guanamine compounds, glycoluril compounds and urea compounds having substituted thereon at least one group selected from among methylol, alkoxymethyl and acyloxymethyl groups, epoxy compounds, isocyanate compounds, azido compounds, and compounds having a double bond such as an alkenyl ether group. These compounds may be used as an additive or introduced as pendant groups on polymer side chains. Compounds having a hydroxy group are also useful as the crosslinker.

Of the crosslinkers, examples of suitable epoxy compounds include tris(2,3-epoxypropyl)isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Examples of the isocyanate compound include tolylene diisocyanate, diphenylmethane diisocyanate, hexamethylene diisocyanate, and cyclohexane diisocyanate. Examples of the azide compound include 1,1'-biphenyl-4,4'-bisazide, 4,4'-methylidenebisazide, and 4,4'-oxybisazide.

Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether. With respect to the alkenyl ether, JP-A 2001-142199 and JP 2668609 describe many compounds having more than one alkenyl ether within the molecule, which may also be used herein.

An acid generator may be added in order to accelerate crosslinking. A suitable acid generator may be selected from the foregoing acid generators which may be added to the photoresist material. Where a reversal film-forming material having phenolic hydroxyl groups is used, an onium salt is effective for inhibiting the alkaline solubility of phenolic hydroxyl groups. Then a sulfonium or iodonium salt may be added for tailoring the alkaline dissolution rate.

An amount of the crosslinker compounded may be 0 to 100 parts, preferably 0 to 50 parts by weight per 100 parts by weight of the base polymer. An amount of the acid generator compounded may be 0 to 50 parts, preferably 0 to 30 parts by weight per 100 parts by weight of the base polymer.

In addition to the base polymer described above, the reversal film-forming composition may comprise a scarcely alkali soluble material for pattern reversal, an alkali soluble surfactant for enhancing a surface alkali dissolution rate, an alkali soluble etching resistance improver, a basic quencher, an organic solvent and the like.

Examples of the scarcely alkali soluble material for pattern reversal include fullerenes having phenol group or malonic acid substituted thereon and oligomeric phenol compounds. These materials have a high carbon density and the function of improving etching resistance as well. Pattern reversal materials may be used alone or in a blend of two or more.

Examples of suitable materials include the phenolic compounds described in JP-A 2006-259249, JP-A 2006-259482, JP-A 2006-285095, and JP-A 2006-293298, the bisnaphthol compounds described in JP-A 2007-199653, and fluorene compounds having a phenol group, including 4,4'-(9H-fluoren-9-ylidene)bisphenol, 2,2'-dimethyl-4,4'-(9H-fluoren-9-ylidene)bisphenol, 2,2'-diallyl-4,4'-(9H-fluoren-9-ylidene)bisphenol, 2,2'-difluoro-4,4'-(9H-fluoren-9-ylidene)bisphenol, 2,2'-diphenyl-4,4'-(9H-fluoren-9-ylidene)bisphenol, 2,2'-dimethoxy-4,4'-(9H-fluoren-9-ylidene)bisphenol, tetrahydrospirobiindene compounds, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, tritylphenol, etc. These materials may be used as the alkali soluble etching resistance improver.

The above material is preferably added in an amount of 0 to 200 parts, and more preferably 0 to 100 parts by weight per 100 parts by weight of the base polymer. When added, the amount of the material is at least 1 phr, and more preferably at least 5 phr.

Enhancing the alkali solubility of only a surface layer of the pattern reversal film is advantageous for smoothing dissolution of the pattern reversal film building up over the positive resist pattern which has been altered to be alkali soluble, and for enhancing the dimensional control of a trench pattern or hole pattern converted from the positive pattern. To enhance the surface alkali solubility, an alkali soluble surfactant, especially fluorochemical surfactant may be added. The preferred fluorochemical surfactants are those comprising either one or both of recurring units (s-1) and (s-2) represented by the general formula (4).

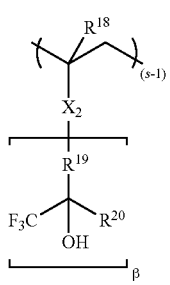
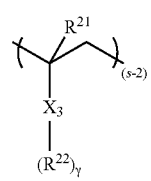
(4)

Herein, $R^{18}$ and $R^{21}$ are each independently hydrogen or methyl. The letter $\beta$ is equal to 1 or 2. In case of $\beta=1$, $X_2$ is a phenylene group, —O—, —C(=O)—O—$R^{23}$—, or —C(=O)—NH—$R^{23}$— wherein $R^{23}$ is a single bond or a straight or branched $C_1$-$C_4$ alkylene group which may have an ester or ether radical. In case of $\beta=2$, $X_2$ is a phenylene group with one hydrogen atom eliminated (represented by —$C_6H_3$—), or —C(=O)—O—$R^{24}$= or —C(=O)—NH—$R^{24}$= wherein $R^{24}$ is a straight, branched or cyclic $C_1$-$C_{10}$ alkylene group with one hydrogen atom eliminated, which may have an ester or ether radical. $R^{19}$ is a single bond or a straight, branched or cyclic $C_1$-$C_{12}$ alkylene group. $R^{20}$ is hydrogen, fluorine, methyl, trifluoromethyl or difluoromethyl, or $R^{20}$ and $R^{19}$ may bond together to form a ring of 3 to 10 carbon atoms (exclusive of aromatic ring) with the carbon atom to which they are attached, which ring may have an ether, fluorinated alkylene or trifluoromethyl radical. $X_3$ is a phenylene group, —O—, —C(=O)—O—$R^{25}$—, or —C(=O)—NH—$R^{25}$— wherein $R^{25}$ is a single bond or a straight or branched $C_1$-$C_4$ alkylene group which may have an ester or ether radical. $R^{22}$ is fluorine or a straight, branched or cyclic $C_1$-$C_{20}$ alkyl group which is substituted with at least one fluorine atom and which may have an ether, ester or sulfonamide radical. The letter $\gamma$ is an integer of 1 to 5 when $X_3$ is phenylene, and $\gamma$ is 1 when $X_3$ is otherwise.

Examples of the monomers from which units (s-1) in formula (4) are derived are illustrated below.

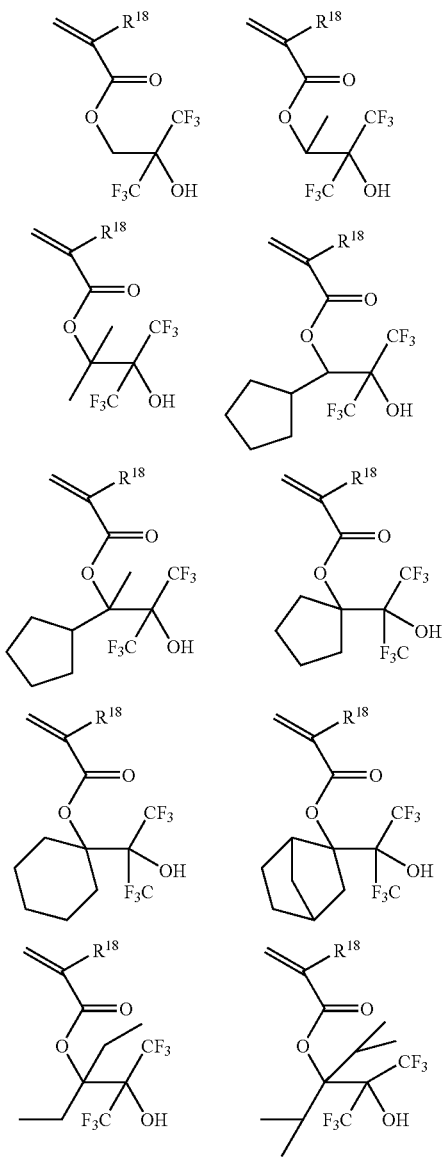

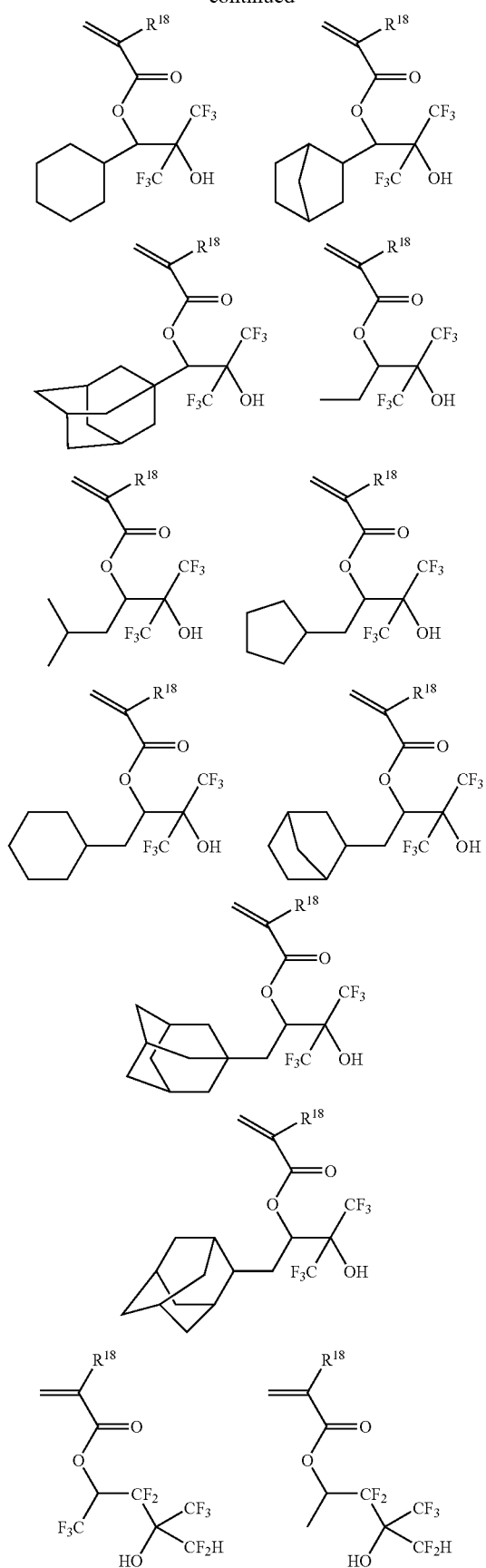
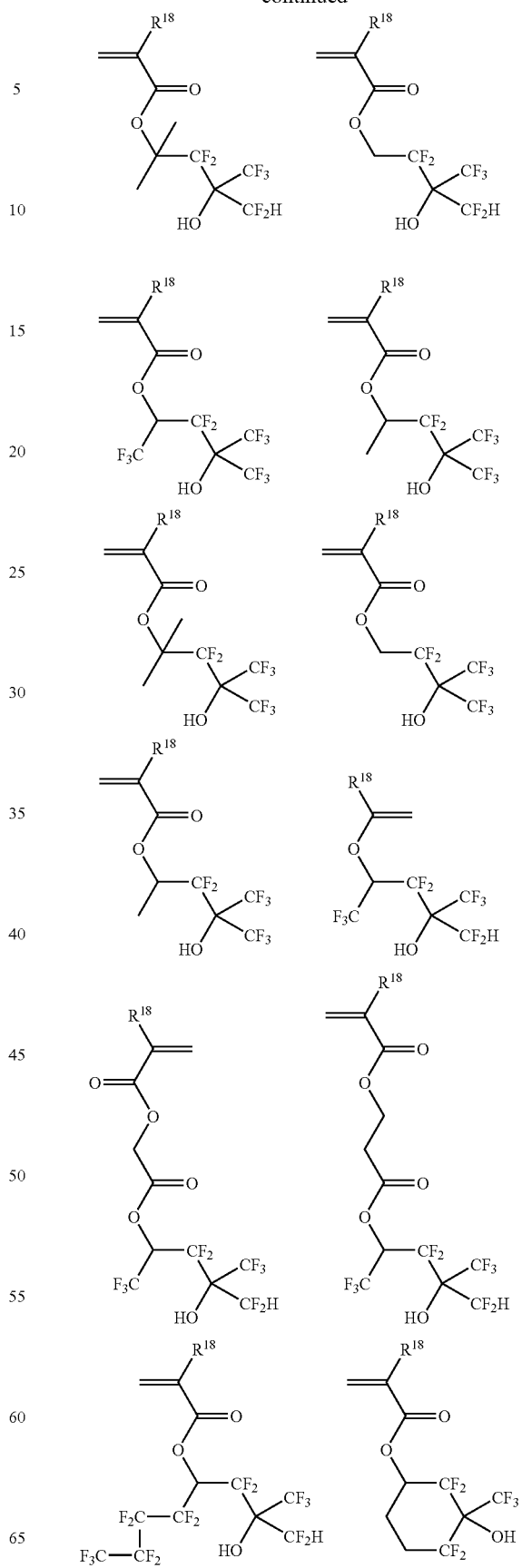

-continued
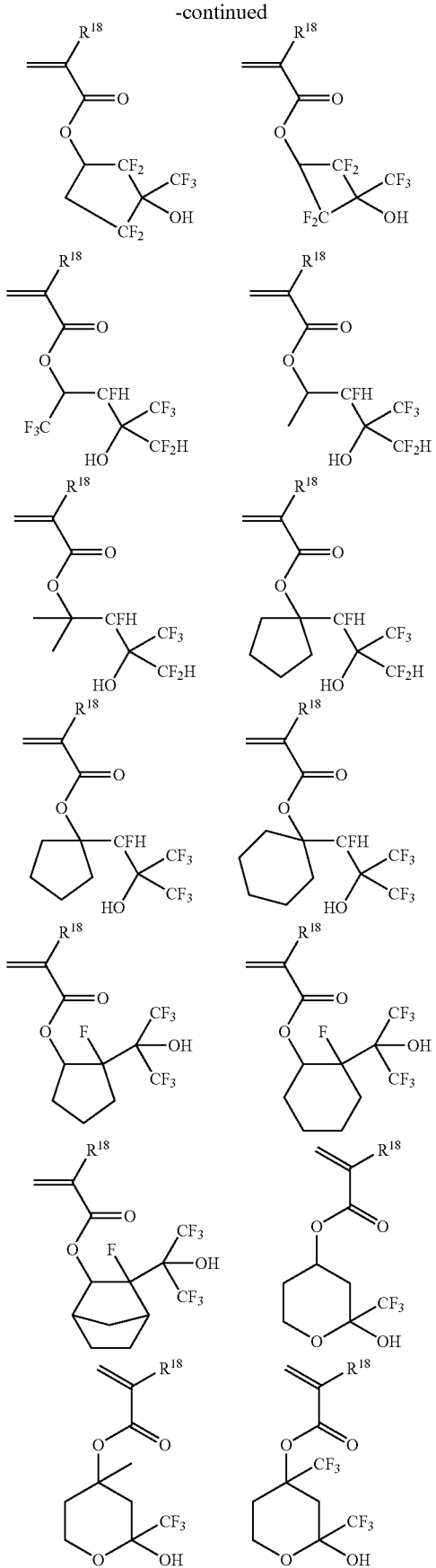
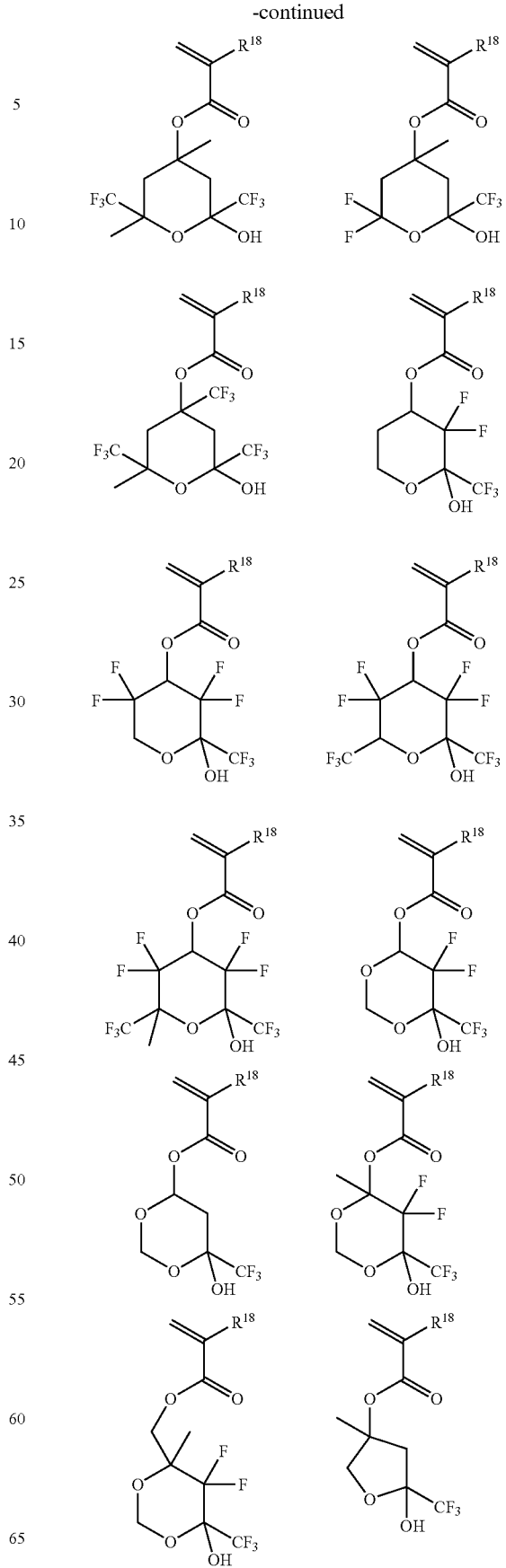

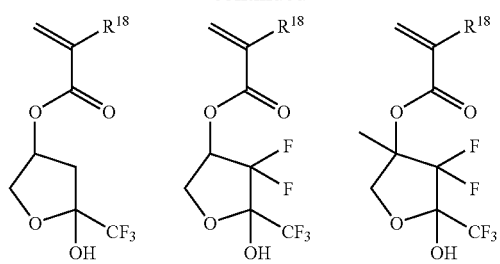
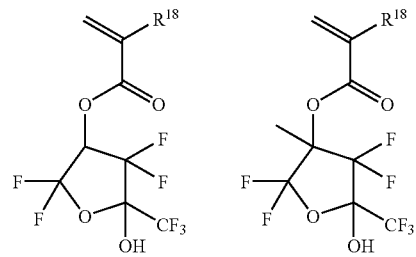
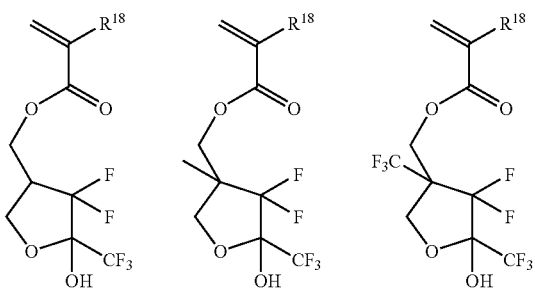
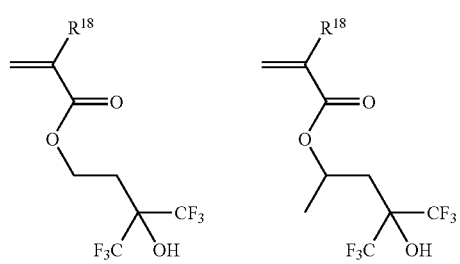
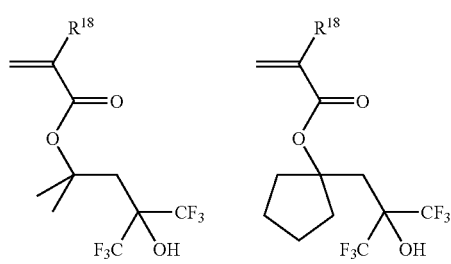
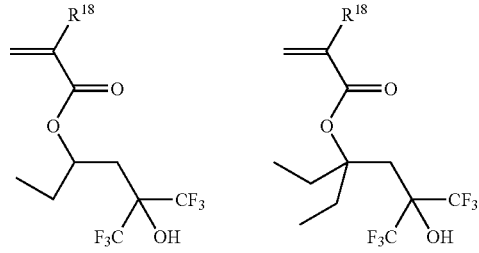
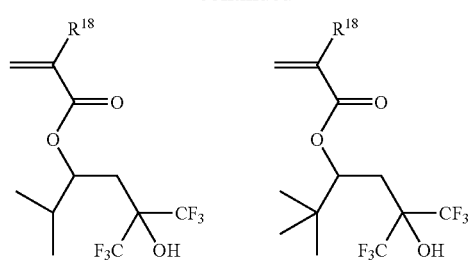
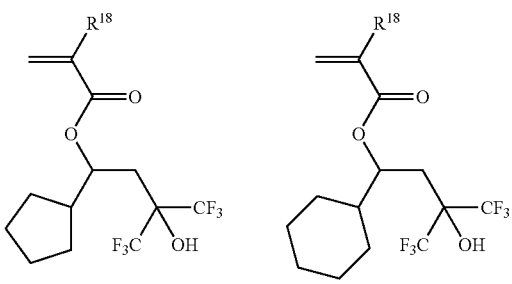
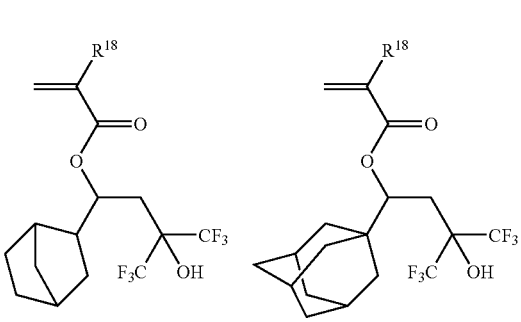
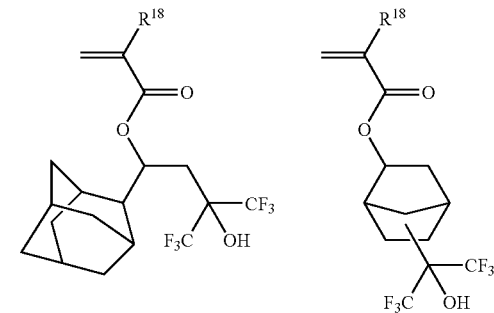
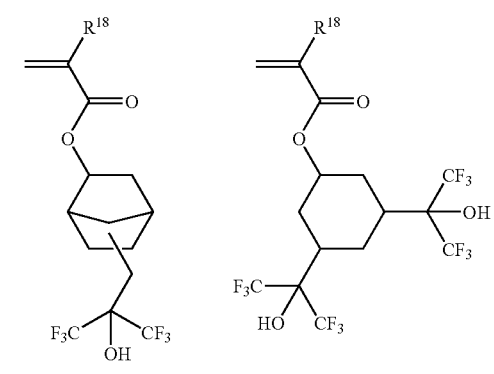

-continued
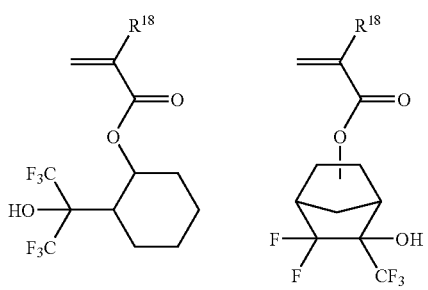
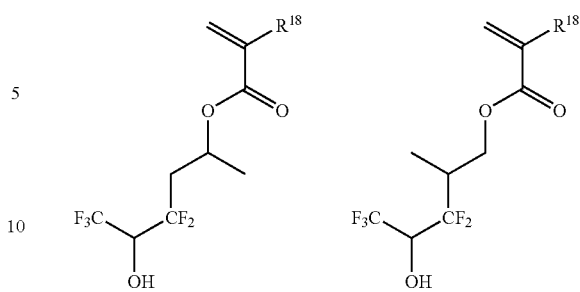
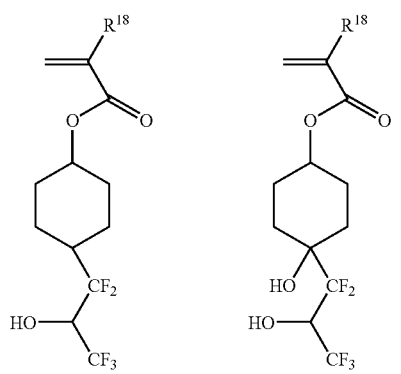
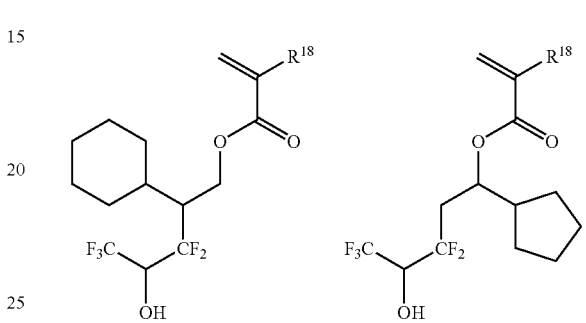
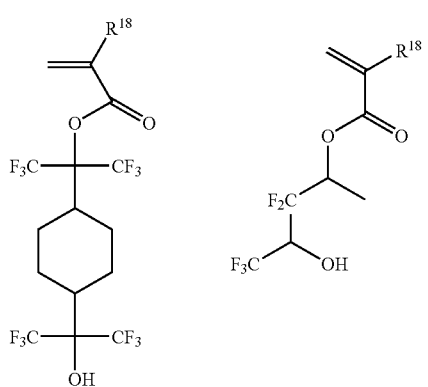
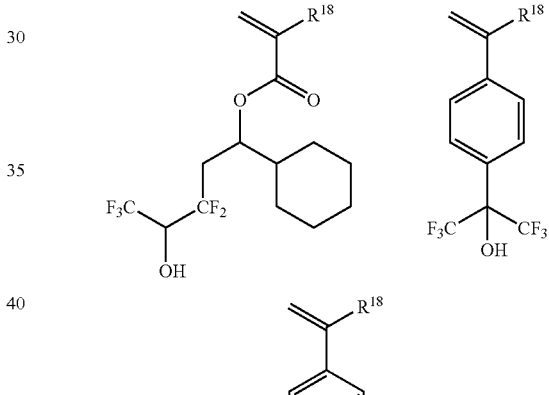
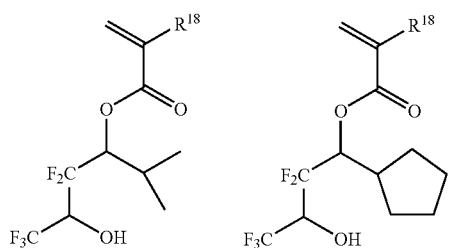
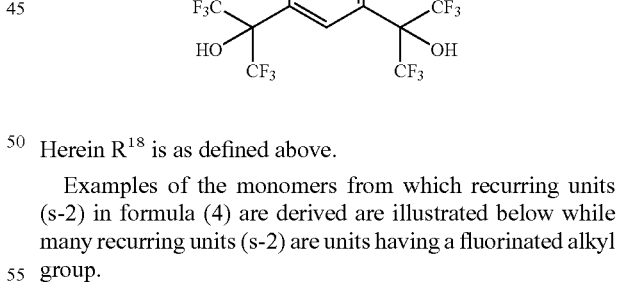
Herein $R^{18}$ is as defined above.
Examples of the monomers from which recurring units (s-2) in formula (4) are derived are illustrated below while many recurring units (s-2) are units having a fluorinated alkyl group.
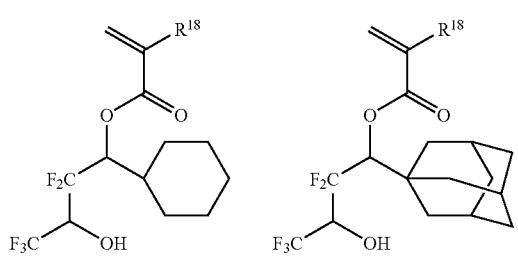
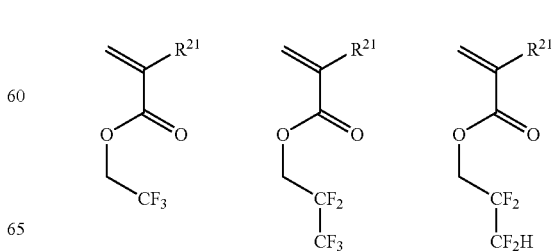

77
-continued
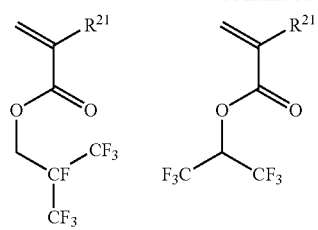
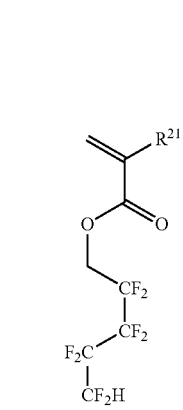
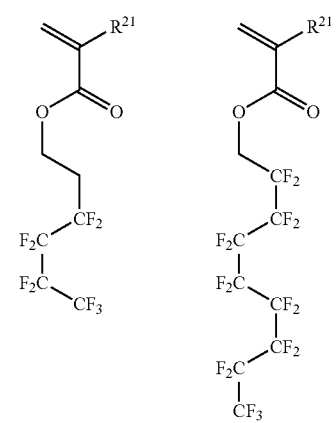
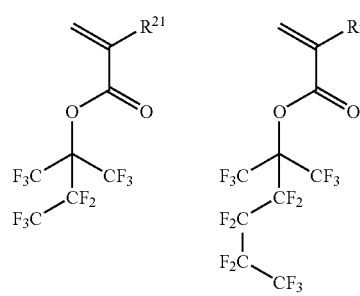
78
-continued
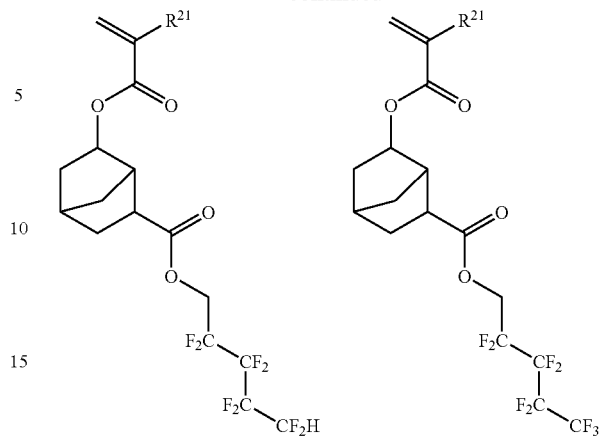
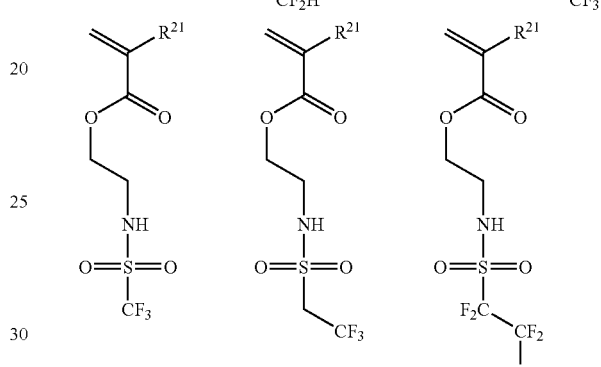
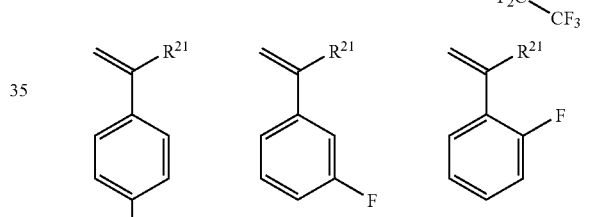
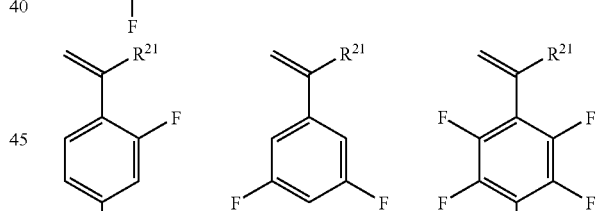
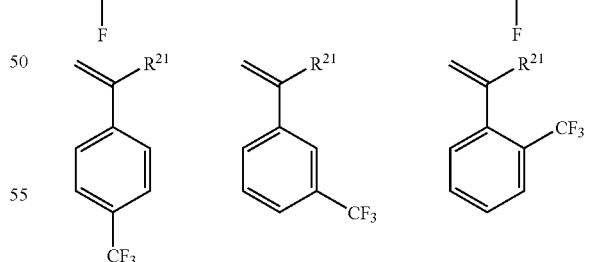
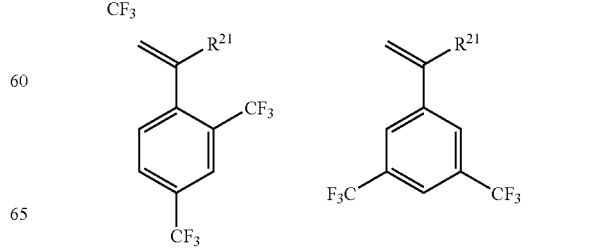

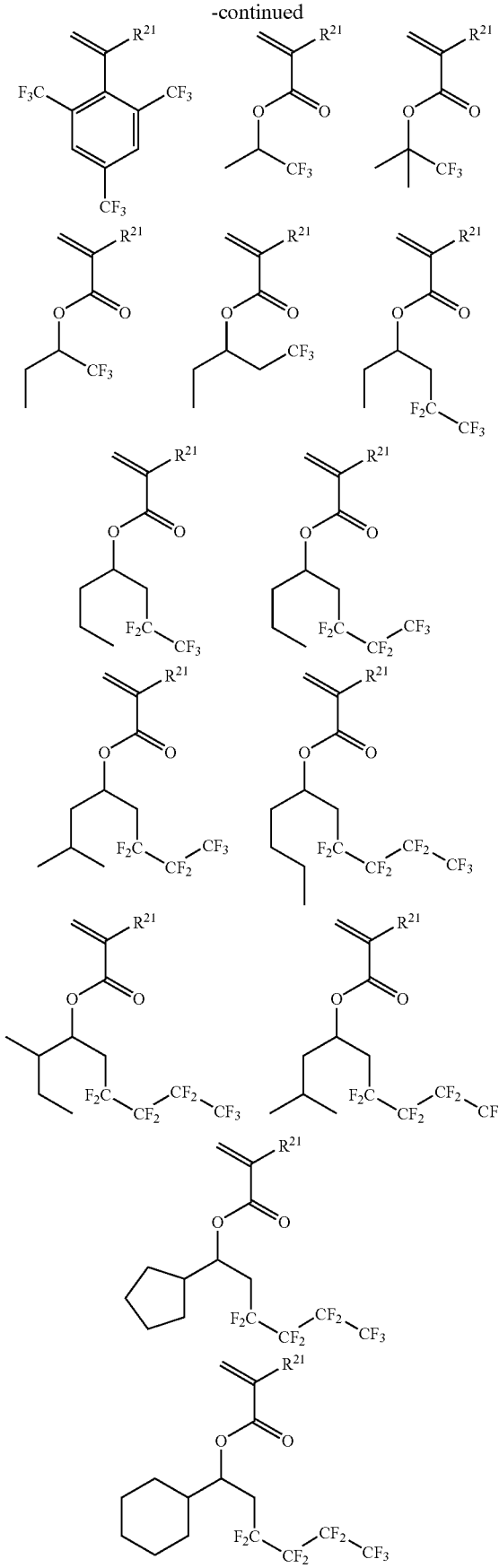
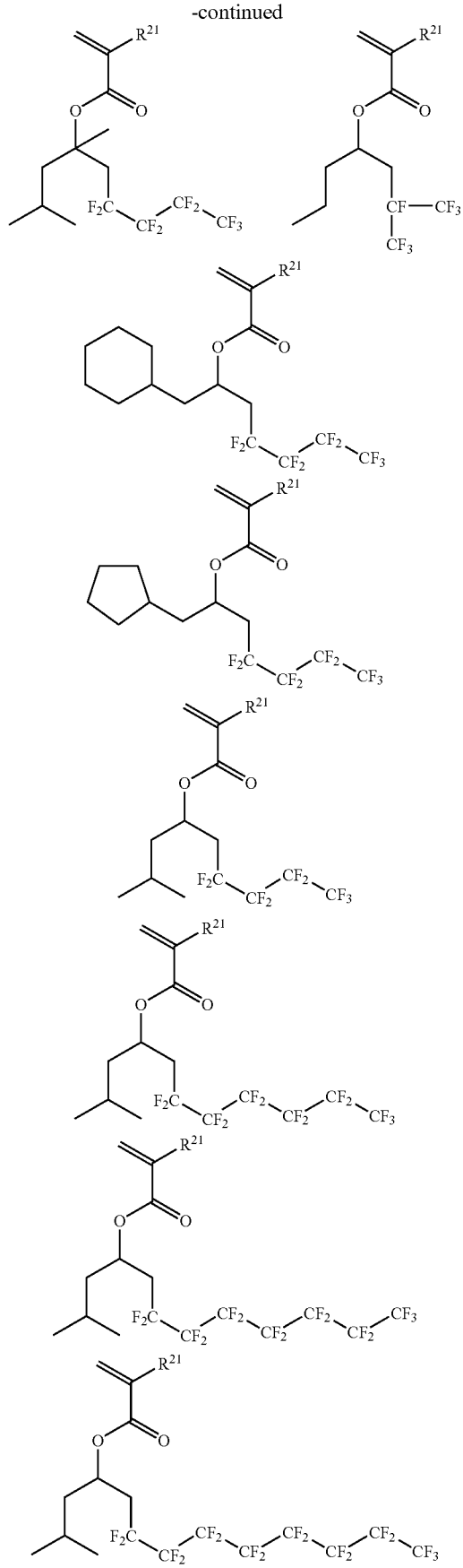

-continued

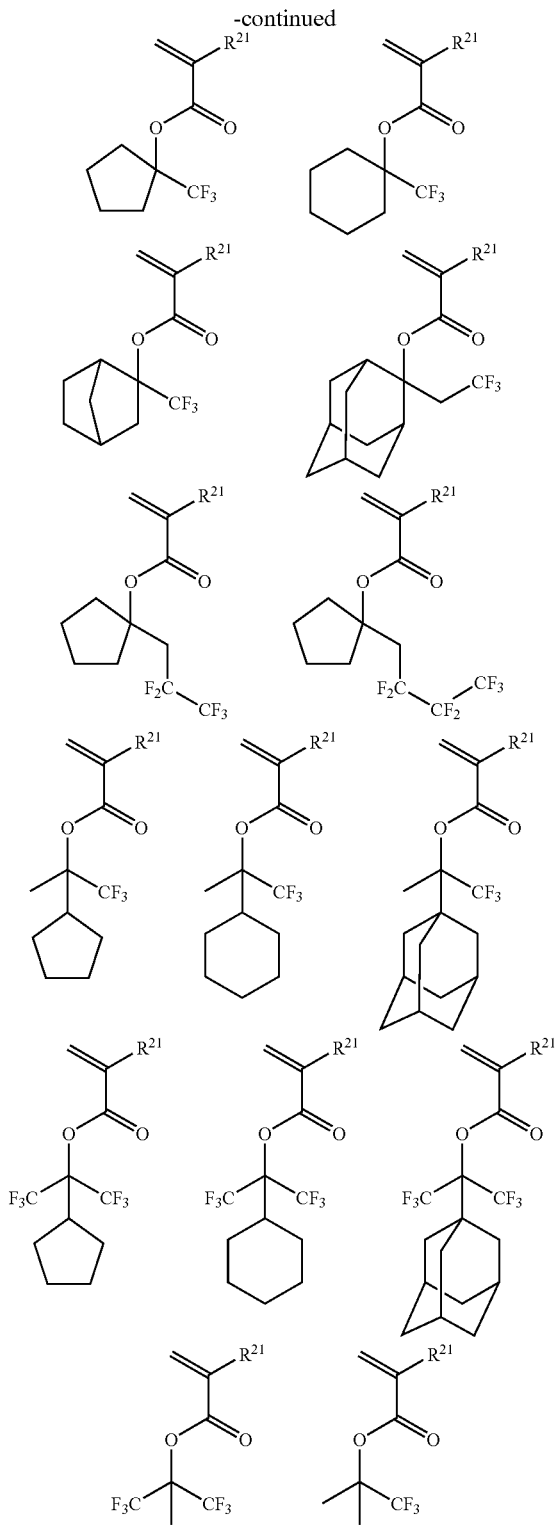

Herein R²¹ is as defined above.

These recurring units (s-1) and (s-2) may be copolymerized with the above-described alkali soluble recurring units having a phenol or carboxyl group or substantially alkali insoluble recurring units (s-3). In these copolymers, the proportion of recurring units (s-1) and (s-2) is $0 \leq (s\text{-}1) \leq 1$, $0 \leq (s\text{-}2) \leq 1$, and $0 < (s\text{-}1)+(s\text{-}2) \leq 1$, preferably $0.1 < (s\text{-}1)+(s\text{-}2) \leq 1$, and more preferably $0.2 < (s\text{-}1)+(s\text{-}2) \leq 1$. Understandably, in the case of $(s\text{-}1)+(s\text{-}2)<1$, the balance consists of recurring units (s-3) described just above.

This alkali soluble surfactant should preferably have a weight average molecular weight (Mw) of 1,000 to 100,000 and more preferably 2,000 to 50,000.

The alkali soluble surfactant is preferably added in an amount of 0 to 50 parts, and more preferably 0 to 20 parts by weight per 100 parts by weight of the base polymer. Too much amounts of the surfactant may cause excessive film slimming or detract from etching resistance. When added, at least 1 phr of the surfactant is preferred.

The basic quencher used herein may be any of the same basic compounds as described in conjunction with the positive resist composition. Specifically, a basic compound may be added to the pattern reversal film used in the pattern forming process of the invention for preventing acid diffusion from the resist pattern as developed. Particularly when an acid labile group-substituted phenolic compound or carboxyl-containing compound is used as the component of the pattern reversal film, there arises the problem that the alkali dissolution rate increases due to diffusion of acid from the resist pattern and deprotection reaction, leading to the reversal pattern of an increased size or substantially reduced thickness. This problem is effectively overcome by adding a basic compound. Understandably the basic compounds added to the resist composition and the pattern reversal film composition may be the same or different.

The basic compound or basic quencher is preferably added in an amount of 0 to 10 parts, and more preferably 0 to 5 parts by weight per 100 parts by weight of the base polymer. When added, at least 0.1 phr of the quencher is preferred.

In the pattern reversal film-forming composition used in the pattern forming process of the invention, the organic solvent used may be selected from those used in the positive resist composition, and from alcohols of 3 to 10 carbon atoms and ethers of 8 to 12 carbon atoms which are favorable in preventing mixing with the positive resist coating (i.e., resist pattern). Illustrative examples of the $C_3$-$C_{10}$ alcohols include n-propyl alcohol, isopropyl alcohol, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol.

Examples of the $C_8$-$C_{12}$ ethers include di-n-butyl ether, diisobutyl ether, di-sec-butyl ether, di-n-pentyl ether, diisopentyl ether, di-sec-pentyl ether, di-t-amyl ether, and di-n-hexyl ether.

These solvents may be used alone or in admixture of two or more. An aromatic solvent such as toluene, xylene or anisole may be mixed with the foregoing solvent.

The amount of the organic solvent used is preferably 200 to 3,000 parts, and more preferably 400 to 2,000 parts by weight per 100 parts by weight of the base polymer.

In one embodiment, the RELACS method is applied to the hole pattern following image reversal, that is, a shrinking agent is coated on the hole pattern and the structure is baked for shrinking the hole pattern. Useful materials are described in JP 3071401, JP-A 2001-228616, JP-A 2004-86203, JP-A 2004-294992, JP-A 2007-206728, and WO 2005-008340.

Typically a composition comprising a base polymer and the above-mentioned crosslinker in water or alcohol may be used as the shrinking agent. The base polymer is selected from among polyacrylic acid, polyvinyl alcohol, polyvinyl acetal, polyvinyl pyrrolidone, polyethylene imine, polyethylene oxide, polyvinylamine, polyallylamine, styrene-maleic acid copolymers, poly(N-vinylformamide), polyoxazoline, melamine resins, urea resins, alkyd resins, and water-soluble resins based on sulfonamide or carbonamide.

Process

Figure 11A:
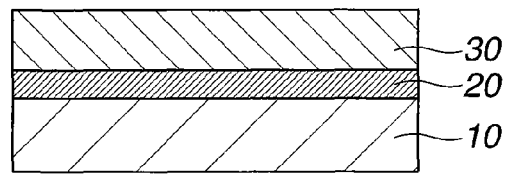
FIG. 11A shows that a processable substrate and a resist film are disposed on a substrate.

Now referring to the drawings, the pattern forming process of the invention is illustrated. First, the positive resist composition is coated on a substrate to form a resist film thereon. As shown in FIG. 11A, a resist film 30 of a positive resist composition is formed on a processable substrate 20 disposed on a substrate 10 directly or via an intermediate intervening layer (not shown). The resist film preferably has a thickness of 10 to 1,000 nm and more preferably 20 to 500 nm. Prior to exposure, the resist film is heated or prebaked, preferably at a temperature of 60 to 180° C., especially 70 to 150° C. for a time of 10 to 300 seconds, especially 15 to 200 seconds.

The substrate 10 used herein is generally a silicon substrate. The processable substrate (or target film) 20 used herein includes $SiO_2$, SiN, SiON, SiOC, p-Si, $\alpha$-Si, TiN, WSi, BPSG, SOG, Cr, CrO, CrON, MoSi, low dielectric film, and etch stopper film. The intermediate intervening layer includes hard masks of $SiO_2$, SiN, SiON or p-Si, an undercoat in the form of carbon film, a silicon-containing intermediate film, and an organic antireflective coating.

Suitable spin-on carbon films include nortricyclene copolymers described in JP-A 2004-205658, hydrogenated naphthol novolac resins described in JP-A 2004-205676, naphthol dicyclopentadiene copolymers described in JP-A 2004-205685, phenol dicyclopentadiene copolymers described in JP-A 2004-354554 and JP-A 2005-010431, fluorene bisphenol novolac described in JP-A 2005-128509, acenaphthylene copolymers described in JP-A 2005-250434, indene copolymers described in JP-A 2006-053543, phenol group-containing fullerene described in JP-A 2006-227391, bisphenol compounds and novolac resins thereof described in JP-A 2006-259249, JP-A 2006-293298, and JP-A 2007-316282, bisphenol compounds and novolac resins thereof described in JP-A 2006-259482, novolac resins of adamantane phenol compounds described in JP-A 2006-285095, hydroxyvinylnaphthalene copolymers described in JP-A 2007-171895, bisnaphthol compounds and novolac resins thereof described in JP-A 2007-199653, ROMP polymers described in JP-A 2008-26600, and tricyclopentadiene copolymers described in JP-A 2008-96684, and other resinous compounds.

The spin-on silicon-containing intermediate layers are preferably those layers comprising silsesquioxane-based silicon compounds and having an antireflection function as described in JP-A 2004-310019, JP-A 2005-15779, JP-A 2005-18054, JP-A 2005-352104, JP-A 2007-65161, JP-A 2007-163846, JP-A 2007-226170, and JP-A 2007-226204.

Where the reversal film is formed of a hydrocarbon base material, a carbon film having a carbon content of at least 75% by weight on the processable substrate and a silicon-containing intermediate layer thereon are preferably disposed between the processable substrate and the photoresist film for positive/negative reversal to construct a film stack suited for the three-layer resist process. The carbon film may be formed by spin coating or an amorphous carbon film formed by CVD. The silicon-containing intermediate layer may be a SOG film formed by spin coating or a film selected from $SiO_2$, SiN, SiON and TiN films formed by CVD or ALD, and has both functions of a hard mask for the carbon film and an antireflection film. Also, an organic antireflective coating may be formed between the silicon-containing film and the photoresist film for the purposes of preventing footing on the substrate and pattern collapse and further reducing substrate reflection.

Where the reversal film is formed of a silicon-containing material, a carbon film having a carbon content of at least 75% by weight is formed between the processable substrate and the photoresist film for positive/negative reversal, and a photoresist film is formed thereon. An organic antireflective coating may be formed between the carbon film and the photoresist film. In this embodiment, the silicon-containing reversal film functions as a hard mask during processing of the carbon film.

This is followed by exposure. For the exposure, preference is given to high-energy radiation having a wavelength of 140 to 250 nm, and especially ArF excimer laser radiation of 193 nm. The exposure may be done either in air or in a dry atmosphere with a nitrogen stream, or by immersion lithography in water. The ArF immersion lithography uses deionized water or liquids having a refractive index of at least 1 and highly transparent to the exposure wavelength such as alkanes as the immersion solvent. The immersion lithography involves prebaking a resist film and exposing the resist film to light through a projection lens, with water introduced between the resist film and the projection lens. Since this allows lenses to be designed to a NA of 1.0 or higher, formation of finer feature size patterns is possible. The immersion lithography is important for the ArF lithography to survive to the 45-nm node. In the case of immersion lithography, deionized water rinsing (or post-soaking) may be carried out after exposure for removing water droplets left on the resist film, or a protective film may be applied onto the resist film after pre-baking for preventing any leach-out from the resist film and improving water slip on the film surface.

The resist protective film used in the immersion lithography is preferably formed from a solution of a polymer having 1,1,1,3,3,3-hexafluoro-2-propanol residues which is insoluble in water, but soluble in an alkaline developer liquid, in a solvent selected from alcohols of at least 4 carbon atoms, ethers of 8 to 12 carbon atoms, and mixtures thereof. The protective coating composition used herein may comprise a base resin comprising predominant recurring units (P-1) such as recurring units having 1,1,1,3,3,3-hexafluoro-2-propanol residues or a base resin comprising the predominant recurring units (P-1) and recurring units (P-2) having a fluoroalkyl group copolymerized therewith. Examples of recurring units (P-1) include those derived from the monomers exemplified above for units (s-1), and examples of recurring units (P-2) include those derived from the monomers exemplified above for units (s-2). The proportion of these recurring units (P-1) and (P-2) is $0<(P-1)\leq1.0$, $0\leq(P-2)<1.0$, and $0.3\leq(P-1)+(P-2)\leq1.0$. The base resin has a weight average molecular weight (Mw) of 1,000 to 100,000, and preferably 2,000 to 50,000. When a base resin free of recurring units (P-2) is used, it is preferred to incorporate an amine compound in the protective coating composition. The amine compound used herein may be selected from those described above in conjunction with the basic compound. The amine compound is preferably used in an amount of 0.01 to 10 parts, and more preferably 0.02 to 8 parts by weight per 100 parts by weight of the base resin.

After formation of the photoresist film, deionized water rinsing (or post-soaking) may be carried out for extracting the acid generator and the like from the film surface or washing away particles, or after exposure, rinsing (or post-soaking) may be carried out for removing water droplets left on the resist film.

Exposure is preferably carried out so as to provide an exposure dose of about 1 to 200 mJ/cm$^2$, more preferably about 10 to 100 mJ/cm$^2$. This is followed by baking (PEB) on a hot plate at 60 to 150° C. for 1 to 5 minutes, preferably at 80 to 120° C. for 1 to 3 minutes.

Figure 11B:
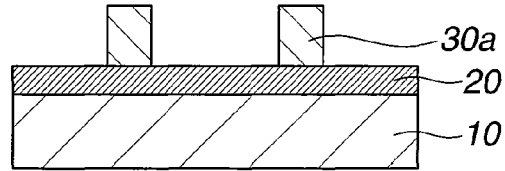
FIG. 11B shows that the resist film is exposed and developed.

Thereafter the resist film is developed with a developer in the form of an aqueous alkaline solution, for example, an aqueous solution of 0.1 to 5 wt %, preferably 2 to 3 wt % TMAH for 0.1 to 3 minutes, preferably 0.5 to 2 minutes by conventional techniques such as dip, puddle or spray techniques. In this way, a desired resist pattern 30a is formed on the substrate as shown in FIG. 11B.

As to the pattern, a dot pattern having a half-pitch size of 38×38 nm to 100×100 nm, and especially 40×40 nm to 80×80 nm may be formed. Since the size of a dot pattern depends on the lens NA of an exposure tool, use of an NA 1.35 exposure tool enables formation of dots having a half-pitch of 38 nm as the minimum size. The dot pattern may have longitudinal and transverse axes of equal or different length. The method of forming a dot pattern is not particularly limited. A typical method of forming a dot pattern is by exposing the resist film to high-energy radiation so as to form a first line pattern, exposing again so as to form a second line pattern perpendicular to the first line pattern, and developing to form a dot pattern. With this method, holes having the finest half-pitch can be formed.

When a random pattern including dense and isolated pattern regions is formed, a dense pattern is exposed and then exposure is carried out for erasing an unnecessary region of the dense pattern. Exposure of the erase pattern may be carried out subsequent to or prior to the dense pattern exposure. The erase pattern exposure may be a single exposure. Where a ultra-dense pattern is formed by double dipole illumination of X and Y lines, from which the repeating units are erased one by one, erasing exposure by the same double dipole illumination is necessary. In this case, the erase pattern exposure includes a plurality of exposures. Since the erase pattern exposure does not need a high resolution, the immersion lithography is not necessarily requisite.

Since a high accuracy of alignment is desired between the dense pattern exposure and the erase pattern exposure, continuous exposure is preferably carried out without detachment of the wafer from the chuck. To this end, the exposure tool must have a mechanism capable of exposure while exchanging a plurality of masks. For improved throughput, the exposure tool must be equipped with a plurality of mask stages, which are aligned relative to the respective stages before exposure, so that continuous exposure may be carried out while exchanging mask stages. Where the dense pattern exposure is by the immersion lithography and the erase pattern exposure is by dry lithography, different exposure tools are used, leading to a substantial amount of misalignment. This exposure process is applicable if the amount of misalignment falls within the practically acceptable range.

Next, PEB and development are carried out to form a dot pattern.

Figure 11C:
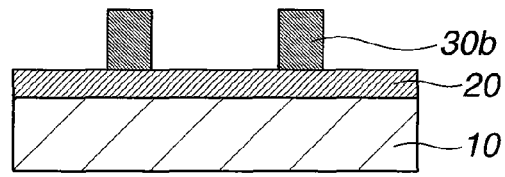
FIG. 11C shows that the resist pattern is deprotected and crosslinked under the action of acid and heat.

Next, the resist pattern is treated to eliminate acid labile groups in the polymer (base resin) in the pattern and to crosslink the polymer, forming a crosslinked pattern 30b (FIG. 11C). To induce elimination of acid labile groups and crosslinking on the polymer in the resist pattern, acid and heat are necessary. In practice, once an acid is generated, heat is applied to effect elimination of acid labile groups and crosslinking at the same time. The acid may be generated by a suitable method such as flood exposure of the wafer (pattern) as developed for decomposing the photoacid generator. The flood exposure uses an illumination wavelength of 180 to 400 nm and an exposure dose of 10 mJ/cm$^2$ to 1 J/cm$^2$. Radiation with a wavelength of less than 180 nm, specifically irradiation of excimer lasers or excimer lamps of 172 nm, 146 nm and 122 nm is undesirable because not only the generation of acid from photoacid generator, but also photo-induced crosslinking reaction are accelerated, leading to a decrease of alkaline dissolution rate due to exaggerated crosslinking. For the flood exposure, use is preferably made of an ArF excimer laser with a wavelength of 193 nm or longer, a KrCl excimer lamp of 222 nm, a KrF excimer laser of 248 nm, a low-pressure mercury lamp centering at 254 nm, a XeCl excimer lamp of 308 nm, and i-line of 365 nm. In an alternative embodiment wherein a thermal acid generator in the form of an ammonium salt is added to the positive resist composition, the acid can be generated by heating. In this embodiment, acid generation and crosslinking reaction take place simultaneously. Preferred heating conditions include a temperature of 150 to 400° C., especially 160 to 300° C. and a time of 10 to 300 seconds. As a result, a crosslinked resist pattern which is insoluble in the solvent of the reversal film-forming composition is yielded. Since an additional illumination system is necessary to generate the acid by illumination, the latter embodiment is more advantageous that uses a resist composition having a thermal acid generator added thereto so that deprotection and crosslinking reaction may be driven only by heating.

Figure 11D:
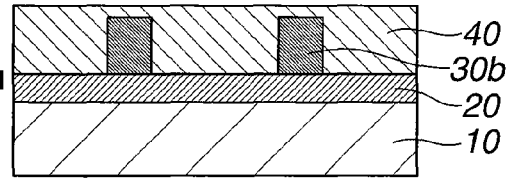
FIG. 11D shows that a pattern reversal film is coated.

Next, as shown in FIG. 11D, the reversal film-forming composition is built up until it covers the crosslinked resist pattern 30b, forming a reversal film 40. Preferably the thickness of the reversal film 40 is equal to the height of the resist pattern 30b or ±30 nm.

Next, the liquid alkaline developer is applied to dissolve a surface layer of the reversal film 40 until the crosslinked resist pattern 30b is exposed. From this point of time downward, the crosslinked resist pattern 30b is selectively dissolved since the dissolution rate in the alkaline developer of the crosslinked resist pattern 30b is substantially higher than that of the reversal film 40.

Figure 11E:
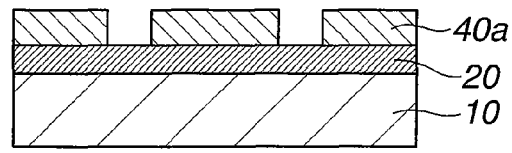
FIG. 11E shows that the pattern reversal film is developed for positive/negative reversal.

Eventually, the crosslinked resist pattern 30b is selectively dissolved away, yielding the reversal film 40 provided with a reversal pattern 40a which is a negative of the crosslinked resist pattern 30b as shown in FIG. 11E. If the resist pattern is a dot pattern, the resulting reversal pattern is a hole pattern.

Figure 11F:
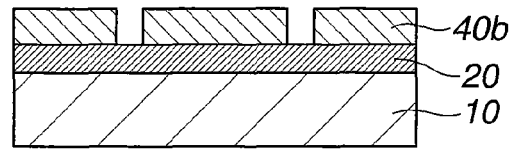
FIG. 11F shows that the hole pattern is heat shrunk.

The hole pattern printed as the reversal pattern is then shrunk by baking as shown in FIG. 11F. The baking is preferably at a temperature of 70 to 180° C., preferably 80 to 170° C. for a time of 10 to 300 seconds. Shrinkage results in a reversal pattern 40b.

Figure 11G:
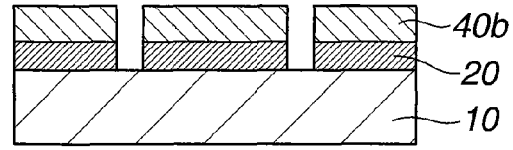
FIG. 11G shows that the processable substrate is etched using the shrunk pattern.
Figure 12A:
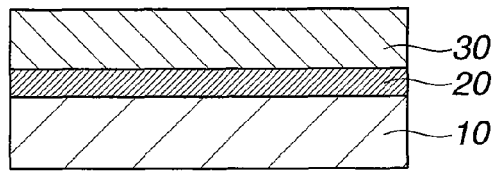
FIG. 12A shows that a processable substrate and a resist film are disposed on a substrate.
Figure 12B:
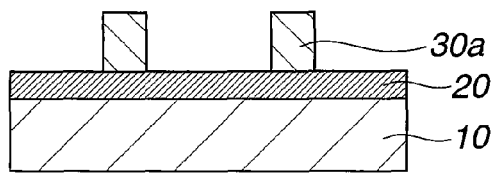
FIG. 12B shows that the resist film is exposed and developed.
Figure 12C:
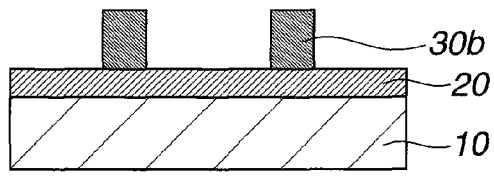
FIG. 12C shows that the resist pattern is deprotected and crosslinked under the action of acid and heat.
Figure 12D:
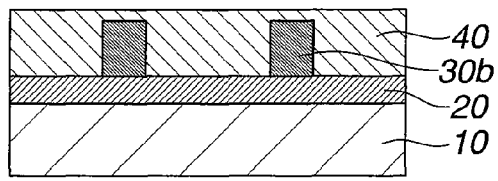
FIG. 12D shows that a pattern reversal film is coated.
Figure 12E:
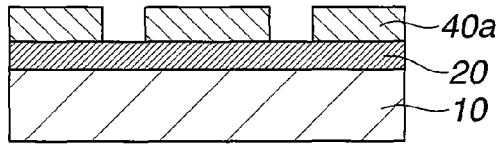
FIG. 12E shows that the pattern reversal film is developed for positive/negative reversal.
Figure 12F:
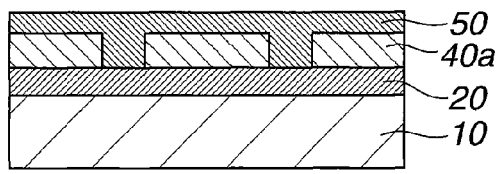
FIG. 12F shows that a shrinking agent is coated and baked.
Figure 12G:
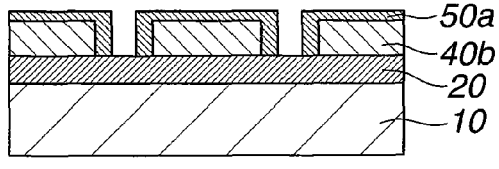
FIG. 12G shows that the shrinking agent is stripped.
Figure 12H:
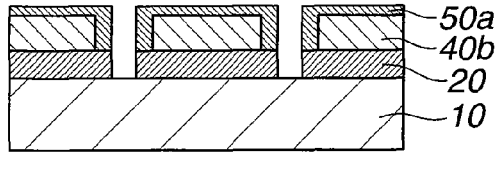
FIG. 12H shows that the processable substrate is etched using the shrunk pattern.

Furthermore, as shown in FIG. 11G, using the reversal pattern 40b as a mask, the intermediate intervening layer of hard mask or the like (if any) is etched, and the processable substrate 20 further etched. For etching of the intermediate intervening layer of hard mask or the like, dry etching with fluorocarbon or halogen gases may be used. For etching of the processable substrate, the etching gas and conditions may be properly chosen so as to establish an etching selectivity relative to the hard mask, and specifically, dry etching with fluorocarbon, halogen, oxygen, hydrogen or similar gases may be used. Thereafter, the crosslinked resist film is removed. Removal of the film may be carried out after etching of the intermediate intervening layer of hard mask or the like. It is noted that removal of the crosslinked resist film may be achieved by dry etching with oxygen or radicals.

In the other embodiment, the hole pattern printed as the reversal pattern is shrunk by the RELACS method as shown in FIG. 12. A shrinking agent 50 is coated on the hole pattern and baked so that the shrinking agent is attached to side walls of the hole pattern, as shown in FIG. 12F. The baking is preferably at a temperature of 70 to 180° C., preferably 80 to 170° C. for a time of 10 to 300 seconds. Then the extra shrinking agent is removed, and the hole pattern is reduced as shown in FIG. 12G. The shrinking agent may be removed using water, developer, alcohol or a mixture thereof.

Example

Examples of the invention are given below by way of illustration and not by way of limitation. The abbreviation "pbw" is parts by weight. For all polymers, Mw and Mn are determined by GPC versus polystyrene standards.

Preparation of Reversal Film-Forming Composition

A polymer for use in a reversal film-forming composition was prepared by combining monomers, effecting copolymerization reaction in tetrahydrofuran medium, crystallization in methanol, repeatedly washing with hexane, isolation, and drying. The resulting polymer (Polymer 1) had the composition shown below. Notably, a phenol group on a monomer was substituted by an acetoxy group, which was converted back to a phenol group by alkaline hydrolysis after polymerization. The composition of the polymer was analyzed by $^1$H-NMR, and the Mw and Mw/Mn determined by GPC.

Polymer 1

Mw = 9,300
Mw/Mn = 1.88

A reversal film-forming composition was prepared by combining Polymer 1, a basic quencher, a crosslinker, an acid generator, and a solvent in accordance with the formulation of Table 1. To the solvent, 100 ppm of a fluorochemical surfactant FC-4430 (3M-Sumitomo Co., Ltd.) was added. The reversal film-forming composition was coated onto a HMDS-primed 8-inch silicon substrate and baked at 110° C. for 60 seconds to form a pattern reversal film of 60 nm thick. The film was developed with a developer in the form of a 2.38 wt % TMAH aqueous solution for 30 seconds. A film thickness reduction by development was determined, from which a dissolution rate (in nm/s) was computed.

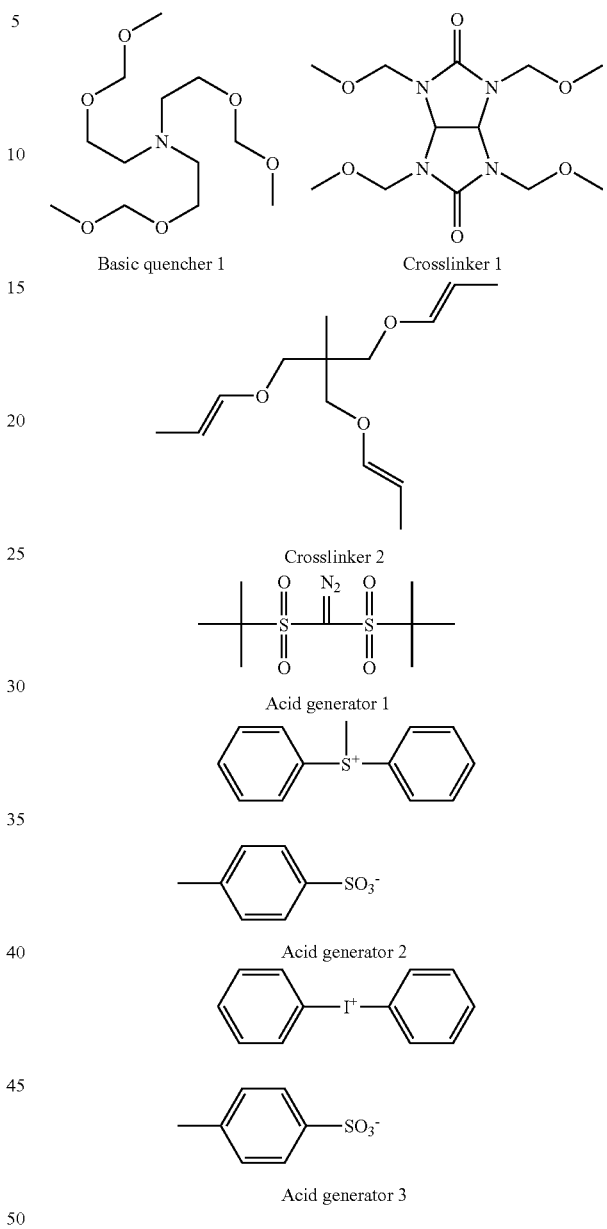

Basic quencher 1    Crosslinker 1

Crosslinker 2

Acid generator 1

Acid generator 2

Acid generator 3

PGMEA (Propylene Glycol Monomethyl Ether Acetate)

TABLE 1

Pattern reversal film-forming composition

| Reversal film | Polymer (pbw) | Additive (pbw) | Solvent (pbw) | Dissolution rate (nm/s) |
|---|---|---|---|---|
| RF1 | Polymer 1 (100) | Basic quencher 1 (2.0) | PGMEA (3,000) | 0.2 |
| RF2 | Polymer 1 (100) | Acid generator 1 (1.0) Crosslinker 1 (4.0) | PGMEA (3,000) | 0.4 |
| RF3 | Polymer 1 (100) | Acid generator 2 (1.0) Crosslinker 1 (4.0) | PGMEA (3,000) | 0.2 |
| RF4 | Polymer 1 (100) | Acid generator 2 (1.0) Crosslinker 2 (6.0) | PGMEA (3,000) | 0.16 |

TABLE 1-continued

| Pattern reversal film-forming composition | | | | |
|---|---|---|---|---|
| Reversal film | Polymer (pbw) | Additive (pbw) | Solvent (pbw) | Dissolution rate (nm/s) |
| RF5 | Polymer 1 (100) | Acid generator 3 (1.0) Crosslinker 2 (6.0) | PGMEA (3,000) | 0.18 |

Preparation of Positive Resist Composition and Alkali-Soluble Protective Coating Composition A resist solution and a protective coating solution were prepared by dissolving polymers (Resist polymer and Protective film polymer) and components in solvents in accordance with the formulation of Tables 2 and 3, and filtering through a filter with a pore size of 0.2 μm. The components in Tables 2 and 3 are identified below.

Photoacid generator: PAG1 of the following structural formula

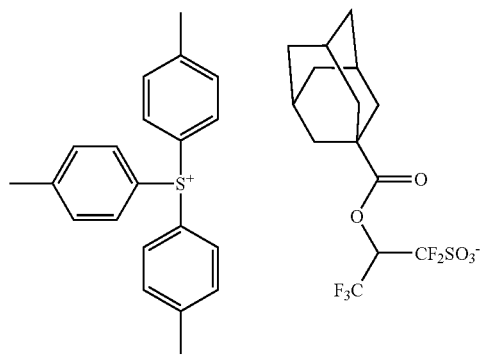

PAG 1

Resist Polymer 1
Mw=8,310
Mw/Mn=1.73

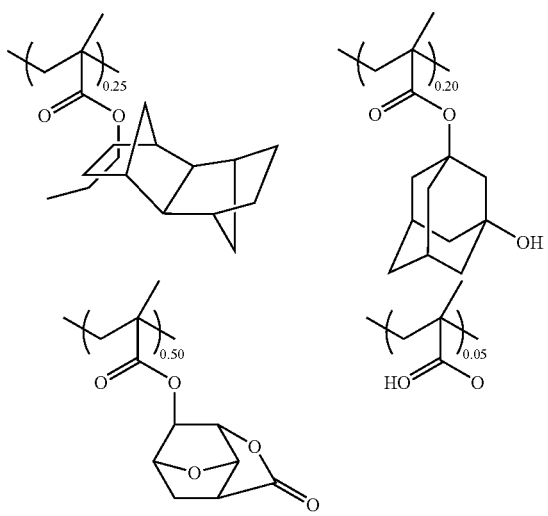

Protective Film Polymer
Mw=8,800
Mw/Mn=1.69

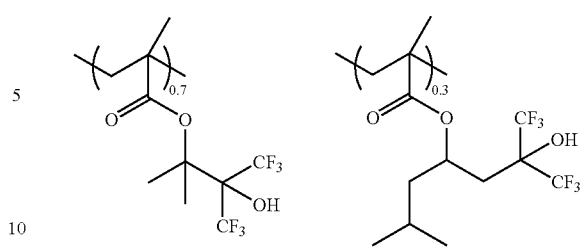

Basic compound: Basic Quencher 2 of the following structural formula

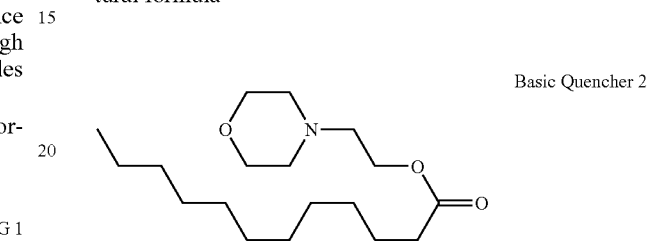

Basic Quencher 2

Thermal acid generator: TAG1 of the following structural formula

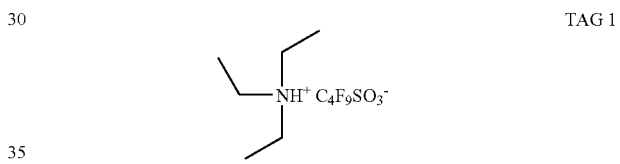

TAG 1

Organic solvent: PGMEA (propylene glycol monomethyl ether acetate)

TABLE 2

| | Polymer (pbw) | Acid generator (pbw) | Basic compound (pbw) | Organic solvent (pbw) |
|---|---|---|---|---|
| Resist 1 | Resist Polymer 1 (100) | PAG1 (12.0) TAG1 (0.5) | Basic Quencher 2 (1.20) | PGMEA (2,000) |

TABLE 3

| | Polymer (pbw) | Additive (pbw) | Organic solvent (pbw) |
|---|---|---|---|
| TC1 | Protective Film Polymer (100) | tri-n-octylamine (0.3) | diisoamyl ether (2,700) 2-methyl-1-butanol (270) |

Preparation of Shrinking Agent

A shrinking agent solution was prepared by dissolving a shrinking base polymer and a crosslinker in a solvent in accordance with the formulation shown in Table 4 and filtering through a filter with a pore size of 0.2 μm. The components in Table 4 are identified below.

Shrinking base polymer:
polyvinyl pyrrolidone with
Mw=10,000 and Mw/Mn=1.97

Crosslinker 3

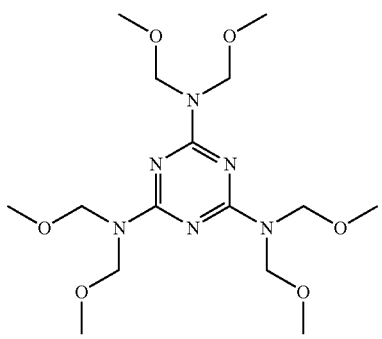

TABLE 4

| | Polymer (pbw) | Additive (pbw) | Organic solvent (pbw) |
|---|---|---|---|
| Shrinking agent 1 | Shrinking Base Polymer 1 (100) | Crosslinker 3 (15.0) | isobutyl alcohol (2,000) water (200) |

Film Thickness Change in Solvent and Alkali Dissolution Rate after High-Temperature Baking On a substrate (silicon wafer), the resist composition prepared in accordance with the formulation of Table 2 was spin coated and baked on a hot plate at 190° C. for 60 seconds to form a resist film of 150 nm thick.

A solvent was statically dispensed on the resist film for 30 seconds. Thereafter, the sample was rotated at 2000 rpm for 30 seconds for spinning off the solvent and baked at 100° C. for 60 seconds for drying off the solvent. A film thickness was measured using a film thickness gauge, and a change of film thickness from the film as baked at 190° C. was computed.

Separately, the resist film as baked at 190° C. was examined for alkaline dissolution rate. Using a resist development analyzer RDA-790 (Lithotec Japan Co., Ltd.), an alkaline dissolution rate of the film in 2.38 wt % TMAH aqueous solution was measured. The results are shown in Table 5.

TABLE 5

| | Solvent | Film slimming by solvent (nm) | Alkali dissolution rate (nm/s) |
|---|---|---|---|
| Resist 1 | PGMEA | 0.5 | 170 |

ArF Lithography Patterning I

On a substrate (silicon wafer), a spin-on carbon film ODL-50 (Shin-Etsu Chemical Co., Ltd.) having a carbon content of 80 wt % was deposited to a thickness of 200 nm and a silicon-containing spin-on hard mask SHB-A940 having a silicon content of 43 wt % was deposited thereon to a thickness of 35 nm. On this substrate for trilayer process, the resist composition shown in Table 2 was spin coated, then baked on a hot plate at 100° C. for 60 seconds to form a resist film of 100 nm thick. The protective coating composition TC1 shown in Table 3 was spin coated on the resist film and baked at 90° C. for 60 seconds to form a protective film of 50 nm thick.

Using an ArF excimer laser immersion lithography scanner NSR-610C (Nikon Corp., NA 1.30, σ0.98/0.65, oblique 45 deg quadri-pole illumination opening 35 deg., 6% halftone phase shift mask), the wafer was exposed to a dense dot pattern of 130 nm pitch. It was developed to form a dot pattern, which was baked at 190° C. for 60 seconds for deprotection of acid labile groups and crosslinking. On the dot pattern, the pattern reversal film-forming composition of Examples 1 to 5 was coated so as to form a reversal film of 60 nm thick. This was followed by development with a 2.38 wt % TMAH aqueous solution for 30 seconds, achieving image reversal from the dot pattern to a hole pattern.

The hole pattern as reversed was baked for 120 seconds at a temperature shown in Table 6, thereby shrinking the hole pattern.

In Comparative Example 1, a coated wafer was prepared in the same manner as in Examples with respect to substrate, resist composition, protective coating composition, thickness and baking conditions. Using an ArF excimer laser immersion lithography scanner NSR-610C (Nikon Corp., NA 1.30, σ0.98/0.65, oblique 45 deg quadri-pole illumination opening 35 deg., 6% halftone phase shift mask), the wafer was exposed to a dense hole pattern of 130 nm pitch. The hole pattern was shrunk by baking for 120 seconds.

By observation under TDSEM S-9380 (Hitachi Hitechnologies Ltd.), the size of the dot pattern as developed, the dot pattern as heated, the hole pattern as image reversed, and the hole pattern as shrunk was measured. The results are shown in Table 6.

TABLE 6

| | Resist composition | Reversal film-forming composition | Dot pattern as developed | Dot pattern as heated | Hole pattern as reversed | Baking temp. | Hole pattern as baked |
|---|---|---|---|---|---|---|---|
| Example 1 | Resist 1 | RF1 | 50 nm | 50 nm | 49 nm | 140° C. | 29 nm |
| Example 2 | Resist 1 | RF2 | 50 nm | 51 nm | 50 nm | 145° C. | 27 nm |
| Example 3 | Resist 1 | RF3 | 52 nm | 51 nm | 50 nm | 148° C. | 28 nm |
| Example 4 | Resist 1 | RF4 | 51 nm | 52 nm | 51 nm | 152° C. | 24 nm |
| Example 5 | Resist 1 | RF5 | 52 nm | 52 nm | 50 nm | 152° C. | 26 nm |

| | Resist composition | Reversal film-forming composition | Hole pattern | Baking temp. | Hole pattern as baked |
|---|---|---|---|---|---|
| Comparative Example 1 | Resist 1 | — | 65 nm | 190° C. | 62 nm |

ArF Lithography Patterning II

A coated wafer was prepared in the same manner as in Examples with respect to substrate, resist composition, protective coating composition, thickness and baking conditions. Using an ArF excimer laser immersion lithography scanner NSR-610C (Nikon Corp., NA 1.30, σ0.98/0.65, oblique 45 deg quadri-pole illumination opening 35 deg., 6% halftone phase shift mask), the wafer was exposed to a dense dot pattern of 130 nm pitch. It was developed to form a dot pattern, which was baked at 190° C. for 60 seconds for deprotection of acid labile groups and crosslinking.

On the dot pattern, the pattern reversal film-forming composition of Example 6 was coated so as to form a reversal film of 60 nm thick. This was followed by development with a 2.38 wt % TMAH aqueous solution for 30 seconds, achieving image reversal from the dot pattern to a hole pattern.

On the hole pattern as reversed, the shrinking agent shown in Table 4 was coated and baked at 140° C. for 120 seconds. The extra shrinking agent was stripped with deionized water.

In Comparative Example 2, a coated wafer was prepared in the same manner as in Examples with respect to substrate, resist composition, protective coating composition, thickness and baking conditions. Using an ArF excimer laser immersion lithography scanner NSR-610C (Nikon Corp., NA 1.30, σ0.98/0.65, oblique 45 deg quadri-pole illumination opening 35 deg., 6% halftone phase shift mask), the wafer was exposed to a dense hole pattern of 130 nm pitch. On the hole pattern, the shrinking agent shown in Table 4 was coated and baked at 140° C. for 120 seconds. The extra shrinking agent was stripped with deionized water.

Figure 13A:
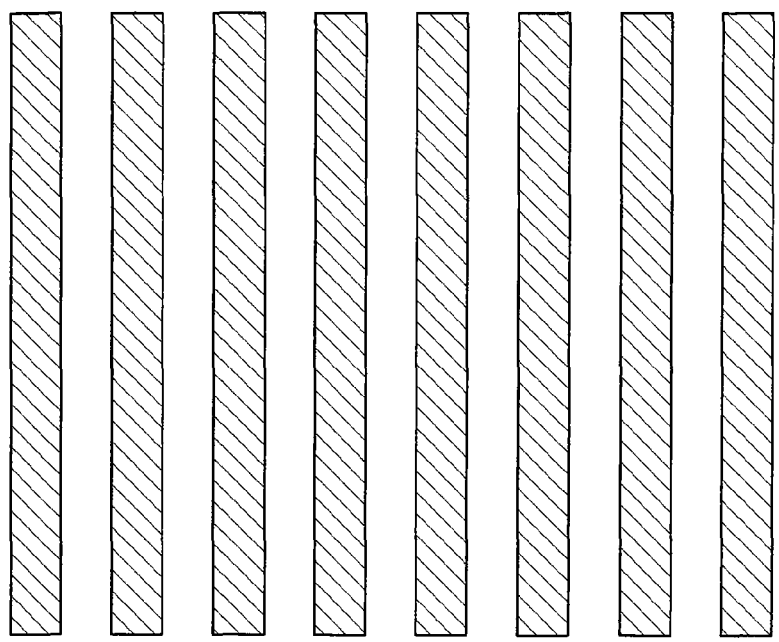
FIG. 13 illustrates a double dipole mask and a dot erasing mask of Y and X direction lines for forming dots in Example, FIG. 13A being a mask for forming 1:1 Y direction lines, and FIG. 13B being a mask for forming 1:1 X direction lines.
Figure 13B:
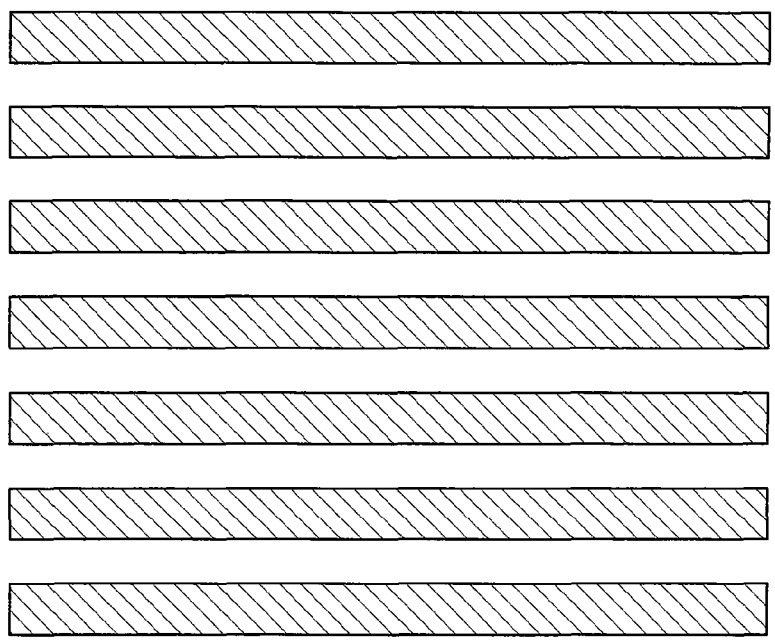
Figure 14:
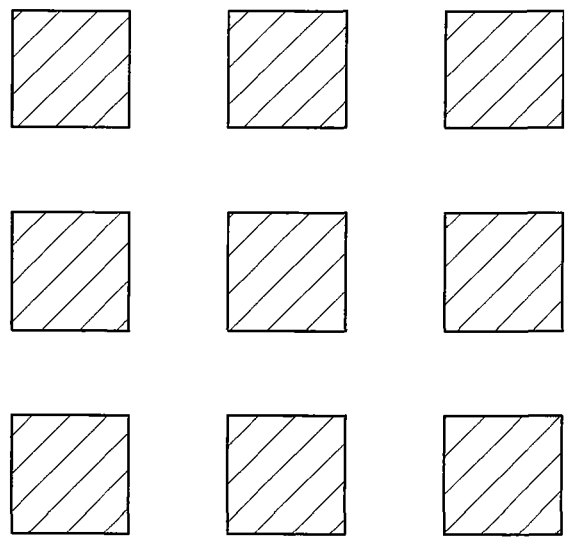
FIG. 14 illustrates a mask for erasing unnecessary dots.
Figure 15:
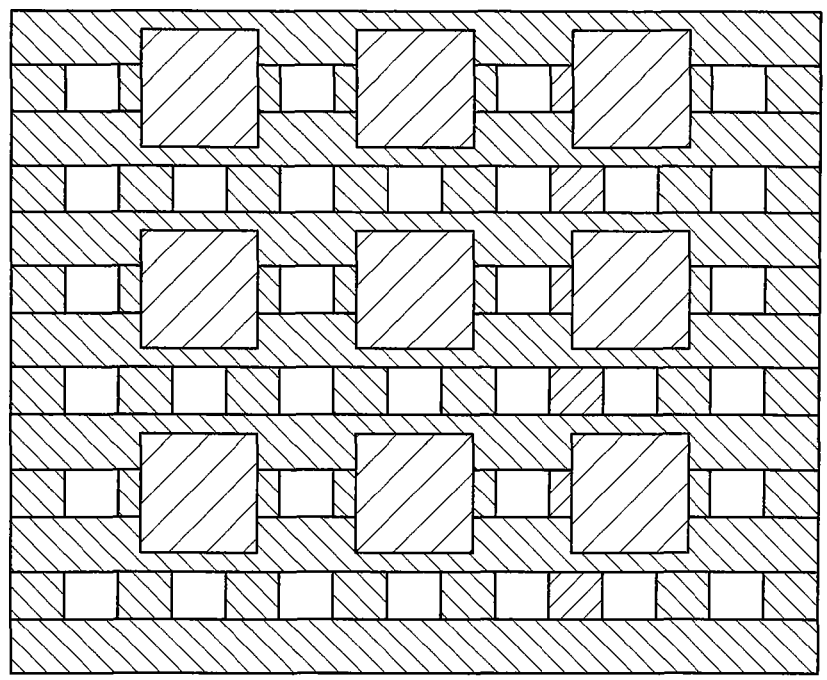
FIG. 15 illustrates an overlay of FIGS. 13A, 13B and 14, with the light-shielding zones in FIG. 14 being inked darker to exaggerate the difference between FIGS. 13A and 13B.

By observation under TDSEM S-9380 (Hitachi Hitechnologies Ltd.), the size of the dot pattern as developed, the dot pattern as heated, the hole pattern as image reversed, and the hole pattern as shrunk was measured. The results are shown in Table 7.

mask), the wafer was first exposed to a X direction 45 nm 1:1 line-and-space pattern through a mask of the layout of FIG. 13A by immersion lithography. Using the ArF excimer laser immersion lithography scanner NSR-610C (Nikon Corp., NA 1.30, σ0.98/0.65, opening 20 deg. dipole s-polarized illumination, 6% halftone phase shift mask), the wafer at the overlay position was second exposed to a Y direction 45 nm 1:1 line-and-space pattern through a mask of the layout of FIG. 13B by immersion lithography. Thereafter, under the conditions of NA 1.30, σ0.98/0.65, oblique 45 deg quadric-pole illumination opening 35 deg., and 6% halftone phase shift mask, the wafer at the overlay position on the first and second exposures was exposed, over a portion of the first and second exposed region, to a dot pattern of 90 nm size and 180 nm pitch through a mask of the layout of FIG. 14. Immediately after exposure, the wafer was baked at 100° C. for 60 seconds and developed with a 2.38 wt % TMAH aqueous solution for 30 seconds. There were obtained a 1:1 dot pattern having size 40 nm and pitch 90 nm (FIG. 16) and a 1:3 dot pattern having size 40 nm and pitch 180 nm (FIG. 17) as development finished. FIG. 15 is an overlay of FIGS. 13A, 13B and 14, with only the light-shielding areas in FIG. 14 being inked darker.

Figure 16:
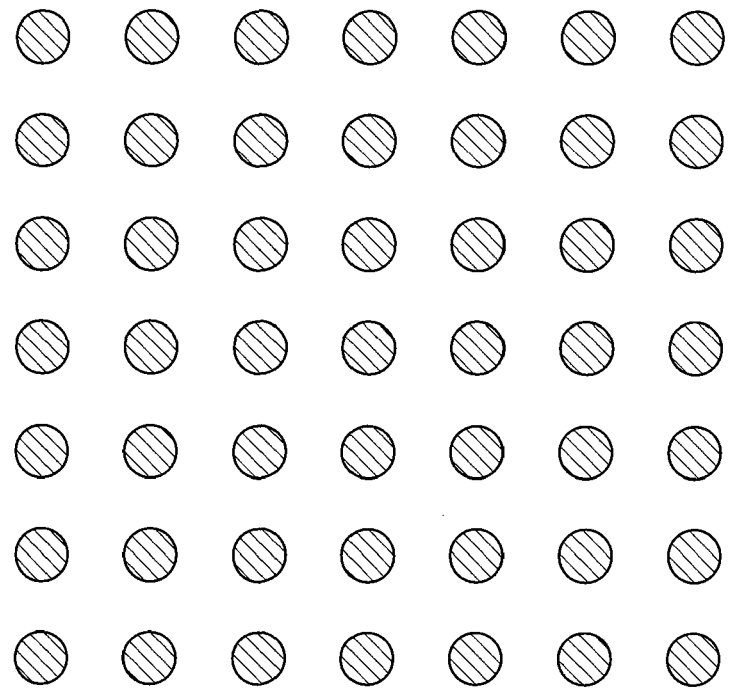
FIG. 16 illustrates a 1:1 dot pattern of 40 nm size and 90 nm pitch formed after development.
Figure 17:
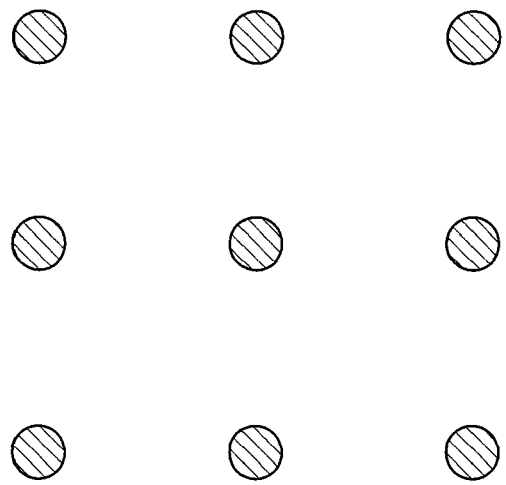
FIG. 17 illustrates a 1:3 dot pattern of 40 nm size and 180 nm pitch formed after development.
Figure 18:
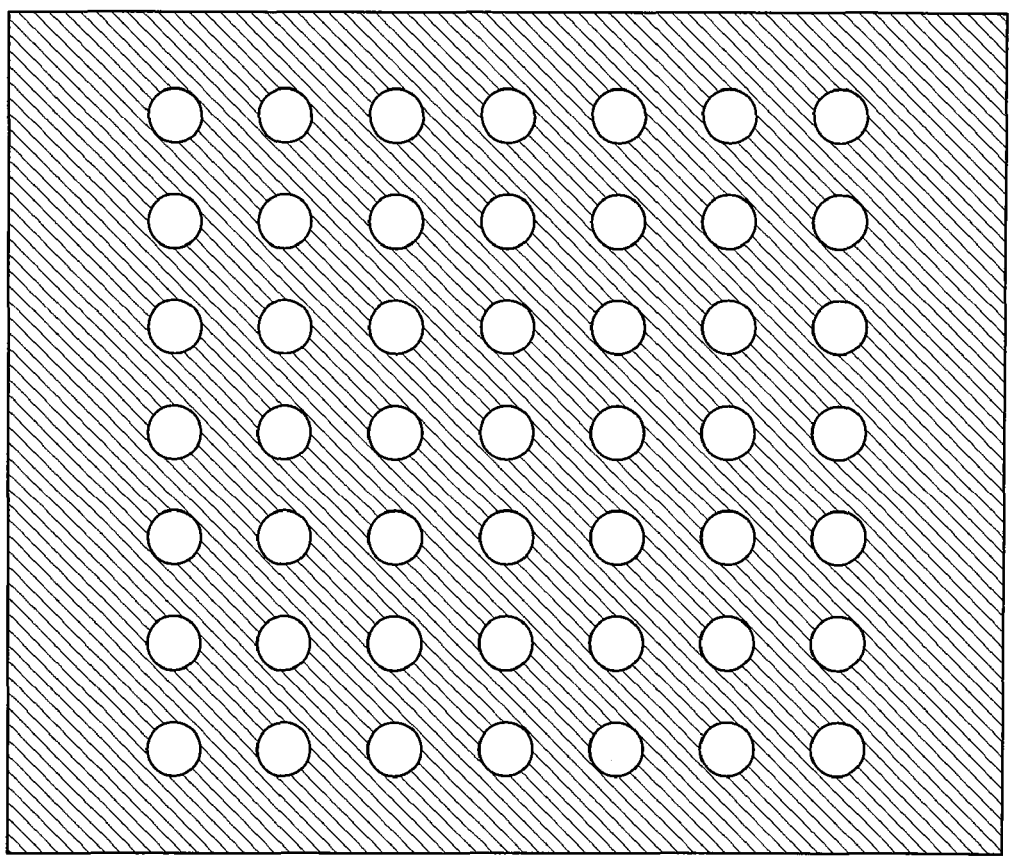
FIG. 18 illustrates a 1:1 hole pattern resulting from positive/negative reversal of FIG. 16.
Figure 19:
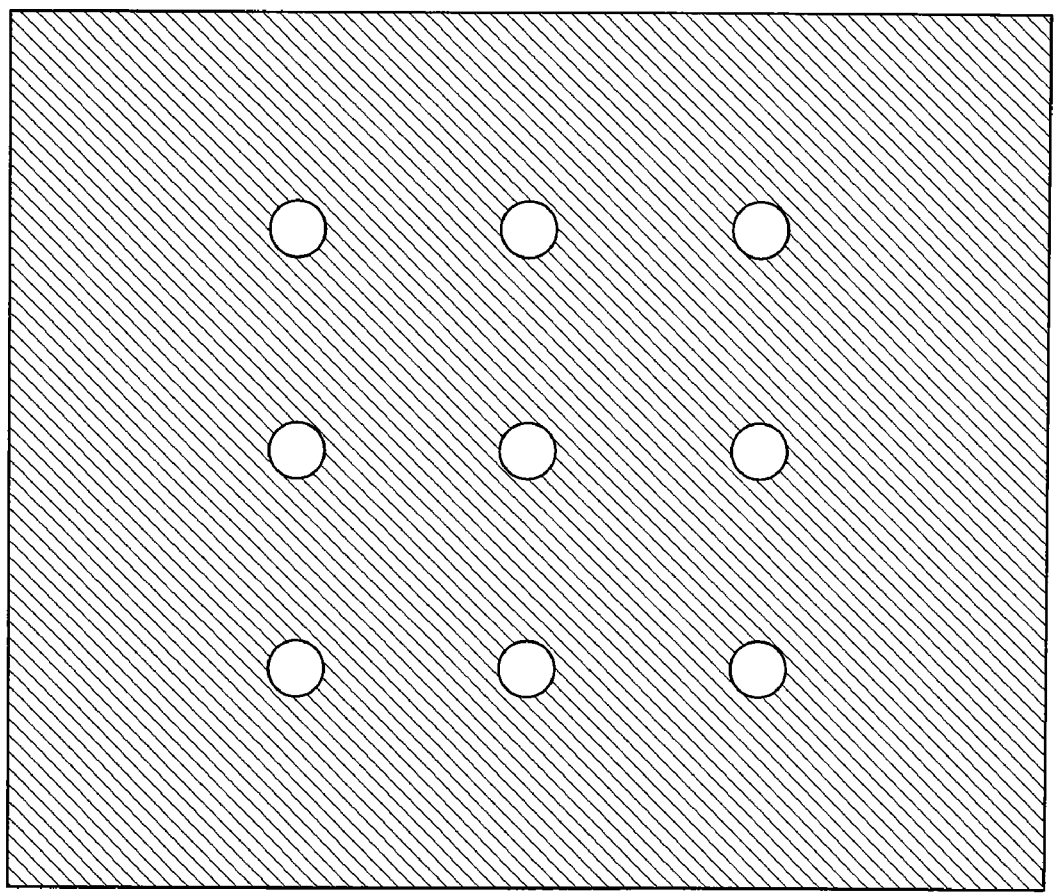
FIG. 19 illustrates a 1:3 hole pattern resulting from positive/negative reversal of FIG. 17.
Figure 20:
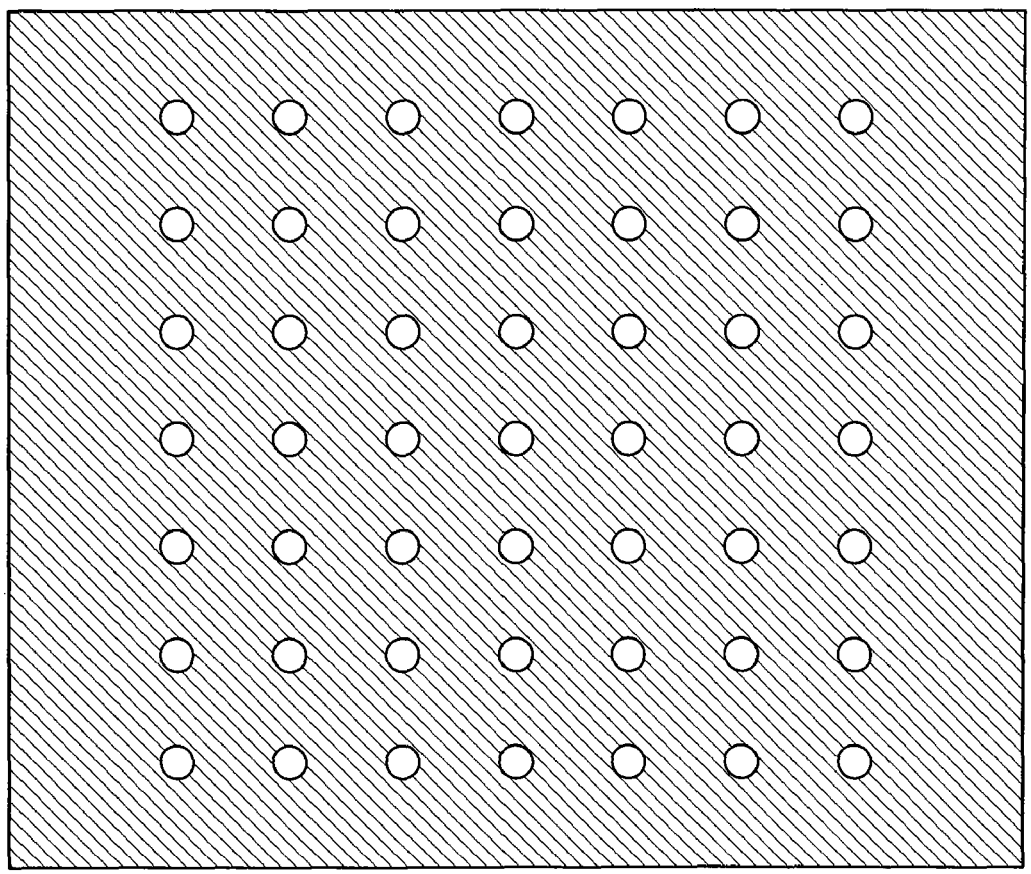
FIG. 20 illustrates a 1:1 hole pattern resulting from shrinkage of FIG. 18.
Figure 21:
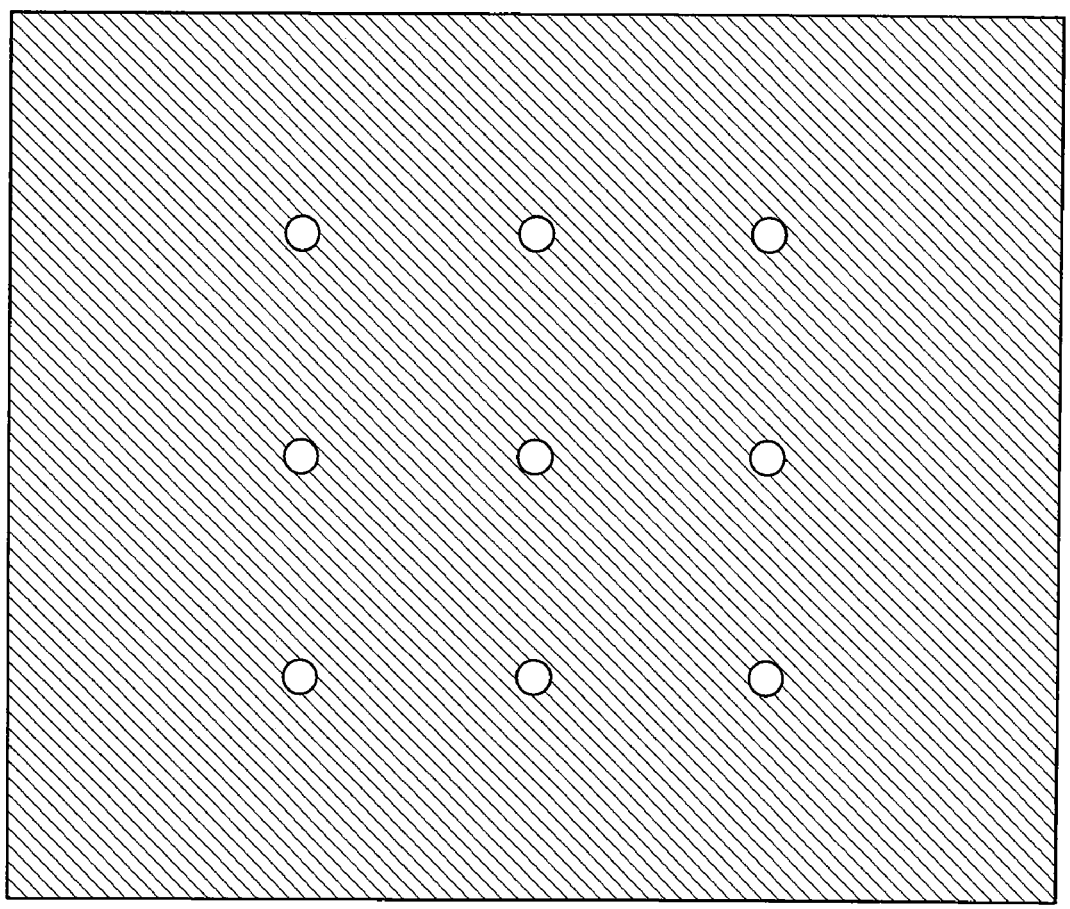
FIG. 21 illustrates a 1:3 hole pattern resulting from shrinkage of FIG. 19.

FIG. 18 illustrates a 1:1 hole pattern resulting from positive/negative reversal of FIG. 16. FIG. 19 illustrates a 1:3 hole pattern resulting from positive/negative reversal of FIG. 17. FIG. 20 illustrates a 1:1 hole pattern resulting from shrinkage of FIG. 18. FIG. 21 illustrates a 1:3 hole pattern resulting from shrinkage of FIG. 19.

The dot pattern was baked at 190° C. for 60 seconds for deprotection of acid labile groups and crosslinking. On the dot pattern, the pattern reversal film-forming composition RF1 was coated so as to form a reversal film of 60 nm thick. This was followed by development with a 2.38 wt % TMAH

TABLE 7

| | Resist composition | Reversal film-forming composition | Shrinking agent | Dot pattern as developed | Dot pattern as heated | Hole pattern as reversed | Baking temp. | Hole pattern as baked |
|---|---|---|---|---|---|---|---|---|
| Example 6 | Resist 1 | RF1 | Shrinking agent 1 | 50 nm | 50 nm | 49 nm | 130° C. | 32 nm |

| | Resist composition | Reversal film-forming composition | | Hole pattern | Baking temp. | Hole pattern as baked |
|---|---|---|---|---|---|---|
| Comparative Example 2 | Resist 1 | — | Shrinking agent 1 | 66 nm | 130° C. | 64 nm |

ArF Lithography Patterning III

A coated wafer was prepared in the same manner as in Examples with respect to substrate, resist composition, protective coating composition, thickness and baking conditions. Using an ArF excimer laser immersion lithography scanner NSR-610C (Nikon Corp., NA 1.30, σ0.98/0.65, opening 20 deg. dipole s-polarized illumination, 6% halftone phase shift aqueous solution for 30 seconds, achieving image reversal from the dot pattern to a hole pattern.

The hole pattern as reversed was baked for 120 seconds at a temperature shown in Table 8, thereby shrinking the hole pattern.

By observation under TDSEM S-9380 (Hitachi Hitechnologies Ltd.), the size of the hole pattern was measured. The results are shown in Table 8.

TABLE 8

| | 1:1 dot pattern as developed | 1:1 dot pattern as heated | 1:1 hole pattern as reversed | Baking temp. | 1:1 hole pattern as baked | 1:3 dot pattern as developed | 1:3 dot pattern as heated | 1:3 hole pattern as reversed | 1:3 hole pattern as baked |
|---|---|---|---|---|---|---|---|---|---|
| Example 7 | 40 nm | 41 nm | 39 nm | 128° C. | 25 nm | 39 nm | 40 nm | 39 nm | 24 nm |

As is evident from the results in Table 6, the pattern forming process of Examples 1 to 5 yielded the film of phenol base material after positive/negative reversal which could be substantially shrunk by baking. Comparative Example 1 yielded a hole pattern of methacrylate base ArF resist film, which was difficult to shrink even at an elevated baking temperature of 190° C.

As is evident from the results in Table 7, the pattern forming process of Example 6 yielded the film of phenol base material after positive/negative reversal which could be shrunk by application of a shrinking agent. In Comparative Example 2 wherein the shrinking agent was applied directly to the hole pattern of ArF resist film, the pattern could not be shrunk.

In Example 7, both the 1:1 hole pattern and 1:3 hole pattern could be shrunk by baking, and the quantity of shrinkage was substantially equal, as shown in Table 8.

While the invention has been described with reference to a preferred embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

Japanese Patent Application No. 2009-006409 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A process for forming a pattern by way of positive/negative reversal, comprising the steps of:

coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the solvent and to form a resist film, exposing the resist film patternwise to high-energy radiation, post-exposure baking so that the acid generated by the acid generator upon exposure acts on acid labile groups in the resin for thereby effecting elimination reaction of acid labile groups in the resin in exposed areas, developing the exposed resist film with an alkaline developer to form a positive pattern, illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin does not lose solubility in an alkaline wet etchant, for thereby endowing the positive pattern with resistance to an organic solvent used in a reversal film-forming composition, coating a reversal film-forming composition on the positive pattern-bearing substrate to form a reversal film, dissolving away the crosslinked positive pattern in an alkaline wet etchant to form a space pattern, and shrinking the space pattern;

wherein said reversal film-forming composition comprises a resin comprising monomeric units of aromatic structure having a phenolic hydroxyl group.

2. The process of claim 1 wherein the space pattern is a hole pattern.

3. The process of claim 1 wherein the step of shrinking the space pattern includes baking.

4. The process of claim 1 wherein the step of shrinking the space pattern includes coating a material which is soluble in water or $C_1$-$C_8$ alcohol onto the reversal film of which the space pattern is formed, to form a material coating, heating, and stripping an extra portion of the material coating using a liquid selected from the group consisting of water, alcohol, and alkaline developer.

5. A process for forming a pattern by way of positive/negative reversal, comprising the steps of:

coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the solvent and to form a resist film, exposing the resist film to high-energy radiation in a repeating dense pattern, further exposing a region of the dense pattern or unexposed area, post-exposure baking so that the acid generated by the acid generator upon exposure may act acts on acid labile groups in the resin for thereby effecting elimination reaction of acid labile groups in the resin in exposed areas, developing the exposed resist film with an alkaline developer to form a positive pattern, illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin does not lose solubility in an alkaline wet etchant, for thereby endowing the positive pattern with resistance to an organic solvent used in a reversal film-forming composition, coating a reversal film-forming composition on the positive pattern-bearing substrate to form a reversal film,
dissolving away the crosslinked positive pattern in an alkaline wet etchant to form a space pattern, and
shrinking the space pattern;
wherein said reversal film-forming composition comprises a resin comprising monomeric units of aromatic structure having a phenolic hydroxyl group.

6. The process of claim 1 or 5 wherein in the step of illuminating or heating the positive pattern for increasing the alkaline solubility of the resin and for endowing the positive pattern with resistance to an organic solvent used in a reversal film-forming composition,
the dissolution rate of the crosslinked positive pattern in an alkaline wet etchant is such that the crosslinked positive pattern exhibits an etching rate in excess of 2 nm/sec when etched with 2.38 wt % TMAH aqueous solution,
the organic solvent used in the reversal film-forming composition is selected from the group consisting of propylene glycol monomethyl ether acetate, cyclohexanone, ethyl lactate, propylene glycol monomethyl ether, and heptanone, and mixtures of two or more of the foregoing,
the resistance to organic solvent of the crosslinked positive pattern is such that the crosslinked positive pattern experiences a film slimming of up to 10 nm when contacted with the organic solvent for 30 seconds.

7. The process of claim 1 wherein said reversal film-forming composition comprises a silicon-containing resin.

8. The process of claim 1 wherein said reversal film-forming composition further comprises an acid generator and a crosslinker.

9. The process of claim 1 or 5, further comprising, between the step of coating a reversal film-forming composition on the positive pattern-bearing substrate to form a reversal film and the step of dissolving away the crosslinked positive pattern in an alkaline wet etchant, the step of removing the reversal film deposited on the crosslinked positive pattern until the positive pattern is exposed.

10. The process of claim 9 wherein the step of removing the reversal film deposited on the crosslinked positive pattern includes wet etching.

11. The process of claim 10 wherein
the reversal film is soluble in an alkaline wet etchant, but has a dissolution rate which is slower than that of the crosslinked positive pattern after the step of endowing the positive pattern with resistance to organic solvent,
the wet etching uses an alkaline wet etchant, and
the step of removing the reversal film deposited on the crosslinked positive pattern and the step of dissolving away the crosslinked positive pattern are concurrently carried out.

12. The process of claim 11 wherein the reversal film has a dissolution rate of 0.02 nm/sec to 2 nm/sec when etched with 2.38 wt % TMAH aqueous solution.

13. The process of claim 1 or 5 wherein said chemically amplified positive resist composition comprises a component capable of generating an acid in the step of heating for endowing the positive pattern with organic solvent resistance.

14. The process of claim 13 wherein the component capable of generating an acid is a thermal acid generator which is added to the resist composition in addition to the photoacid generator.

15. The process of claim 14 wherein the thermal acid generator has the general formula (P1a-2):

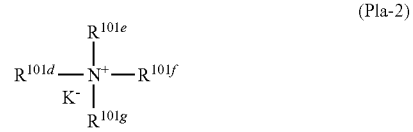

(P1a-2)

wherein K⁻ is a sulfonate having at least one α-position fluorinated, perfluoroalkylimidate or perfluoroalkylmethidate; $R^{101d}$, $R^{101e}$, $R^{101f}$, and $R^{101g}$ are each independently hydrogen, a straight, branched or cyclic $C_1$-$C_{12}$ alkyl, alkenyl, oxoalkyl or oxoalkenyl group, a $C_6$-$C_{20}$ aryl group, or a $C_7$-$C_{12}$ aralkyl or aryloxoalkyl group, in which some or all hydrogen atoms may be substituted by alkoxy groups, or $R^{101d}$ and $R^{101e}$, or $R^{101d}$, $R^{101e}$ and $R^{101f}$ may bond together to form a ring with the nitrogen atom to which they are attached, and each of $R^{101e}$ and $R^{101f}$ or each of $R^{101d}$, $R^{101e}$ and $R^{101f}$ is a $C_3$-$C_{10}$ alkylene group or a hetero-aromatic ring having incorporated therein the nitrogen atom when they form a ring.

16. The process of claim 1 wherein in said chemically amplified positive resist composition, the resin comprises recurring units having a lactone ring and recurring units having an acid labile group which is eliminatable with acid.

17. The process of claim 1 wherein in said chemically amplified positive resist composition, the resin comprising an electrophilic partial structure is an ester group or cyclic ether which will form crosslinks in the resin of the positive resist pattern.

18. The process of claim 17 wherein in said chemically amplified positive resist composition, the resin comprises recurring units having a 7-oxanorbornane ring and recurring units having an acid labile group which is eliminatable with acid, and
heat is applied in the step of illuminating the positive pattern to generate an acid whereby elimination of acid labile groups and crosslinking of the resin take place simultaneously in the positive pattern.

19. The process of claim 18 wherein the recurring units having a 7-oxanorbornane ring are recurring units (a) having the general formula (1):

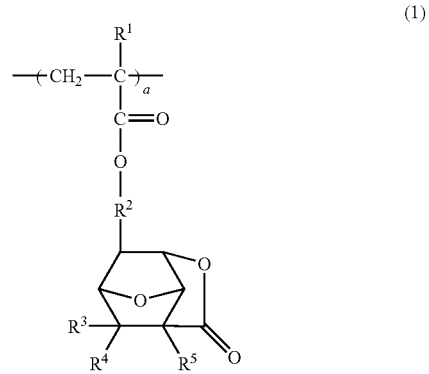

(1)

wherein $R^1$ is hydrogen or methyl, $R^2$ is a single bond or a straight, branched or cyclic $C_1$-$C_6$ alkylene group which may have an ether or ester radical, and which has a primary or secondary carbon atom through which it is linked to the ester group in the formula, $R^3$, $R^4$, and $R^5$ are each independently hydrogen or a straight, branched or cyclic $C_1$-$C_6$ alkyl group, and "a" is a number in the range: 0<a<1.0.

20. The process of claim 16 wherein the recurring units having an acid labile group which is eliminatable with acid are recurring units (b) having the general formula (2):

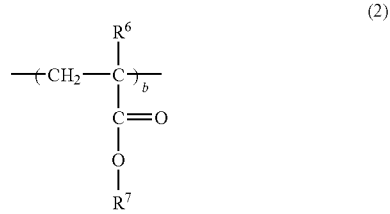

(2)

wherein $R^6$ is hydrogen or methyl, $R^7$ is an acid labile group, and b is a number in the range: $0<b\leqq0.8$.

21. The process of claim 20 wherein the acid labile group of $R^7$ is an acid labile group of alicyclic structure which is eliminatable with acid.

22. A process for forming a pattern by way of positive/negative reversal according to claim 1, comprising the steps of:
coating a chemically amplified positive resist composition onto a processable substrate, said resist composition comprising a resin comprising recurring units having acid labile groups which are eliminatable with acid, a photoacid generator capable of generating an acid upon exposure to high-energy radiation and a solvent, heating to remove the solvent to form a resist film,
coating a protective film-forming composition onto the resist film and drying to form a protective film,
exposing the resist film patternwise to high-energy radiation from a projection lens, by immersion lithography with water or a transparent liquid having a refractive index of at least 1 intervening between the resist film and the projection lens, post-exposure baking for causing the acid generated by the acid generator upon exposure to act on the acid labile groups on the resin whereby the acid labile groups on the resin in the exposed area undergo elimination reaction, and developing the exposed resist film with an alkaline developer to form a positive pattern,
treating the positive pattern so as to eliminate the acid labile groups on the resin in the positive pattern resulting from the previous step, and to induce crosslinking in the resin to such an extent that the resin does not lose solubility in an alkaline wet etchant, for thereby endowing the positive pattern with resistance to an organic solvent to be used in a reversal film-forming composition,
coating a reversal film-forming composition thereon to form a reversal film, and dissolving away the positive pattern in an alkaline wet etchant.

23. The process of claim 22 wherein said protective film-forming composition is based on a copolymer comprising amino-containing recurring units.

24. The process of claim 22 wherein said protective film-forming composition further comprises an amine compound.

25. The process of claim 1 or 22, further comprising the steps of forming a carbon film having a carbon content of at least 75% by weight on the processable substrate, forming a silicon-containing intermediate film thereon, and coating a resist composition for positive/negative reversal thereon, the reversal film being formed of a hydrocarbon-based material.

26. The process of claim 1 or 22, further comprising the steps of forming a carbon film having a carbon content of at least 75% by weight on the processable substrate, and coating a resist composition for positive/negative reversal thereon, the reversal film being formed of a silicon-containing material.

27. The process of claim 1 or 22, further comprising the steps of forming a carbon film having a carbon content of at least 75% by weight on the processable substrate, forming an organic antireflection film thereon, and coating a resist composition for positive/negative reversal thereon, the reversal film being formed of a silicon-containing material.

28. A process for forming a pattern by way of positive/negative reversal, comprising the steps of:
coating a chemically amplified positive resist composition onto a processable substrate, the resist composition comprising a resin comprising recurring units of structure having acid labile groups which are eliminatable with acid, the resin turning to be soluble in an alkaline developer as a result of elimination of the acid labile groups, a photoacid generator capable of generating an acid upon exposure to high-energy radiation and optionally, a thermal acid generator capable of generating an acid upon heating, and an organic solvent, prebaking the coating to remove the solvent and to form a resist film,
exposing the resist film patternwise to high-energy radiation, post-exposure baking so that the acid generated by the acid generator upon exposure acts on acid labile groups in the resin for thereby effecting elimination reaction of acid labile groups in the resin in exposed areas, developing the exposed resist film with an alkaline developer to form a positive pattern,
illuminating or heating the positive pattern, the acid generated by illumination or the heat serving to eliminate acid labile groups in the resin in the positive pattern for thereby increasing the alkaline solubility of the resin and to induce crosslinks in the resin to such an extent that the resin does not lose solubility in an alkaline wet etchant, for thereby endowing the positive pattern with resistance to an organic solvent used in a reversal film-forming composition,
coating a reversal film-forming composition on the positive pattern-bearing substrate to form a reversal film,
dissolving away the crosslinked positive pattern in an alkaline wet etchant to form a space pattern, and
shrinking the space pattern,
said reversal film-forming composition comprising a silicon-containing resin and a crosslinker.

* * * * *